(12) United States Patent
Kim et al.

(10) Patent No.: US 12,047,743 B2
(45) Date of Patent: Jul. 23, 2024

(54) DISPLAY APPARATUS

(71) Applicant: LG Display Co., Ltd., Seoul (KR)

(72) Inventors: Chiwan Kim, Paju-si (KR); Kyungyeol Ryu, Paju-si (KR); YuSeon Kho, Paju-si (KR); YongGyoon Jang, Paju-si (KR)

(73) Assignee: LG DISPLAY CO., LTD., Seoul (KR)

( * ) Notice: Subject to any disclaimer, the term of this patent is extended or adjusted under 35 U.S.C. 154(b) by 0 days.

(21) Appl. No.: 18/234,203

(22) Filed: Aug. 15, 2023

(65) Prior Publication Data

US 2023/0388718 A1 Nov. 30, 2023

Related U.S. Application Data

(63) Continuation of application No. 17/463,546, filed on Aug. 31, 2021, now Pat. No. 11,770,656, which is a
(Continued)

(30) Foreign Application Priority Data

Mar. 29, 2019 (KR) ........................ 10-2019-0037500

(51) Int. Cl.
*H04R 17/00* (2006.01)
*G06F 3/01* (2006.01)
(Continued)

(52) U.S. Cl.
CPC ............ *H04R 17/00* (2013.01); *G06F 3/016* (2013.01); *H04R 1/20* (2013.01); *H10N 30/80* (2023.02)

(58) Field of Classification Search
CPC .......... H04R 17/00; H04R 1/20; H10N 30/80; G06F 3/016
See application file for complete search history.

(56) References Cited

U.S. PATENT DOCUMENTS 6,629,341 B2 10/2003 Wilkie et al.
7,197,798 B2 4/2007 Wilkie et al.
(Continued)

FOREIGN PATENT DOCUMENTS

CN 1980485 A 6/2007
CN 103444205 A 12/2013
(Continued)

OTHER PUBLICATIONS

Joo Hyung Kim et al., "Thin Speakers and Transparent Speakers," Ceramist, vol. 17, No. 2, Jun. 2014, pp. 60-66.
(Continued)

*Primary Examiner* — Olisa Anwah
(74) *Attorney, Agent, or Firm* — Morgan, Lewis & Bockius LLP

(57) ABSTRACT

A display apparatus includes: a display panel configured to display an image, and at least one vibration module on a rear surface of the display panel, the at least one vibration module including a piezoelectric composite layer including a plurality of sub-modules configured to vibrate the display panel, each of the plurality of sub-modules including: a plurality of first portions including a piezoelectric characteristic, and a plurality of second portions having flexibility, each of the plurality of second portions being between a respective pair of the plurality first portions, wherein the plurality of first portions in the respective sub-modules are arranged in a same direction or are partially arranged in different directions.

26 Claims, 36 Drawing Sheets

Related U.S. Application Data continuation of application No. 16/447,304, filed on Jun. 20, 2019, now Pat. No. 11,166,108.

(51) Int. Cl.
  *H04R 1/20* (2006.01)
  *H10N 30/80* (2023.01)

(56) References Cited

U.S. PATENT DOCUMENTS

| | | | |
|---|---|---|---|
| 8,259,261 B2 * | 9/2012 | Kim | G02F 1/134363 |
| | | | 438/118 |
| 8,712,079 B2 | 4/2014 | Kim et al. | |
| 8,873,776 B2 | 10/2014 | Kim et al. | |
| 9,853,092 B2 * | 12/2017 | Lee | G06F 3/0445 |
| 10,353,472 B2 | 7/2019 | Kim et al. | |
| 10,595,109 B2 | 3/2020 | Shin et al. | |
| 10,671,114 B2 * | 6/2020 | Ahn | H04R 7/045 |
| 10,782,740 B2 | 9/2020 | Kim et al. | |
| 10,819,940 B2 | 10/2020 | Kim et al. | |
| 10,904,651 B2 | 1/2021 | Kim et al. | |
| 10,911,852 B2 | 2/2021 | You et al. | |
| 11,166,108 B2 | 11/2021 | Kim et al. | |
| 11,190,865 B2 | 11/2021 | Zhou et al. | |
| 11,622,181 B2 * | 4/2023 | Won | H10K 59/00 |
| | | | 381/333 |
| 2001/0042291 A1 | 11/2001 | Esashi et al. | |
| 2003/0056351 A1 | 3/2003 | Wilkie et al. | |
| 2007/0132911 A1 | 6/2007 | Fujiwara et al. | |
| 2009/0136077 A1 | 5/2009 | Suzuki et al. | |
| 2011/0217519 A1 | 9/2011 | Sakashita | |
| 2012/0148073 A1 | 6/2012 | Kim et al. | |
| 2012/0243719 A1 | 9/2012 | Franklin et al. | |
| 2013/0167881 A1 | 7/2013 | Korbler et al. | |
| 2014/0082490 A1 | 3/2014 | Jung et al. | |
| 2014/0098978 A1 | 4/2014 | Fukuoka et al. | |
| 2014/0334078 A1 | 11/2014 | Lee et al. | |
| 2015/0030188 A1 | 1/2015 | Nabata et al. | |
| 2015/0185963 A1 | 7/2015 | Lee et al. | |
| 2015/0187325 A1 | 7/2015 | Yeo et al. | |
| 2015/0195657 A1 | 7/2015 | Ishihara et al. | |
| 2015/0326976 A1 | 11/2015 | Kushima et al. | |
| 2016/0150318 A1 * | 5/2016 | Donarski | H04R 1/24 |
| | | | 381/104 |
| 2016/0179230 A1 | 6/2016 | Rider et al. | |
| 2017/0280234 A1 | 9/2017 | Choi et al. | |
| 2017/0289694 A1 | 10/2017 | Choi et al. | |
| 2018/0239125 A1 | 8/2018 | Sun et al. | |
| 2018/0267673 A1 | 9/2018 | Kim et al. | |
| 2018/0348816 A1 | 12/2018 | Lee et al. | |
| 2019/0028669 A1 | 1/2019 | Shin et al. | |
| 2019/0045286 A1 * | 2/2019 | Kim | H04R 17/00 |
| 2019/0045287 A1 * | 2/2019 | Lee | H04R 1/26 |
| 2019/0050024 A1 | 2/2019 | Ahn et al. | |
| 2020/0059733 A1 | 2/2020 | Shin et al. | |
| 2020/0080796 A1 | 3/2020 | Dasgupta et al. | |
| 2020/0233629 A1 * | 7/2020 | Yeon | G06F 1/1626 |
| 2021/0124423 A1 * | 4/2021 | Fan | G06F 1/1652 |

FOREIGN PATENT DOCUMENTS

| | | |
|---|---|---|
| CN | 104025618 A | 9/2014 |
| CN | 104143292 A | 11/2014 |
| CN | 104751743 A | 7/2015 |
| CN | 104952370 A | 9/2015 |
| CN | 107004387 A | 8/2017 |
| CN | 108124218 A | 6/2018 |
| CN | 108124224 A | 6/2018 |
| CN | 108139796 A | 6/2018 |
| CN | 109326236 A | 2/2019 |
| CN | 109389917 A | 2/2019 |
| CN | 109391889 A | 2/2019 |
| EP | 3331251 A1 | 6/2018 |
| EP | 3 364 636 A | 8/2018 |
| EP | 3 442 243 A1 | 2/2019 |
| EP | 3 499 337 A1 | 6/2019 |
| EP | 3 557 370 A1 | 10/2019 |
| EP | 3 613 514 A1 | 2/2020 |
| GB | 2580449 A | 7/2020 |
| JP | H07327297 A | 12/1995 |
| JP | 2001-326999 A | 11/2001 |
| JP | 2007-281286 A | 10/2007 |
| JP | 2009-130663 A | 6/2009 |
| JP | 2011-504134 A | 2/2011 |
| JP | 2014-053948 A | 3/2014 |
| JP | 2015-126500 A | 7/2015 |
| JP | 6053794 B2 | 12/2016 |
| JP | 2017-184223 A | 10/2017 |
| JP | 2017-531393 A | 10/2017 |
| JP | 2018-505434 A | 2/2018 |
| JP | 2018-093468 A | 6/2018 |
| JP | 2018-110369 A | 7/2018 |
| KR | 10-2010-0073075 A | 7/2010 |
| KR | 10-2016-0015348 A | 2/2016 |
| KR | 10-1817102 B1 | 1/2018 |
| KR | 10-2019-0000462 A | 1/2019 |
| KR | 10-2019-0013680 A | 2/2019 |
| WO | 2014/024528 A1 | 2/2014 |
| WO | 2014/024736 A1 | 2/2014 |
| WO | 2015/098150 A1 | 7/2015 |
| WO | 2020/258543 A1 | 12/2020 |

OTHER PUBLICATIONS

Qing-Ming Wang, "Lecture 8-1: Piezoelectricity," University of Pittsburgh, Department of Mechanical Engineering, MEMS 1082: Electromechanical Sensors and Actuators, 2016.

Office Action issued Dec. 2, 2023 for corresponding Korean Patent Application No. 10-2019-0037500 (Note: JP H07-327297 A was cited in prior IDS.).

Office Action dated Feb. 1, 2024, issued in corresponding Chinese Patent Application No. 202210783721.9. (Note: CN 108124224 A, JP H07-327297 A, WO 2015/098150 A1, JP 2018-093468 A, US 2015/0185963 A1, US 2013/0167881 A1, JP 2017-184223 A and WO 2014/024528 A1 were previously cited).

Office Action dated Sep. 14, 2020, issued in corresponding Japanese Patent Application No. 2019-130579.

Office Action dated Mar. 5, 2021, issued in corresponding German Patent Application No. 10 2019 119 519.5.

Office Action issued Nov. 30, 2023 for counterpart Taiwanese Divisional Application No. 11221213270.

Office Action dated Sep. 1, 2021, issued in corresponding Chinese Patent Application No. 201911325270.9.

Combination Search and Examination Report dated Sep. 9, 2021, issued in corresponding UK Patent Application No. GB2103533.2.

Office Action dated May 28, 2021, issued in corresponding Japanese Patent Application No. 2019-130579.

Combined Search and Examination Report dated Jul. 19, 2023, issued in corresponding U.K. Divisional Patent Application No. GB 2302416.9.

Office Action dated Apr. 27, 2023, issued in corresponding Japanese divisional Patent Application No. 2022-019010.

Office Action issued Nov. 14, 2023 for counterpart Japanese Divisional Patent Application No. 2022-019010 (Note: JP 2018-093468 A, JP 2001-326999 A, JP H07-32729 7A, JP 2014-053948 A, JP 2018-110369 A, JP 2017-184223 A, WO 2014/024736 A1, WO 2015/098150 A1, WO 2014/024528 A1, JP 2009-130663 A, US 2019/0050024 A1, JP 2007-281286 A, and US 2018/0239125 A1 were cited in prior IDS.).

* cited by examiner

DISPLAY APPARATUS

CROSS-REFERENCE TO RELATED APPLICATION(S)

This application is a continuation of co-pending U.S. patent application Ser. No. 17/463,546, filed Aug. 31, 2021, which is a continuation of U.S. patent application Ser. No. 16/447,304, filed Jun. 20, 2019, now U.S. Pat. No. 11,166,108, which claims the benefit of and priority to Korean Patent Application No. 10-2019-0037500, filed on Mar. 29, 2019. The foregoing prior U.S. and Korean patent applications are hereby incorporated by reference in their entirety as if fully set forth herein.

BACKGROUND

1. Technical Field

The present disclosure relates to a display apparatus.

2. Discussion of the Related Art

Generally, a display apparatus is widely used as a screen for displaying an image in various electronic products or home appliances, such as a television, a monitor, a notebook computer, a smart phone, a tablet computer, an electronic pad, a wearable device, a watch phone, a mobile information device, a navigation device, or a mobile control display device. In general, the display apparatus may include a display panel for displaying an image, and a sound device for outputting sound related with the displayed image. However, in the case of the general display apparatus, sound that is output from the sound device advances to a rear side or lower side of the display panel, whereby sound quality may be deteriorated due to an interference with sound reflected on a wall or ground. Thus, it causes a difficulty in maintaining accuracy of sound transmission, whereby it interrupts a user's immersion.

For example, the sound device may be an actuator including a magnet and a coil. However, if the sound device including the actuator is applied to the display apparatus, the display apparatus is disadvantageous in that its thickness increases. Thus, a piezoelectric device capable of realizing a small thickness has attracted great attention. Due to the brittle properties of the piezoelectric device, the piezoelectric device may be easily damaged by an external force, whereby reliability of sound reproduction is lowered.

SUMMARY

Accordingly, the present disclosure is directed to a display apparatus that substantially obviates one or more of the issues due to limitations and disadvantages of the related art.

An aspect of the present disclosure is to provide a display apparatus that facilitates expansion of a reproduction frequency band and to improve flatness of sound pressure by providing an identical arrangement direction among a plurality of first portions in each of a plurality of sub-modules included in a vibration module, or by providing a different arrangement direction among some of first portions in a plurality of sub-modules included in a vibration module.

Another aspect of the present disclosure is to provide a display apparatus that facilitates expansion of a reproduction frequency band and to improve a sound pressure of a low-pitched sound reproduction band through reduction of a lowest-pitched sound reproduction frequency by the use of piezoelectric characteristic determined based on an arrangement direction of a piezoelectric material in each of a plurality of sub-modules included in a vibration module and a structure of a display panel functioning as a vibration plate.

Another aspect of the present disclosure is to provide a display apparatus that facilitates improvement in flatness of a sound pressure by changing a resonance frequency in each of a plurality of vibration modules through the use of plate disposed between a display panel and some vibration modules among a plurality of vibration modules.

Additional features and aspects will be set forth in the description that follows, and in part will be apparent from the description, or may be learned by practice of the inventive concepts provided herein. Other features and aspects of the inventive concepts may be realized and attained by the structure particularly pointed out in the written description, or derivable therefrom, and the claims hereof as well as the appended drawings.

To achieve these and other aspects of the inventive concepts as embodied and broadly described, there is provided a display apparatus, including: a display panel configured to display an image, and at least one vibration module on a rear surface of the display panel, the at least one vibration module including a piezoelectric composite layer including a plurality of sub-modules configured to vibrate the display panel, each of the plurality of sub-modules including: a plurality of first portions including a piezoelectric characteristic, and a plurality of second portions having flexibility, each of the plurality of second portions being between a respective pair of the plurality first portions, wherein the plurality of first portions in the respective sub-modules are arranged in a same direction or are partially arranged in different directions.

In another aspect, there is provided a display apparatus, including: a display panel including first and second areas, the display panel being configured to display an image, and a plurality of vibration modules on a rear surface of the display panel, the plurality of vibration modules being configured to vibrate the first area and the second area, each of the plurality of vibration modules including a piezoelectric composite layer including a plurality of sub-modules, each of the plurality of sub-modules including: a plurality of first portions including a piezoelectric characteristic, and a plurality of second portions having flexibility, each of the plurality of second portions being between a respective pair of the plurality first portions, wherein the plurality of first portions in the respective sub-modules are arranged in a same direction or are partially arranged in different directions.

Other systems, methods, features and advantages will be, or will become, apparent to one with skill in the art upon examination of the following figures and detailed description. It is intended that all such additional systems, methods, features and advantages be included within this description, be within the scope of the present disclosure, and be protected by the following claims. Nothing in this section should be taken as a limitation on those claims. Further aspects and advantages are discussed below in conjunction with embodiments of the disclosure. It is to be understood that both the foregoing general description and the following detailed description of the present disclosure are examples and explanatory, and are intended to provide further explanation of the disclosure as claimed.

BRIEF DESCRIPTION OF THE DRAWINGS

The accompanying drawings, that may be included to provide a further understanding of the disclosure and are incorporated in and constitute a part of this specification, illustrate embodiments of the disclosure and together with the description serve to explain various principles of the disclosure.

Figure 1:
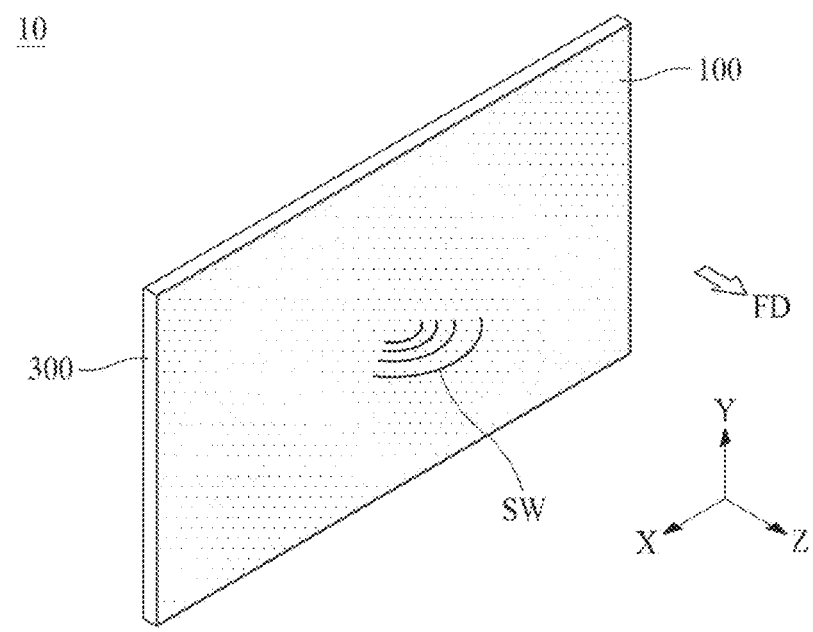
FIG. 1 is a perspective view illustrating a display apparatus according to an embodiment of the present disclosure.

Throughout the drawings and the detailed description, unless otherwise described, the same drawing reference numerals should be understood to refer to the same elements, features, and structures. The relative size and depiction of these elements may be exaggerated for clarity, illustration, and convenience.

DETAILED DESCRIPTION

Reference will now be made in detail to embodiments of the present disclosure, examples of which may be illustrated in the accompanying drawings. In the following description, when a detailed description of well-known functions or configurations related to this document is determined to unnecessarily cloud a gist of the inventive concept, the detailed description thereof will be omitted. The progression of processing steps and/or operations described is an example; however, the sequence of steps and/or operations is not limited to that set forth herein and may be changed as is known in the art, with the exception of steps and/or operations necessarily occurring in a particular order. Like reference numerals designate like elements throughout. Names of the respective elements used in the following explanations are selected only for convenience of writing the specification and may be thus different from those used in actual products.

It will be understood that, although the terms "first," "second," etc. may be used herein to describe various elements, these elements should not be limited by these terms. These terms are only used to distinguish one element from another. For example, a first element could be termed a second element, and, similarly, a second element could be termed a first element, without departing from the scope of the present disclosure.

The term "at least one" should be understood as including any and all combinations of one or more of the associated listed items. For example, the meaning of "at least one of a first item, a second item, and a third item" denotes the combination of all items proposed from two or more of the first item, the second item, and the third item as well as the first item, the second item, or the third item.

In the description of embodiments, when a structure is described as being positioned "on or above" or "under or below" another structure, this description should be construed as including a case in which the structures contact each other as well as a case in which a third structure is disposed therebetween. The size and thickness of each element shown in the drawings are given merely for the convenience of description, and embodiments of the present disclosure are not limited thereto.

Features of various embodiments of the present disclosure may be partially or overall coupled to or combined with each other, and may be variously inter-operated with each other and driven technically as those skilled in the art can sufficiently understand. Embodiments of the present disclosure may be carried out independently from each other, or may be carried out together in co-dependent relationship.

In the description of embodiments of the present disclosure, the display apparatus may include a liquid crystal module (LCM) including a display panel and a driver for driving the display panel, an organic light-emitting display module (OLED), and a quantum dot module (QD). In addition, the display apparatus according to an embodiment of the present disclosure may also include equipment displays, including a complete product or final product of an LCM, OLED, or QD module, for example, a notebook computer, a television, a computer monitor, an automotive display, or a vehicle display, and set electronic devices or a set device (set apparatus), such as mobile electronic devices of a smart phone or an electronic pad.

The display panel used for an embodiment of the present disclosure may be any type of display panel, for example, a liquid crystal display panel, an organic light-emitting diode display panel, a quantum dot display panel, an electroluminescent display panel, etc., but embodiments are not limited to these types. For example, the display panel may be any panel capable of generating sound in accordance with a vibration by a sound generating actuator. Also, the display panel is not limited in its shape and size.

For example, in the case of the liquid crystal display panel, it may include a plurality of gate lines, a plurality of data lines, and a plurality of pixels provided in respective intersections of the gate and data lines. Also, the liquid crystal display panel may include an array substrate including a thin film transistor corresponding to a switching device for controlling a light transmittance for each pixel, an upper substrate including a color filter, and/or black matrix, and a liquid crystal layer formed between the array substrate and the upper substrate.

In the case of the organic light-emitting display panel, it may include a plurality of gate lines, a plurality of data lines, and a plurality of pixels provided in respective intersections of the gate and data lines. Also, the organic light-emitting display panel may include an array substrate including a thin film transistor corresponding to a device for selectively applying a voltage to each pixel, an organic light-emitting device layer on the array substrate, and an encapsulation substrate on the array substrate covering the organic light-emitting device layer. The encapsulation substrate protects the thin film transistor and the organic light-emitting device layer from an external shock, and prevents or blocks moisture or oxygen from being permeated into the organic light-emitting device layer. Also, a layer provided on the array substrate may include an inorganic light-emitting layer, for example, a nano-sized material layer or quantum dot, or may include a micro light-emitting diode.

Hereinafter, a display apparatus according to an embodiment of the present disclosure will be described in detail with reference to the accompanying drawings. In adding reference numerals to elements of each of the drawings, although the same elements are illustrated in other drawings, like reference numerals may refer to like elements.

According to embodiments of the present disclosure, the display apparatus may expand the reproduction frequency band and improve flatness of sound pressure by providing an identical arrangement direction among a plurality of first portions in each of a plurality of sub-modules included in a vibration module, or by providing a different arrangement direction among some of first portions in the plurality of sub-modules included in the vibration module.

The display apparatus may expand the reproduction frequency band and improve the sound pressure of the low-pitched sound reproduction band through reduction of the lowest-pitched sound reproduction frequency by the use of a piezoelectric characteristic that may be determined based on the arrangement direction of the piezoelectric material in each of the plurality of sub-modules included in the vibration module and the structure of the display panel functioning as the vibration plate.

The display apparatus may improve flatness of the sound pressure by changing the resonance frequency in each of the plurality of vibration modules through the use of a plate between the display panel and some vibration modules among the plurality of vibration modules.

Figure 2:
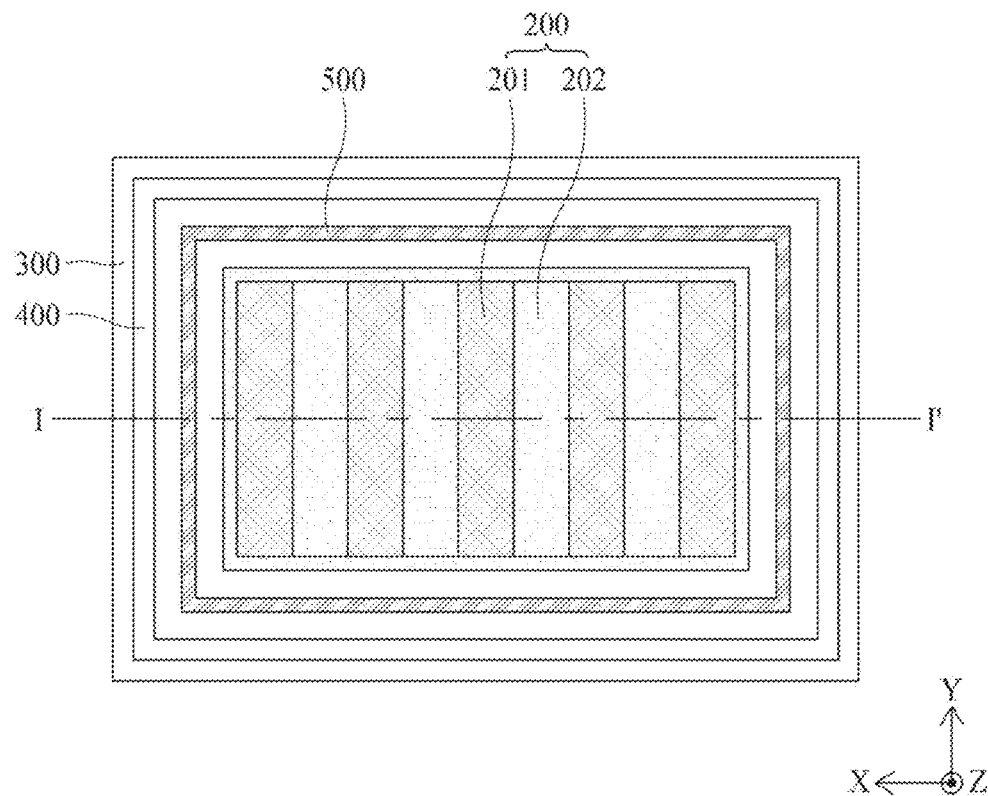
FIG. 2 is a rear view illustrating the display apparatus according to an embodiment of the present disclosure.
Figure 3:
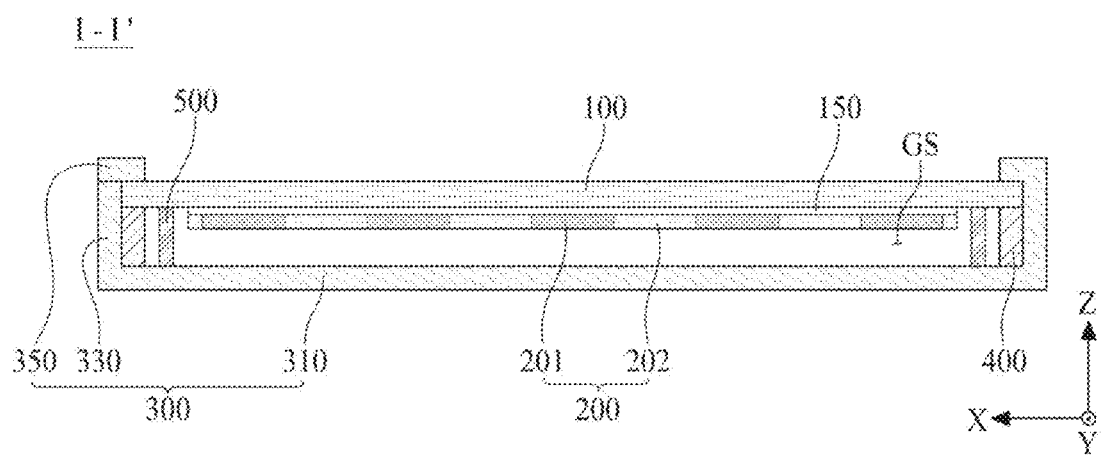
FIG. 3 is a cross-sectional view along line I-I' of FIG. 2.

FIG. 1 is a perspective view illustrating a display apparatus according to an embodiment of the present disclosure. FIG. 2 is a rear view illustrating the display apparatus according to an embodiment of the present disclosure. FIG. 3 is a cross-sectional view along line I-I' of FIG. 2.

With reference to FIGS. 1 to 3, the display apparatus 10 may include a display panel 100, a vibration module 200, a structure 300, a fixing member 400, and a partition 500. The display panel 100 may display an image, and may vibrate in accordance with the driving of at least one vibration module 200, thereby directly outputting sound (SW) to a front direction (FD). The display panel 100 may vibrate in accordance with the driving of at least one vibration module 200 such that an image may not be displayed thereon, thereby directly outputting sound (SW) to the front direction (FD). Accordingly, the display panel 100 may function as a vibration plate or a speaker for directly generating sound (SW). For example, when the display panel 100 outputs sound (SW), the display panel 100 may be a vibration plate, a panel speaker, or a plane speaker capable of directly generating sound (SW). Thus, the display panel 100 may display an image, and also may generate sound (SW).

The display panel 100 may be any type of display panel or curved-type display panel, for example, a liquid crystal display panel, an organic light-emitting display panel, a quantum-dot emission display panel, a micro emission diode display panel, and an electrophoretic display panel. For example, the display panel 100 according to an embodiment of the present disclosure may be any display panel capable of outputting sound wave (or sound) through the vibration in accordance with the vibration module 200, or generating haptic feedback in response to a touch, but is not limited to a specific display panel.

The display panel 100 may include a pixel circuit on a substrate (e.g., a base substrate), and a pixel array layer (e.g., a display portion) connected to the pixel circuit and including an anode electrode, a cathode electrode, and an emission layer. The display panel 100 may display an image in a top-emission type, a bottom-emission type, or a dual-emission type in accordance with a structure of the pixel array layer. For example, the anode electrode may be referred to as a "first" electrode or a "pixel" electrode, but is not limited to these terms. The cathode electrode may be referred to as a "second" electrode or a "common" electrode, but is not limited to these terms.

Herein, in the case of the top-emission type, light generated in the pixel array layer may be emitted to the front direction (FD, or front of the display apparatus) of the substrate of the display panel 100, whereby an image may be displayed. In the case of the bottom-emission type, light generated in the pixel array may be emitted to the external through a rear direction (or the front of the display apparatus) of the substrate, whereby an image may be displayed.

According to an embodiment of the present disclosure, the display apparatus 10 may further include a functional film (not shown) attached onto the display panel 100, e.g., by the use of transparent adhesion member. Herein, the transparent adhesion member may include pressure sensitive adhesive (PSA), optical clear adhesive (OCA), or optical clear resin (OCR), but is not limited to these materials.

According to an embodiment of the present disclosure, the functional film may include a reflection preventing layer (or reflection preventing film) capable of reducing or preventing a reflection of external light to improve contrast ratio and outdoor visibility for an image displayed on the display panel 100. For example, the reflection preventing layer may include a circular polarizing layer (or circular polarizing film) configured to reduce, prevent, or block light, which may be reflected by thin film transistor and/or lines arranged in the pixel array layer, from advancing toward the external.

According to an embodiment of the present disclosure, the functional film may include an optical path control layer (e.g., an optical path control film) capable of controlling a path of light emitted from the pixel array layer of the display panel 100 toward the external environment. The optical path control layer may include a structure formed by alternately depositing a high refraction layer and a low refraction layer, whereby the optical path control layer may change a path of light that is incident from the pixel array layer to minimize or reduce a color shift in accordance with a viewing angle. For example, the low refraction layer may be in the uppermost layer of the optical path control layer.

The vibration module 200 may be on a rear surface of the display panel 100, to thereby vibrate the display panel 100. According to an embodiment of the present disclosure, the vibration module 200 may be embodied in a film type configured to have piezoelectric characteristic, relatively high flexibility, and small thickness. For example, a thickness of the vibration module 200 may be smaller than a thickness of the display panel 100, whereby it may be possible to prevent the thickness of the display panel 100 from being largely increased by the thickness of the vibration module 200. The vibration module 200, which may use the display panel 100 as a vibration plate, may be referred to as a "sound generating module," a "sound generating device," a "film actuator," a "film-type piezoelectric composite actuator," a "film speaker," a "film type piezoelectric speaker," or a "film-type piezoelectric composite speaker," but is not limited to these terms.

The vibration module 200 may vibrate by a sound signal having various frequencies so that it may be possible to vibrate the display panel 100 having a specific frequency (or natural pitch). For example, the vibration module 200 may vibrate in accordance with a sound signal that may be synchronized with an image displayed on the display panel 100, to thereby vibrate the display panel 100. The sound generated in accordance with the vibration of the display panel 100 may have the improved sound pressure level characteristic (SPL characteristic) and the extended sound reproduction range, as a frequency of an input signal may coincide with the natural frequency of the display apparatus 10. According to another embodiment, the vibration module 200 may vibrate in accordance with a haptic feedback signal (or touch feedback signal) which may be synchronized with a user's touch on a touch panel in the display panel 100, to thereby vibrate the display panel 100. Accordingly, the display panel 100 may vibrate in accordance with the vibration of the vibration module 200, and may provide at least one of sound and haptic feedback to a user (or a viewer).

The vibration module 200 may include a plurality of first portions 201, and a plurality of second portions 202. Each of the plurality of first portions 201 may include an inorganic material portion. The inorganic material portion may include an electro-active material. In the case of the electro-active material, a potential difference may be generated by a dielectric polarization in accordance with a relative position change of a positive (+) ion and a negative (−) ion when a pressure or torsional phenomenon is applied to a crystalline structure due to an external force, and a vibration may be generated by an electric field in accordance with a reversely applied voltage.

Each of the plurality of second portions 202 may be between respective pairs of the plurality of first portions 201. The plurality of first portions 201 and the plurality of second portions 202 may be disposed (or arranged) on the same plane (or in the same layer), while being parallel to each other. Each of the plurality of second portions 202 may fill a gap or space between the adjacent two of the first portions 201, and may be connected or attached to the adjacent first portions 201. Accordingly, the vibration module 200 may have an increased vibration energy by a link in a unit lattice of the first portion by the second portion 202, to thereby improve piezoelectric characteristic and flexibility. In the vibration module 200, the first portion 201 and the second portion 202 may be alternately arranged along a first direction (X) on the same plane so that it may be possible to form a large-sized composite film (or organic and inorganic composite film) having a single-layered structure, wherein the large-sized composite film may have flexibility due to the plurality of second portions 202.

According to an embodiment of the present disclosure, the plurality of second portions 202 may include organic material portions. Each of the plurality of second portions 202 may fill a gap or space between each of the inorganic material portions. According as the organic material portion may be arranged between each of the inorganic material portions, it may be possible to absorb a force applied to the inorganic material portion (or first portion), to improve an entire durability of the vibration module 200 by releasing stress focused on the inorganic material portion, and to provide flexibility to the vibration module 200. According to another embodiment, the plurality of first portions 201 may include organic material portions, and the plurality of second portions 202 may include inorganic material portions.

Accordingly, the vibration module 200 of the display apparatus according to an embodiment of the present disclosure may include the inorganic material portion (first portion) and the organic material portion (second portion) in the same layer, whereby a force transmitted to the inorganic material portion may be absorbed by the organic material portion, to thereby reduce, minimize, or prevent the inorganic material portion from being damaged by an external force applied to the display apparatus, and furthermore, to reduce or prevent a vibration function (or sound efficiency) from being lowered by the damage of the inorganic material portion.

Also, the vibration module 200 of the display apparatus according to an embodiment of the present disclosure may include a piezoelectric ceramic configured to secure a piezoelectric characteristic, and a polymer material provided inside the piezoelectric ceramic to realize flexibility and shock resistance of the piezoelectric ceramic. According to an embodiment of the present disclosure, the vibration module 200 may include a piezoelectric ceramic having a perovskite crystalline structure so that the vibration module 200 may vibrate (or have mechanical displacement) in response to a sound signal applied from the external. For example, if an alternating current (AC) is applied to the inorganic material portion (first portion), the inorganic material portion may repeatedly contract and expand by an inverse piezoelectric effect, whereby the vibration module 200 may vibrate by a flexing phenomenon of alternately changing a flexing direction. Accordingly, as the display panel 100 may vibrate in accordance with the vibration of the vibration module 200, the sound or haptic feedback may be provided to a user.

According to an embodiment, the vibration module 200 may be attached to one surface of the display panel 100 by the use of adhesion member 150 (e.g., a module adhesion member). The adhesion member 150 may be between the vibration module 200 and a rear surface of the display panel 100. For example, the adhesion member 150 may be a double-sided tape or an adhesive capable of providing good adhesion strength and bonding strength to the rear surface of the display panel 100 and the vibration module 200. An adhesion layer of the adhesion member 150 may include epoxy, acryl, silicon, or urethane. The adhesion layer of the adhesion member 150 may further include an additive, such as an adhesion agent, a wax component, or an antioxidant. These additives may avoid or prevent the adhesion member 150 from being separated (e.g., peeled off) from the display panel 100 by the vibration of the vibration module 200. The adhesion agent may be rosin derivatives, the wax component may be paraffin wax, and the antioxidant may be a phenol-based antioxidant such as thioester. Embodiments are not limited to these materials. An adhesion strength of the adhesion member 150 over the plurality of second portions 202 is greater than an adhesive strength of the adhesion member over the plurality of first portions 201. This may enhance adhesion between the display panel 100 and the vibration module 200, even when the vibration module 200 or the display panel 100 is bent. In addition, the difference in adhesion strengths may avoid or prevent the adhesion member 150 from being separated (e.g., peeled off) from the display panel 100 by the vibration of the vibration module 200.

According to another embodiment, the adhesion member 150 may further include a hollow between the display panel 100 and the vibration module 200. The hollow of the adhesion member 150 may provide an air gap between the display panel 100 and the vibration module 200. The air gap may concentrate the sound wave (or sound pressure) according to the vibration of the vibration module 200 on the display panel 100 so that it may be possible to minimize or reduce a loss of the vibration caused by the adhesion member 150, to thereby improve the sound pressure level characteristic of the sound generated in accordance with the vibration of the display panel 100.

The structure 300 may include a first cover portion 310, a second cover portion 330, and a third cover portion 350. The first cover portion 310 may cover an entire first surface (for example, an entire rear surface) of the display panel 100 with a gap space (GS) provided therebetween. For example, the first cover portion 310 may be referred to as a "supporting member," a "housing," a "system cover," a "set cover," a "back cover," a "cover bottom," a "rear frame," or a "chassis," but is not limited to these terms. The rear surface of the display panel 100 may be referred to as "one" surface, a "first" surface, a "back" surface, or a "lower" surface, but is not limited to these terms.

The second cover portion 330 may be connected to an end of the first cover portion 310, and may cover an entire second surface (for example, an entire lateral surface) of the display panel 100. According to an embodiment, the second cover portion 330 may be embodied in an additional middle frame to be connected to the first cover portion 310. For example, the second cover portion 330 embodied in the middle frame may cover both lateral surfaces of the first cover portion 310 and lateral surfaces of the display panel 100. For example, the second cover portion 330 embodied in the middle frame may include the same material as that of the first cover portion 310, or may include a different material from that of the first cover portion 310.

The third cover portion 350 may cover a non-display area of the display panel 100. According to an embodiment, the third cover portion 350 may have a frame shape having an opening portion overlapping a display area (AA) of the display panel 100. For example, the third cover portion 350 may be connected to the first cover portion 310 or the middle frame to cover the non-display area of the display panel 100, to thereby support or fix the display panel 100. According as the third cover portion 350 may be in the front edge or the front periphery of the display panel 100, the third cover portion 350 may be directly exposed to a user (or viewer), whereby it may be difficult to realize a good exterior of the display apparatus in an aspect of design, and a bezel width of the display apparatus may be increased. To overcome these problems, according to an embodiment of the present disclosure, the fixing member 400 may be provided to connect the display panel 100 and the first cover portion 310 with each other, and thus, to omit (or remove) the third cover portion 350, thereby decreasing a bezel width of the display apparatus and realizing a good exterior of the display apparatus in an aspect of design.

However, embodiments are not limited to the above structure. For example, the structure 300 may include the first cover portion 310, the second cover portion 330, and the third cover portion 350, which may be formed as one body.

The fixing member 400 may connect the first cover portion 310 and the second cover portion 330 with the edge or the periphery of the display panel 100. For example, the fixing member 400 may be between the rear edge or the rear periphery of the display panel 100 and the edge or the periphery of the first cover portion 310 so that the display panel 100 may be adhered to the first cover portion 310. According to an embodiment, the fixing member 400 may be a double-sided tape, a single-sided tape, or a double-sided adhesion foam pad, but embodiments are not limited to these types.

The partition 500 may be between the display panel 100 and the first cover portion 310, whereby the partition 500, which may be provided at a certain interval or distance from the vibration module 200, may surround the vibration module 200. The partition 500 may block the sound generated by the vibration module 200, and may progress toward an opposite direction to the display panel 100. Accordingly, the vibration generated by the vibration module 200 may be focused on the display panel 100 by the partition 500.

For example, the partition 500 may include polyurethane or polyolefin, but is not limited to these materials. According to another example, the partition 500 may include a single-sided tape or a double-sided tape. In another example, the partition 500 may include materials having elasticity.

Figure 4:
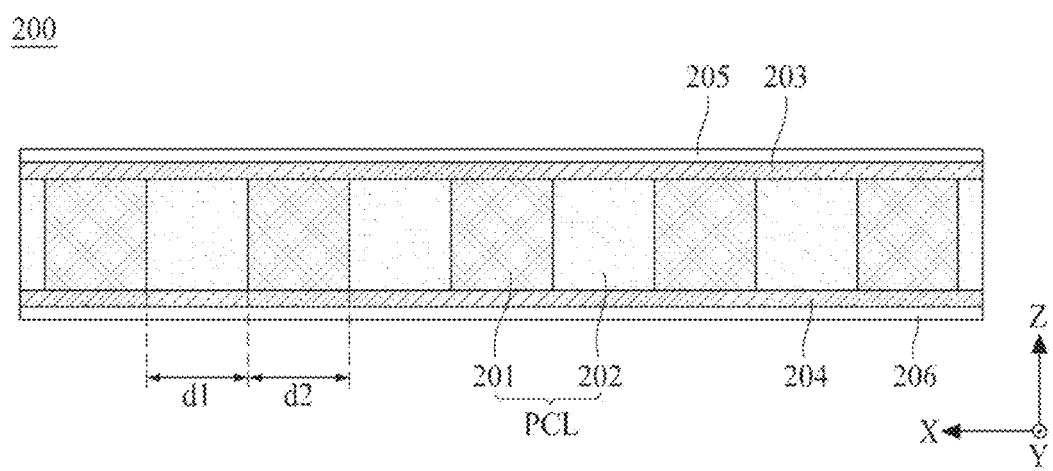
FIG. 4 is a cross-sectional view illustrating a vibration module of the display apparatus according to an embodiment of the present disclosure.
Figure 5:
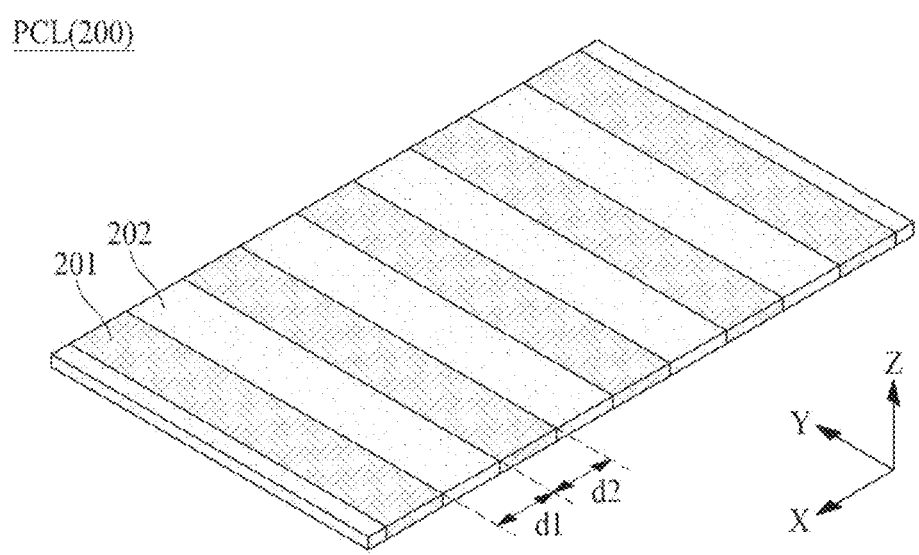
FIG. 5 illustrates a piezoelectric composite layer of the vibration module shown in FIG. 4.

FIG. 4 is a cross-sectional view illustrating a vibration module of a display apparatus according to an embodiment of the present disclosure. FIG. 5 illustrates a piezoelectric composite layer of the vibration module shown in FIG. 4.

With reference to FIGS. 4 and 5, the vibration module 200 may have flexibility, whereby the vibration module 200 may bend and vibrate in accordance with a sound signal. For example, the vibration module 200 may vibrate in accordance with the sound signal that may be synchronized with an image displayed on the display panel 100, to thereby vibrate the display panel 100. According to another embodiment, the vibration module 200 may vibrate in accordance with a haptic feedback signal (or touch feedback signal) that may be synchronized with a user's touch on a touch panel on the display panel 100 or provided in the display panel 100, to thereby vibrate the display panel 100. Accordingly, the display panel 100 may vibrate in accordance with the vibration of the vibration module 200, and may provide at least one of sound and haptic feedback to a user (or a viewer).

The vibration module 200 may include a piezoelectric composite layer (PCL), a first electrode layer 203, and a second electrode layer 204. The piezoelectric composite layer (PCL) may include a plurality of first portions 201 and a plurality of second portions 202. According to an embodiment, each of the plurality of first portions 201 may be a line pattern having a first length (d1), and the plurality of first portions 201 may be provided at each fixed interval or distance corresponding to a second length (d2) along the first direction (X), and may be parallel to a second direction (Y) perpendicular to the first direction (X).

According to an embodiment, the first length (d1) in each of the plurality of first portions 201 and the second length (d2) in each of the plurality of second portions 202 may be changed in accordance with a position of the piezoelectric composite layer (PCL). For example, the second length (d2) in each of the plurality of second portions 202 may be gradually decreased as it goes from the central portion of the piezoelectric composite layer (PCL) to the edge or the periphery of the piezoelectric composite layer (PCL).

For example, as the first length (d1) in each of the plurality of first portions 201 increases, a proportion of the first portions 201 may increase in the piezoelectric composite layer (PCL). As the second length (d2) in each of the plurality of second portions 202 increases, a proportion of the first portions 201 may decrease in the piezoelectric composite layer (PCL). As the first length (d1) in each of the plurality of first portions 201 increases, the sound pressure level characteristic of the vibration module 200 may be improved. As the second length (d2) in each of the plurality of second portions 202 increases, the flexibility of the vibration module 200 may be improved.

According to an embodiment, the plurality of first portions 201 may have the same size, for example, area, extent, or volume, within a manufacturing error (or permissible error) range generated for a manufacturing process. According to another embodiment, the plurality of first portions 201 may have the different sizes, for example, area, extent, or volume.

According to an embodiment, each of the plurality of first portions 201 may include an inorganic material or a piezoelectric material that may vibrate by the piezoelectric effect (or piezoelectric characteristic) in accordance with an electric field. For example, each of the plurality of first portions 201 may be referred to as an "electro-active" portion, an "inorganic material" portion, a "piezoelectric material" portion, or a "vibration" portion, but embodiments are not limited to these terms.

According to an embodiment, each of the plurality of first portions 201 may include the electro-active material. In the case of the electro-active material, a potential difference is generated by a dielectric polarization in accordance with a relative position change of a positive (+) ion and a negative (−) ion when a pressure or torsional phenomenon is applied to a crystalline structure due to an external force, and a vibration may be generated by an electric field in accordance with a reversely applied voltage.

For example, the inorganic material portion included in each of the plurality of first portions 201 may include at least one of: lead (Pb), zirconium (Zr), titanium (Ti), zinc (Zn), nickel (Ni), and niobium (Nb), but embodiments are not limited to these materials. According to another embodiment, the inorganic material portion included in each of the plurality of first portions 201 may include one or more of: a PZT (lead zirconate titanate)-based material including lead (Pb), zirconium (Zr) and titanium (Ti), or a PZNN (lead zirconate nickel niobate)-based material including lead (Pb), zinc (Zn), nickel (Ni) and niobium (Nb), but embodiments are not limited to these materials. Also, the inorganic material portion may include at least one among calcium titanate ($CaTiO_3$), barium titanate ($BaTiO_3$), and strontium titanate ($SrTiO_3$), in which lead (Pb) is not included, but embodiments are not limited to these materials.

Each of the plurality of second portions 202 may be between respective pairs of the plurality of first portions 201. The plurality of first portions 201 and the plurality of second portions 202 may be disposed (or arranged) on the same plane (or in the same layer), while being parallel to each other. Each of the plurality of second portions 202 may fill a gap or space between the adjacent two of the first portions 201, and may be connected to or attached to the adjacent first portions 201. For example, each of the plurality of second portions 202 may be a line pattern having a second length (d2), and the plurality of second portions 202 may be parallel to each other such that each first portion 201 may be between respective pairs of the second portions 202. According to an embodiment, the plurality of second portions 202 may have the same size, for example, area, extent, or volume within a manufacturing error (or permissible error) range generated for a manufacturing process. According to another embodiment, the plurality of second portions 202 may have different sizes, for example, area, extent, or volume.

In the vibration module 200 of the display apparatus 10 according to an embodiment of the present disclosure, the inorganic material portion (first portion) and the organic material portion (second portion) may be in the same layer, whereby an external force for the display apparatus may be absorbed by the organic material portion, to thereby reduce, minimize, or prevent the inorganic material portion from being damaged by an external force applied to the display apparatus, and furthermore, to thereby reduce or prevent a vibration function (or sound efficiency) from being lowered by the damage of the inorganic material portion.

The second portion 202 may be the same as or different from the first portion 201. For example, a size in each of the first portion 201 and the second portion 202 may be determined based on the vibration properties of the vibration module 200 and/or desired conditions, such as flexibility.

In comparison to the inorganic material portion of the first portion 201, the organic material portion of each of the plurality of second portions 202 may include an organic material having flexibility or an organic polymer having flexibility. For example, each of the plurality of second portions 202 may include an organic material, an organic polymer, an organic piezoelectric material, or an organic non-piezoelectric material. For example, each of the plurality of second portions 202 may be referred to as an "adhesion" portion having flexibility, a "flexible" portion, a "bending" portion, a "damping" portion, or an "elastic" portion, but embodiments are not limited to these terms. According as each organic material portion may be between each pair of the inorganic material portions, it may be possible to absorb a force applied to the inorganic material portion (or first portion), to improve an entire durability of the vibration module 200 by releasing stress focused on the inorganic material portion, and to provide flexibility to the vibration module 200.

Accordingly, the piezoelectric composite layer (PCL) may be formed in a thin-film type obtained by alternately connecting the first portion 201 of the inorganic material including a piezoelectric characteristic and the second portion 202 of the organic material having the flexibility, repeatedly, whereby the piezoelectric composite layer (PCL) may have a size corresponding to the size of the display panel 100 of the display apparatus, or may have a size capable of realizing the sound properties or vibration properties preset in the display panel 100.

According to an embodiment, when the vibration module 200 according to an embodiment of the present disclosure is realized in a pattern shape of the organic material portion and the inorganic material portion, the size (or area) of the vibration module 200 may be expanded to any desired amount, whereby it may be possible to increase a panel coverage of the vibration module 200 for the display panel 100, thereby improving the sound properties in accordance with the vibration of the display panel 100. It may be possible to realize slimness of the vibration module 200, whereby it may be possible to reduce or prevent the increase of driving voltage. Also, the vibration module 200 according to an embodiment of the present disclosure may be realized in the thin-film type including the inorganic material portion and the organic material portion, whereby the vibration module 200 may be integrated with or mounted on the display apparatus without any interference with the other elements and/or structure of the display apparatus.

The piezoelectric composite layer (PCL) may be polarized by a constant voltage applied to the first electrode layer 203 and the second electrode layer 204 at a constant temperature atmosphere. The first electrode layer 203 may be on a first surface (or front surface) of the piezoelectric composite layer (PCL), and may be electrically connected to a first surface in each of the plurality of first portions 201. According to an embodiment, the first electrode layer 203 may include a transparent conductive material, a semi-transparent conductive material, or an opaque conductive material. For example, the transparent or semi-transparent conductive material may include indium tin oxide (ITO) or indium zinc oxide (IZO), but embodiments are not limited to these materials. The opaque conductive material may include aluminum (Al), copper (Cu), gold (Au), silver (Ag), molybdenum (Mo), magnesium (Mg), and/or their alloys, but embodiments are not limited to these materials.

The second electrode layer 204 may be on a second surface (or rear surface) opposite to the first surface of the piezoelectric composite layer (PCL), and may be electrically connected to a second surface in each of the plurality of first portions 201. According to an embodiment, the second electrode layer 204 may include a transparent conductive material, a semi-transparent conductive material, or an opaque conductive material. For example, the second electrode layer 204 may include the same material as that of the first electrode layer 203.

The vibration module 200 may further include a first protection film 205 and a second protection film 206. The first protection film 205 may be on the first electrode layer 203, to thereby protect the first surface of the piezoelectric composite layer (PCL) or the first electrode layer 203. For example, the first protection film 205 may be polyimide (PI) film or polyethyleneterephthalate (PET) film, but embodiments are not limited to these materials.

The second protection film 206 may be on the second electrode layer 204, to thereby protect the second surface of the piezoelectric composite layer (PCL) or the second electrode layer 204. For example, the second protection film 206 may be polyimide (PI) film or polyethyleneterephthalate (PET) film, but embodiments are not limited to these materials.

Figure 6:
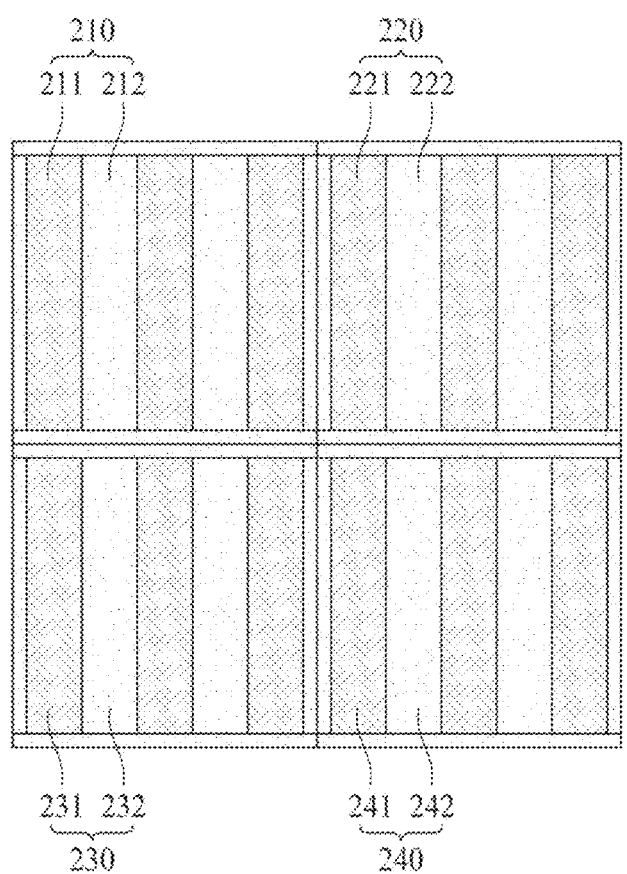
FIG. 6 is a plane view illustrating a first embodiment of a vibration module in the display apparatus according to an embodiment of the present disclosure.
Figure 7:
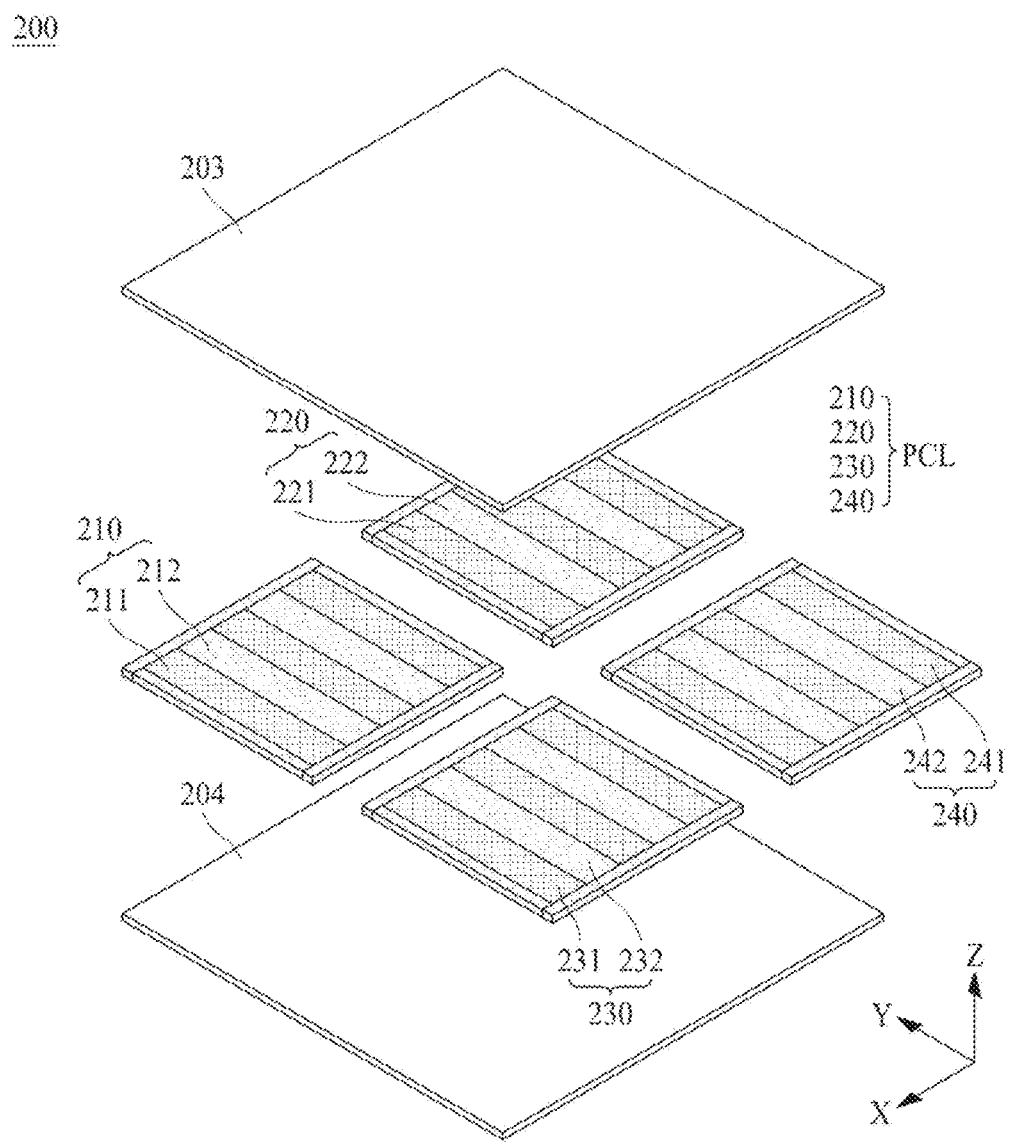
FIG. 7 is an exploded perspective view illustrating the vibration module of FIG. 6.

FIG. 6 is a plane view illustrating a first embodiment of a vibration module in the display apparatus according to an embodiment of the present disclosure. FIG. 7 is an exploded perspective view illustrating the vibration module of FIG. 6.

With reference to FIGS. 6 and 7, at least one vibration module 200 may include a piezoelectric composite layer (PCL), a first electrode layer 203, and a second electrode layer 204. The piezoelectric composite layer (PCL) may include a plurality of sub-modules. Each of the plurality of sub-modules may include a plurality of first portions including a piezoelectric characteristic, and a plurality of second portions having flexibility, wherein each of the plurality of second portions may be between respective pairs of the plurality of first portions.

The first electrode layer 203 may be on a first surface (or front surface) of the plurality of sub-modules, and may be electrically connected to a first surface in the plurality of first portions 201 in each of the plurality of sub-modules. For example, the first electrode layer 203 formed as one body may supply a sound signal to the plurality of first portions in each of the plurality of sub-modules. According to another embodiment, the first electrode layer 203 may include a plurality of first electrode layers that respectively correspond to the plurality of sub-modules, and each of the plurality of first electrode layers may supply the sound signal to the plurality of first portions in each of the plurality of sub-modules.

The second electrode layer 204 may be on a second surface (or rear surface) opposite to the first substrate in the plurality of sub-modules, and may be electrically connected to the second surface in the plurality of first portions provided in each of the plurality of sub-modules. For example, the second electrode layer 204 may include a common electrode as one body.

According to an embodiment, the piezoelectric composite layer (PCL) may include first to fourth sub-modules 210, 220, 230, and 240. The first sub-module 210 may be in a left-sided upper portion of the piezoelectric composite layer (PCL). The first sub-module 210 may include a plurality of first portions 211 including a piezoelectric characteristic, and a plurality of second portions 212 having flexibility, wherein each of the plurality of second portions may be between respective pairs of the plurality of first portions.

According to an embodiment, the plurality of first portions 211 in the first sub-module 210 may extend in the second direction (Y) on the plane, and may be spaced apart from each other in the first direction (X). Each of the plurality of second portions 212 in the first sub-module 210 may be between respective pairs of the first portions 211, and the plurality of second portions 212 may be parallel to the plurality of first portions 211. Accordingly, the plurality of second portions in the first sub-module 210 may extend in the second direction (Y) on the plane, and may be spaced apart from each other in the first direction (X).

The second sub-module 220 may be in a right-sided upper portion of the piezoelectric composite layer (PCL). The second sub-module 220 may include a plurality of first portions 221 including a piezoelectric characteristic, and a plurality of second portions 222 having flexibility, wherein each of the plurality of second portions 222 may be between respective pairs of the plurality of first portions 221.

According to an embodiment, the plurality of first portions 221 in the second sub-module 220 may extend in the second direction (Y) on the plane, and may be spaced apart from each other in the first direction (X). Thus, an arrangement direction of the plurality of first portions 221 in the second sub-module 220 may be identical to an arrangement direction of the plurality of first portions 211 in the first sub-module 210.

The third sub-module 230 may be in a left-sided lower portion of the piezoelectric composite layer (PCL). The third sub-module 230 may include a plurality of first portions 231 including a piezoelectric characteristic, and a plurality of second portions 232 having flexibility, wherein each of the plurality of second portions 232 may be between respective pairs of the plurality of first portions 231.

According to an embodiment, the plurality of first portions 231 in the third sub-module 230 may extend in the second direction (Y) on the plane, and may be spaced apart from each other in the first direction (X). Thus, an arrangement direction of the plurality of first portions 231 in the third sub-module 230 may be identical to an arrangement direction of the plurality of first portions 211 and 221 in the first and second sub-modules 210 and 220.

The fourth sub-module 240 may be in a right-sided lower portion of the piezoelectric composite layer (PCL). The fourth sub-module 240 may include a plurality of first portions 241 including a piezoelectric characteristic, and a plurality of second portions 242 having flexibility, wherein each of the plurality of second portions 242 may be between respective pairs of the plurality of first portions 241.

According to an embodiment, the plurality of first portions 241 in the fourth sub-module 240 may extend in the second direction (Y) on the plane, and may be spaced apart from each other in the first direction (X). Thus, an arrangement direction of the plurality of first portions 241 in the fourth sub-module 240 may be identical to an arrangement direction of the plurality of first portions 211, 221, and 231 in the first, second and third sub-modules 210, 220, and 230.

Accordingly, each of the first to fourth sub-modules 210, 220, 230, and 240 may include the plurality of first portions 211, 221, 231, and 241 arranged in the same direction so that it may be possible to realize the same piezoelectric characteristic and complement the vibration generated in another sub-module. As a result, the vibration module 200 according to an embodiment of the present disclosure may include the plurality of first portions 211, 221, 231, and 241 arranged in the same direction so that it may be possible to increase a vibration area of the display panel 100 and to realize a stereophonic sound effect. Also, the display apparatus according to an embodiment of the present disclosure may further include a plurality of sub-modules additionally arranged in the first direction (X) or second direction (Y) of the vibration module 200, whereby it may be possible to realize a large-sized vibration module for a large-sized display apparatus.

Figure 8:
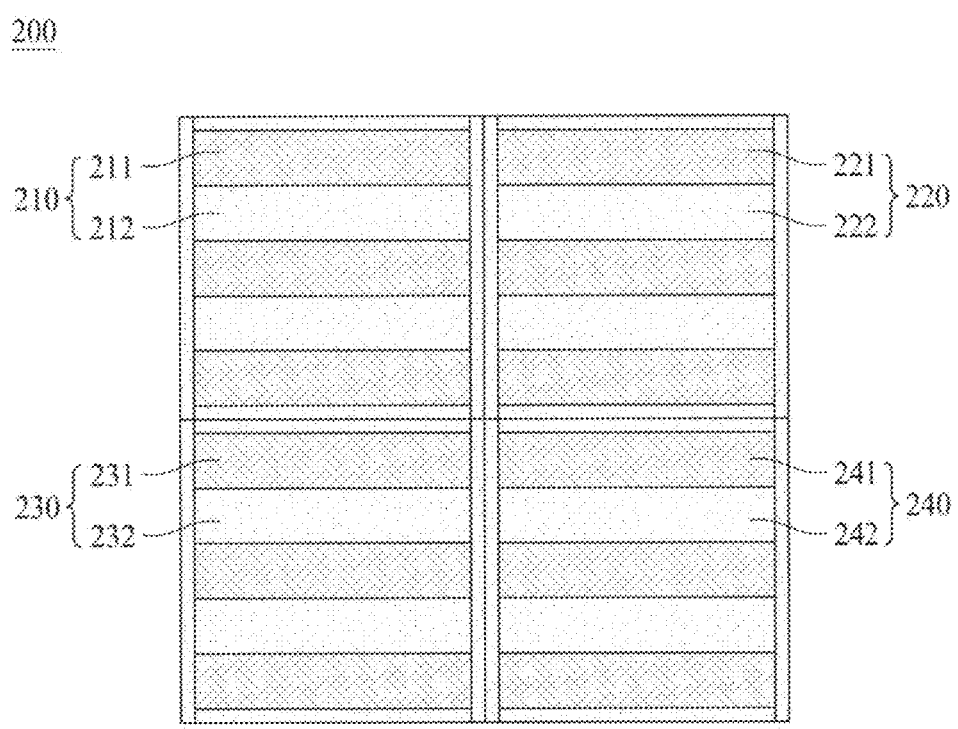
FIG. 8 is a plane view illustrating a second embodiment of a vibration module in the display apparatus according to an embodiment of the present disclosure.

FIG. 8 is a plane view illustrating a second embodiment of a vibration module in the display apparatus according to an embodiment of the present disclosure.

With reference to FIG. 8, at least one vibration module 200 may include a piezoelectric composite layer (PCL), wherein the piezoelectric composite layer (PCL) may include first to fourth sub-modules 210, 220, 230, and 240. The first sub-module 210 may be in a left-sided upper portion of the piezoelectric composite layer (PCL). The first sub-module 210 may include a plurality of first portions 211 and a plurality of second portions 212.

According to an embodiment, the plurality of first portions 211 in the first sub-module 210 may extend in the first direction (X) on the plane, and may be spaced apart from each other in the second direction (Y). Each of the plurality of second portions 212 in the first sub-module 210 may be between respective pairs of the first portions 211, and the plurality of second portions 212 may be parallel to the plurality of first portions 211. Accordingly, the plurality of second portions in the first sub-module 210 may extend in the first direction (X) on the plane, and may be spaced apart from each other in the second direction (Y).

The second sub-module 220 may be in a right-sided upper portion of the piezoelectric composite layer (PCL). The second sub-module 220 may include a plurality of first portions 221 and a plurality of second portions 222.

According to an embodiment, the plurality of first portions 221 in the second sub-module 220 may extend in the first direction (X) on the plane, and may be spaced apart from each other in the second direction (Y). Thus, an arrangement direction of the plurality of first portions 221 in the second sub-module 220 may be identical to an arrangement direction of the plurality of first portions 211 in the first sub-module 210.

The third sub-module 230 may be in a left-sided lower portion of the piezoelectric composite layer (PCL). The third sub-module 230 may include a plurality of first portions 231 and a plurality of second portions 232.

According to an embodiment, the plurality of first portions 231 in the third sub-module 230 may extend in the first direction (X) on the plane, and may be spaced apart from each other in the second direction (Y). Thus, an arrangement direction of the plurality of first portions 231 in the third sub-module 230 may be identical to an arrangement direction of the plurality of first portions 211 in the first sub-module 210, and an arrangement direction of the plurality of first portions 221 in the second sub-module 220.

The fourth sub-module 240 may be in a right-sided lower portion of the piezoelectric composite layer (PCL). The fourth sub-module 240 may include a plurality of first portions 241 and a plurality of second portions 242.

According to an embodiment, the plurality of first portions 241 in the fourth sub-module 240 may extend in the first direction (X) on the plane, and may be spaced apart from each other in the second direction (Y). Thus, an arrangement direction of the plurality of first portions 241 in the fourth sub-module 240 may be identical to an arrangement direction of the plurality of first portions 211, 221 and 231 in the first, second and third sub-modules 210, 220 and 230.

Accordingly, each of the first to fourth sub-modules 210, 220, 230, and 240 may include the plurality of first portions 211, 221, 231, and 241 arranged in the same direction so that it may be possible to realize the same piezoelectric characteristic and to complement the vibration generated in another sub-module. As a result, the vibration module 200 according to an embodiment of the present disclosure may include the plurality of first portions 211, 221, 231, and 241 arranged in the same direction so that it may be possible to increase a vibration area of the display panel 100 and to realize a stereophonic sound effect. Also, the display apparatus according to an embodiment of the present disclosure may further include a plurality of sub-modules additionally arranged in the first direction (X) or second direction (Y) of the vibration module 200, whereby it may be possible to realize a large-sized vibration module for a large-sized display apparatus.

Figure 9:
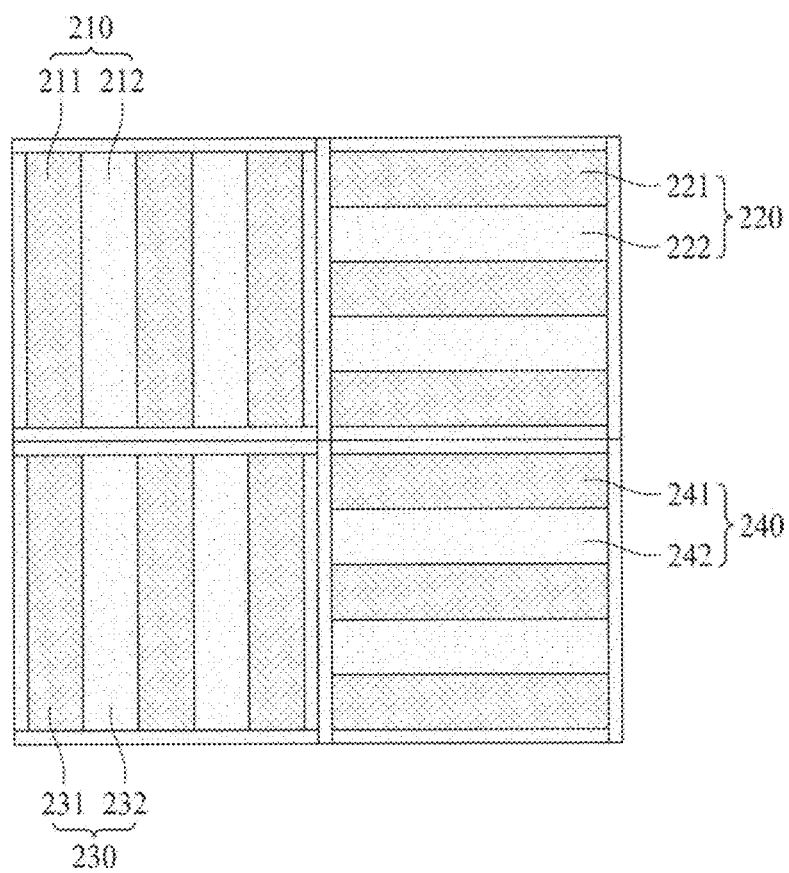
FIG. 9 is a plane view illustrating a third embodiment of a vibration module in the display apparatus according to an embodiment of the present disclosure.

FIG. 9 is a plane view illustrating a third embodiment of a vibration module in the display apparatus according to an embodiment of the present disclosure.

With reference to FIG. 9, at least one vibration module 200 may include a piezoelectric composite layer (PCL), wherein the piezoelectric composite layer (PCL) may include first to fourth sub-modules 210, 220, 230, and 240.

The first sub-module 210 may be in a left-sided upper portion of the piezoelectric composite layer (PCL). The first sub-module 210 may include a plurality of first portions 211 and a plurality of second portions 212.

According to an embodiment, the plurality of first portions 211 in the first sub-module 210 may extend in the second direction (Y) on the plane, and may be spaced apart from each other in the first direction (X). Each of the plurality of second portions 212 in the first sub-module 210 may be between respective pairs of the first portions 211, and the plurality of second portions 212 may be parallel to the plurality of first portions 211. Accordingly, the plurality of second portions in the first sub-module 210 may extend in the second direction (Y) on the plane, and may be spaced apart from each other in the first direction (X).

The second sub-module 220 may be in a right-sided upper portion of the piezoelectric composite layer (PCL). The second sub-module 220 may include a plurality of first portions 221 and a plurality of second portions 222.

According to an embodiment, the plurality of first portions 221 in the second sub-module 220 may extend in the first direction (X) on the plane, and may be spaced apart from each other in the second direction (Y). Thus, an arrangement direction of the plurality of first portions 221 in the second sub-module 220 may be different from an arrangement direction of the plurality of first portions 211 in the first sub-module 210.

The third sub-module 230 may be in a left-sided lower portion of the piezoelectric composite layer (PCL). The third sub-module 230 may include a plurality of first portions 231 and a plurality of second portions 232.

According to an embodiment, the plurality of first portions 231 in the third sub-module 230 may extend in the second direction (Y) on the plane, and may be spaced apart from each other in the first direction (X). Thus, an arrangement direction of the plurality of first portions 231 in the third sub-module 230 may be identical to an arrangement direction of the plurality of first portions 211 in the first sub-module 210, and may be different from an arrangement direction of the plurality of first portions 221 in the second sub-module 220.

The fourth sub-module 240 may be in a right-sided lower portion of the piezoelectric composite layer (PCL). The fourth sub-module 240 may include a plurality of first portions 241 and a plurality of second portions 242.

According to an embodiment, the plurality of first portions 241 in the fourth sub-module 240 may extend in the first direction (X) on the plane, and may be spaced apart from each other in the second direction (Y). Thus, an arrangement direction of the plurality of first portions 241 in the fourth sub-module 240 may be identical to an arrangement direction of the plurality of first portions 221 in the second sub-module 220. The arrangement direction of the plurality of first portions 241 in the fourth sub-module 240 may be different from an arrangement direction of the plurality of first portions 211 and 231 in the first and third sub-modules 210 and 230.

Accordingly, a piezoelectric characteristic in the first and third sub-modules 210 and 230 including the plurality of first portions 211 and 231 arranged in the second direction (Y) may be different from a piezoelectric characteristic in the second and fourth sub-modules 220 and 240 including the plurality of first portions 221 and 241 arranged in the first direction (X). For example, a natural frequency (or natural pitch) in the display panel 100, to which the sub-module 210 and 230 including the plurality of first portions 211 and 231 arranged in the second direction (Y) is attached, may be different from a natural frequency (or natural pitch) in the display panel 100 to which the sub-module 220 and 240 including the plurality of first portions 221 and 241 arranged in the first direction (X) may be attached. Accordingly, the display panel 100, to which the sub-module 210 and 230 including the plurality of first portions 211 and 231 arranged in the second direction (Y) may be attached, and the display panel 100, to which the sub-module 220 and 240 including the plurality of first portions 221 and 241 arranged in the first direction (X) may be attached, may receive the same input signal, and may output sound having the different frequency properties. For example, the sound pressure in the display panel 100 to which the sub-module 210 and 230 including the plurality of first portions 211 and 231 arranged in the second direction (Y) may be attached, and the sound pressure in the display panel 100 to which the sub-module 220 and 240 including the plurality of first portions 221 and 241 arranged in the first direction (X) may be attached may have peak values at the different frequencies. Accordingly, the display apparatus according to an embodiment of the present disclosure may include the first to fourth sub-modules 210, 220, 230, and 240 whose first portions 211, 221, 231, and 241 may be arranged in different directions so that it may be possible to improve flatness of the sound pressure by complementing the frequency properties of the sound pressure.

Figure 10:
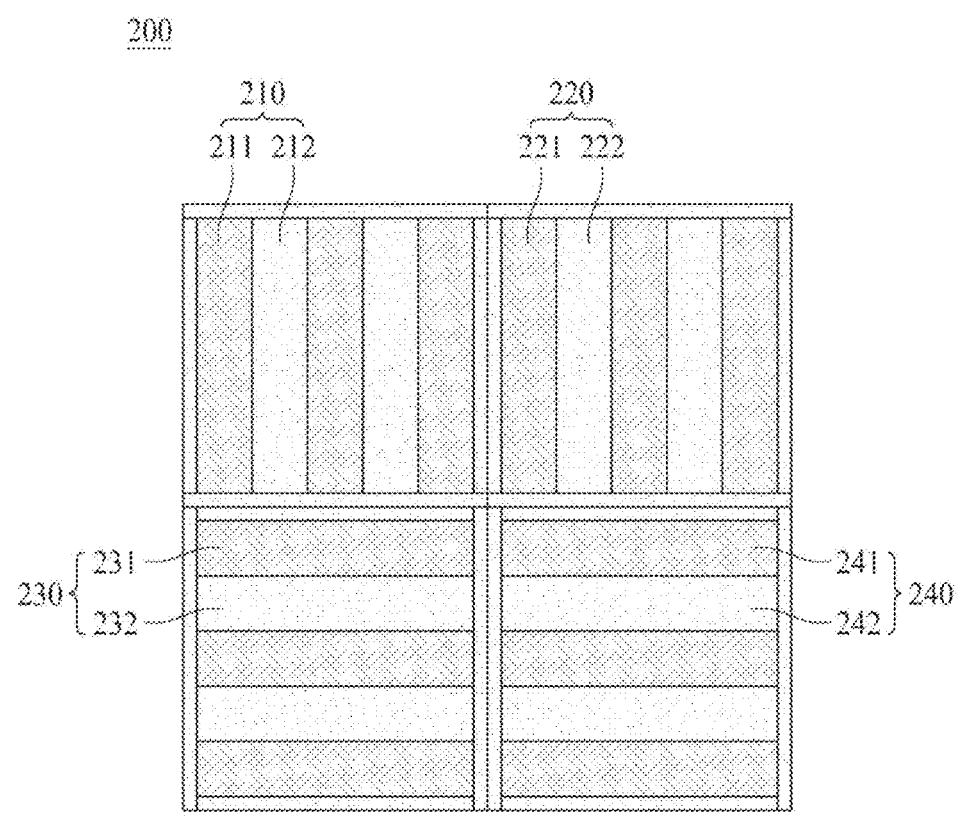
FIG. 10 is a plane view illustrating a fourth embodiment of a vibration module in the display apparatus according to an embodiment of the present disclosure.

FIG. 10 is a plane view illustrating a fourth embodiment of a vibration module in the display apparatus according to an embodiment of the present disclosure.

With reference to FIG. 10, at least one vibration module 200 may include a piezoelectric composite layer (PCL), wherein the piezoelectric composite layer (PCL) may include first to fourth sub-modules 210, 220, 230, and 240. The first sub-module 210 may be in a left-sided upper portion of the piezoelectric composite layer (PCL). The first sub-module 210 may include a plurality of first portions 211 and a plurality of second portions 212.

According to an embodiment, the plurality of first portions 211 in the first sub-module 210 may extend in the second direction (Y) on the plane, and may be spaced apart from each other in the first direction (X). Each of the plurality of second portions 212 in the first sub-module 210 may be between respective pairs of the first portions 211, and the plurality of second portions 212 may be parallel to the plurality of first portions 211. Accordingly, the plurality of second portions in the first sub-module 210 may extend in the second direction (Y) on the plane, and may be spaced apart from each other in the first direction (X).

The second sub-module 220 may be in a right-sided upper portion of the piezoelectric composite layer (PCL). The second sub-module 220 may include a plurality of first portions 221 and a plurality of second portions 222.

According to an embodiment, the plurality of first portions 221 in the second sub-module 220 may extend in the second direction (Y) on the plane, and may be spaced apart from each other in the first direction (X). Thus, an arrangement direction of the plurality of first portions 221 in the second sub-module 220 may be identical to an arrangement direction of the plurality of first portions 211 in the first sub-module 210.

The third sub-module 230 may be in a left-sided lower portion of the piezoelectric composite layer (PCL). The third sub-module 230 may include a plurality of first portions 231 and a plurality of second portions 232.

According to an embodiment, the plurality of first portions 231 in the third sub-module 230 may extend in the first direction (X) on the plane, and may be spaced apart from each other in the second direction (Y). Thus, an arrangement direction of the plurality of first portions 231 in the third sub-module 230 may be different from an arrangement direction of the plurality of first portions 211 and 221 in the first and second sub-modules 210 and 220.

The fourth sub-module 240 may be in a right-sided lower portion of the piezoelectric composite layer (PCL). The fourth sub-module 240 may include a plurality of first portions 241 and a plurality of second portions 242.

According to an embodiment, the plurality of first portions 241 in the fourth sub-module 240 may extend in the first direction (X) on the plane, and may be spaced apart from each other in the second direction (Y). Thus, an arrangement direction of the plurality of first portions 241 in the fourth sub-module 240 may be identical to an arrangement direction of the plurality of first portions 231 in the third sub-module 230. The arrangement direction of the plurality of first portions 241 in the fourth sub-module 240 may be different from an arrangement direction of the plurality of first portions 211 and 221 in the first and second sub-modules 210 and 220.

Accordingly, a piezoelectric characteristic in the first and second sub-modules—210 and 220 having the plurality of first portions 211 and 221 arranged in the second direction (Y) may be different from a piezoelectric characteristic in the third and fourth sub-modules 230 and 240 having the plurality of first portions 231 and 241 arranged in the first direction (X). For example, a natural frequency (or natural pitch) in the display panel 100, to which the sub-module 210 and 220 including the plurality of first portions 211 and 221 arranged in the second direction (Y) may be attached, may have a different natural frequency (or natural pitch) in the display panel 100 to which the sub-module 230 and 240 including the plurality of first portions 231 and 241 arranged in the first direction (X) may be attached. Accordingly, the display panel 100, to which the sub-module 210 and 220 including the plurality of first portions 211 and 221 arranged in the second direction (Y) may be attached, and the display panel 100, to which the sub-module 230 and 240 including the plurality of first portions 231 and 241 arranged in the first direction (X) may be attached, may receive the same input signal, and may output sound having the different frequency properties. For example, the sound pressure in the display panel 100 to which the sub-module 210 and 220 including the plurality of first portions 211 and 221 arranged in the second direction (Y) may be attached, and the sound pressure in the display panel 100 to which the sub-module 230 and 240 including the plurality of first portions 231 and 241 arranged in the first direction (X) may be attached may have peak values at the different frequencies. Accordingly, the display apparatus according to an embodiment of the present disclosure may include the first to fourth sub-modules 210, 220, 230, and 240 whose first portions 211, 221, 231, and 241 may be arranged in the different directions so that it may be possible to improve flatness of the sound pressure by complementing the frequency properties of the sound pressure.

Figure 11:
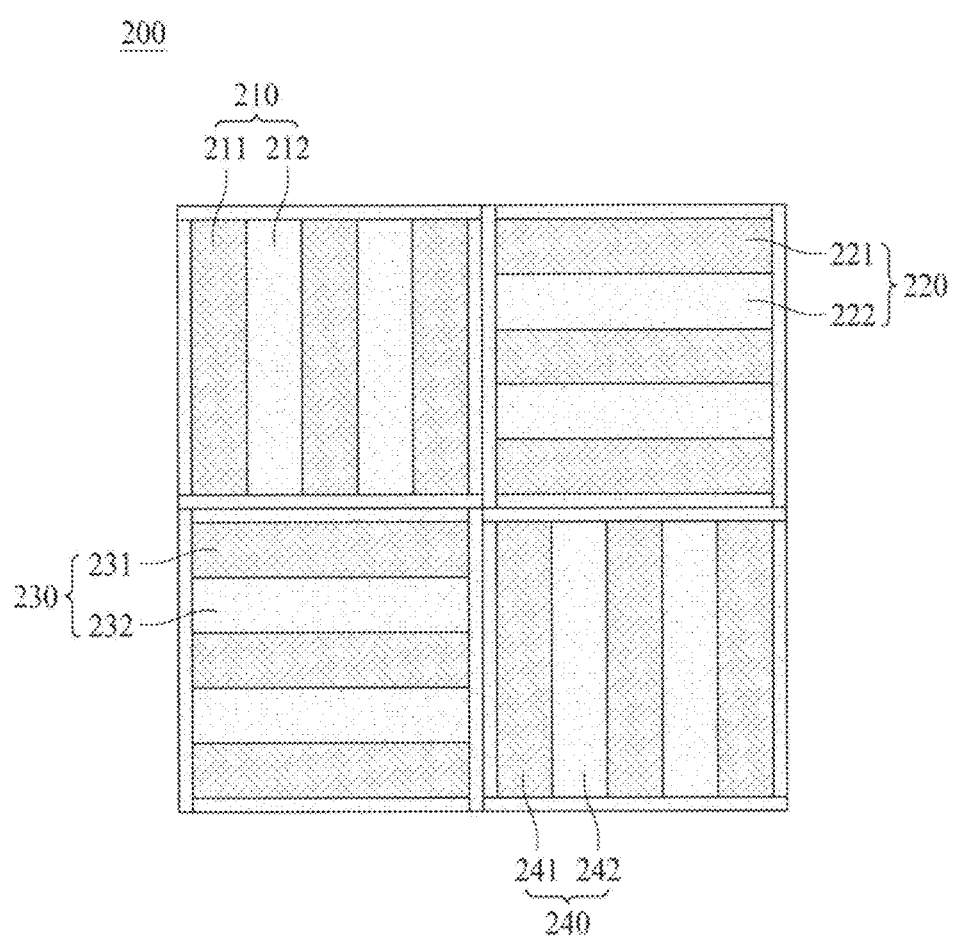
FIG. 11 is a plane view illustrating a fifth embodiment of a vibration module in the display apparatus according to an embodiment of the present disclosure.

FIG. 11 is a plane view illustrating a fifth embodiment of a vibration module in the display apparatus according to an embodiment of the present disclosure.

With reference to FIG. 11, at least one vibration module 200 may include a piezoelectric composite layer (PCL), wherein the piezoelectric composite layer (PCL) may include first to fourth sub-modules 210, 220, 230, and 240. The first sub-module 210 may be in a left-sided upper portion of the piezoelectric composite layer (PCL). The first sub-module 210 may include a plurality of first portions 211 and a plurality of second portions 212.

According to an embodiment, the plurality of first portions 211 in the first sub-module 210 may extend in the second direction (Y) on the plane, and may be spaced apart from each other in the first direction (X). Each of the plurality of second portions 212 in the first sub-module 210 may be between respective pairs of the first portions 211, and the plurality of second portions 212 may be parallel to the plurality of first portions 211. Accordingly, the plurality of second portions in the first sub-module 210 may extend in the second direction (Y) on the plane, and may be spaced apart from each other in the first direction (X).

The second sub-module 220 may be in a right-sided upper portion of the piezoelectric composite layer (PCL). The second sub-module 220 may include a plurality of first portions 221 and a plurality of second portions 222.

According to an embodiment, the plurality of first portions 221 in the second sub-module 220 may extend in the first direction (X) on the plane, and may be spaced apart from each other in the second direction (Y). Thus, an arrangement direction of the plurality of first portions 221 in the second sub-module 220 may be different from an arrangement direction of the plurality of first portions 211 in the first sub-module 210.

The third sub-module 230 may be in a left-sided lower portion of the piezoelectric composite layer (PCL). The third sub-module 230 may include a plurality of first portions 231 and a plurality of second portions 232.

According to an embodiment, the plurality of first portions 231 in the third sub-module 230 may extend in the first direction (X) on the plane, and may be spaced apart from each other in the second direction (Y). Thus, an arrangement direction of the plurality of first portions 231 in the third sub-module 230 may be different from an arrangement direction of the plurality of first portions 211 in the first sub-module 210, and may be identical to an arrangement direction of the plurality of first portions 221 in the second sub-module 220.

The fourth sub-module 240 may be in a right-sided lower portion of the piezoelectric composite layer (PCL). The fourth sub-module 240 may include a plurality of first portions 241 and a plurality of second portions 242.

According to an embodiment, the plurality of first portions 241 in the fourth sub-module 240 may extend in the second direction (Y) on the plane, and may be spaced apart from each other in the first direction (X). Thus, an arrangement direction of the plurality of first portions 241 in the fourth sub-module 240 may be identical to an arrangement direction of the plurality of first portions 211 in the first sub-module 210. The arrangement direction of the plurality of first portions 241 in the fourth sub-module 240 may be different from an arrangement direction of the plurality of first portions 221 and 231 in the second and third sub-modules 220 and 230.

Accordingly, a piezoelectric characteristic in the first and fourth sub-modules 210 and 240 including the plurality of first portions 211 and 241 arranged in the second direction (Y) may be different from a piezoelectric characteristic in the second and third sub-modules 220 and 230 including the plurality of first portions 221 and 231 arranged in the first direction (X). For example, a natural frequency (or natural pitch) in the display panel 100, to which the sub-module 210 and 240 including the plurality of first portions 211 and 241 arranged in the second direction (Y) may be attached, may have a different natural frequency (or natural pitch) in the display panel 100 to which the sub-module 220 and 230 including the plurality of first portions 221 and 231 arranged in the first direction (X) may be attached. Accordingly, the display panel 100, to which the sub-module 210 and 240 including the plurality of first portions 211 and 241 arranged in the second direction (Y) is attached, and the display panel 100, to which the sub-module 220 and 230 including the plurality of first portions 221 and 231 arranged in the first direction (X) may be attached, may receive the same input signal, and may output sound having the different frequency properties. For example, the sound pressure in the display panel 100 to which the sub-module 210 and 240 including the plurality of first portions 211 and 241 arranged in the second direction (Y) is attached, and the sound pressure in the display panel 100 to which the sub-module 220 and 230 including the plurality of first portions 221 and 231 arranged in the first direction (X) may be attached may have peak values at the different frequencies. Accordingly, the display apparatus according to an embodiment of the present disclosure includes the first to fourth sub-modules 210, 220, 230, and 240 whose first portions 211, 221, 231, and 241 may be arranged in the different directions so that it may be possible to improve flatness of the sound pressure by complementing the frequency properties of the sound pressure.

Figure 12:
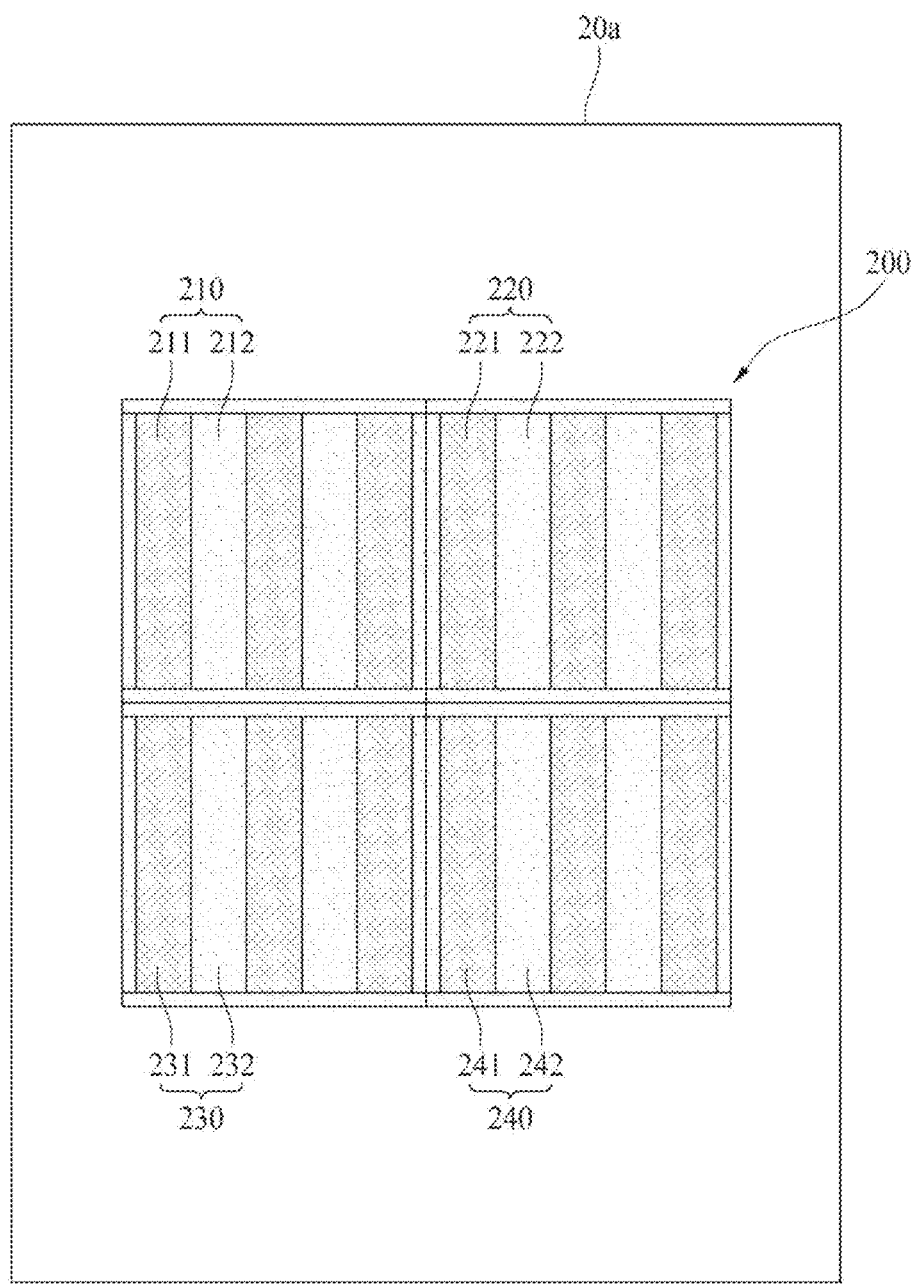
FIG. 12 illustrates a vibration plate to which the vibration module of FIG. 6 is attached.

FIG. 12 illustrates a vibration plate to which the vibration module shown in FIG. 6 is attached.

With reference to FIG. 12, the vibration plate 20a may receive the vibration of the vibration module 200, and may output sound. Herein, the vibration plate 20a may include polyacrylate, but is not limited to this material. The vibration plate 20a may include any material having rigidity and elasticity capable of receiving the vibration and outputting the sound having sound pressure more than a certain level. For example, the display panel 100 of the display apparatus may function as the vibration plate capable of receiving the vibration of the vibration module 200 and directly generating sound (SW).

According to an embodiment, the vibration plate 20a may include a short side parallel to the first direction (X) on the plane, and a long side parallel to the second direction (Y) on the plane. The vibration module 200 may be attached to a rear surface of the vibration plate 20a including the long side parallel to the second direction (Y). The vibration module 200 may include a piezoelectric composite layer (PCL), wherein the piezoelectric composite layer (PCL) may include first to fourth sub-modules 210, 220, 230, and 240.

An arrangement direction of the plurality of first portions 211, 221, 231, and 241 in each of the first to fourth sub-modules 210, 220, 230, and 240 may be identical to that of the first embodiment of the vibration module 200 shown in FIG. 6. Thus, the plurality of first portions 211, 221, 231, and 241 in each of the first to fourth sub-modules 210, 220, 230, and 240 may be parallel to the long side direction of the vibration plate 20a.

Figure 13:
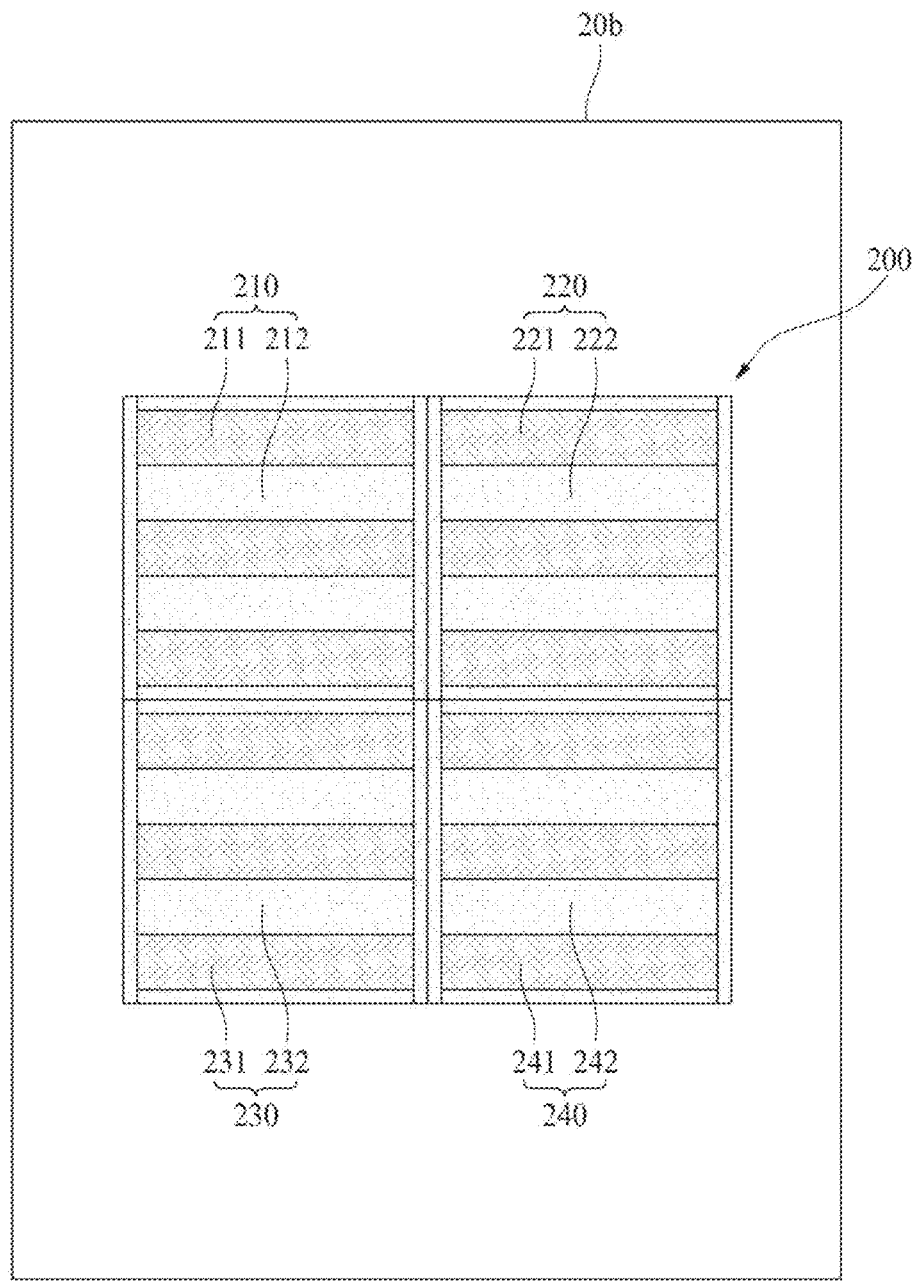
FIG. 13 illustrates a vibration plate to which the vibration module of FIG. 8 is attached.

FIG. 13 illustrates a vibration plate to which the vibration module shown in FIG. 8 is attached.

Herein, a structure of the vibration plate 20b of FIG. 13 may be identical to a structure of the vibration plate 20a of FIG. 12. Thus, a shape, structure, material and natural frequency in the vibration plate 20b of FIG. 13 to which the vibration module is not attached may be the same as those in the vibration plate 20a of FIG. 12 to which the vibration module is not attached.

With reference to FIG. 13, the vibration plate 20b may receive the vibration of the vibration module 200, and may output sound. Herein, the vibration plate 20b may include polyacrylate, but is not limited to this material. The vibration plate 20b may include any material having rigidity and elasticity capable of receiving the vibration and outputting the sound having sound pressure more than a certain level. For example, the display panel 100 of the display apparatus may function as the vibration plate capable of receiving the vibration of the vibration module 200 and directly generating sound (SW).

According to an embodiment, the vibration plate 20b may include a short side parallel to the first direction (X) on the plane, and a long side parallel to the second direction (Y) on the plane. The vibration module 200 may be attached to a rear surface of the vibration plate 20b including the long side parallel to the second direction (Y). The vibration module 200 may include a piezoelectric composite layer (PCL), wherein the piezoelectric composite layer (PCL) may include first to fourth sub-modules 210, 220, 230, and 240.

An arrangement direction of the plurality of first portions 211, 221, 231, and 241 in each of the first to fourth sub-modules 210, 220, 230, and 240 may be identical to that of the second embodiment of the vibration module 200 shown in FIG. 8. Thus, the plurality of first portions 211, 221, 231, and 241 in each of the first to fourth sub-modules 210, 220, 230, and 240 may be parallel to the short side direction of the display panel 100.

Thus, when the vibration module 200 shown in FIG. 8 is attached to the vibration plate 20b shown in FIG. 13, a natural frequency of the vibration plate 20b shown in FIG. 13 may be different from the natural frequency of the vibration plate 20a shown in FIG. 12. For example, the sound pressure level characteristic of the vibration plate may be determined based on the structural properties of the vibration plate and the arrangement direction of the piezoelectric material in the vibration module 200. Accordingly, the sound pressure level characteristic being output from the vibration plate 20b shown in FIG. 13 may be different from the sound pressure level characteristic being output from the vibration plate 20a shown in FIG. 12. For example, the vibration plates 20a and 20b shown in FIGS. 12 and 13 have different arrangement directions in the plurality of first portions 211, 221, 231, and 241 of the vibration module 200 from each other, whereby the sound pressure level characteristic of the vibration plate 20a shown in FIG. 12 may be different from the sound pressure level characteristic of the vibration plate 20b shown in FIG. 13.

Figure 14:
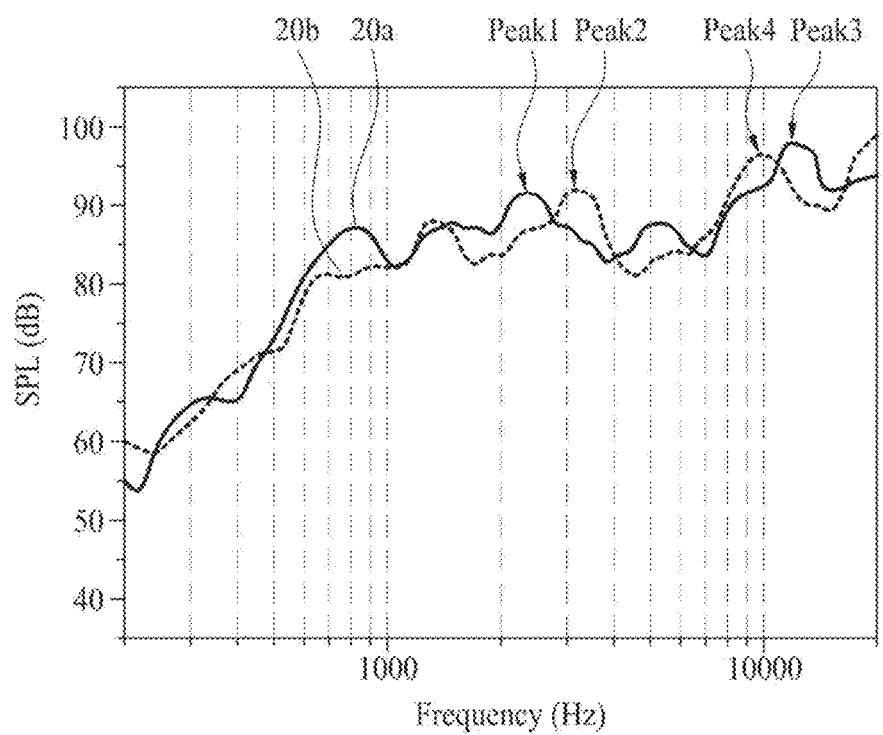
FIG. 14 is a graph illustrating a sound pressure level of the vibration plate shown in FIGS. 12 and 13.

FIG. 14 is a graph illustrating a sound pressure level of the display panel shown in FIGS. 12 and 13.

In FIG. 14, the x-axis is frequency in hertz (Hz), and the y-axis is sound pressure level (SPL) in decibels (dB). With reference to FIG. 14, the arrangement direction of the plurality of first portions 211, 221, 231, and 241 in the vibration module 200 applied to the vibration plate 20a shown in FIG. 12 is different from the arrangement direction of the plurality of first portions 211, 221, 231, and 241 in the vibration module 200 applied to the vibration plate 20b shown in FIG. 13, whereby the sound pressure level characteristic of the vibration plate 20a shown in FIG. 12 may be different from the sound pressure level characteristic of the vibration plate 20b shown in FIG. 13.

For example, in the case of the vibration plate 20a shown in FIG. 12, the plurality of first portions 211, 221, 231, and 241 in parallel to the long side direction of the vibration plate 20a may be attached thereto. Meanwhile, in the case of the vibration plate 20b shown in FIG. 13, the plurality of first portions 211, 221, 231, and 241 arranged in the short side direction of the vibration plate 20b may be attached thereto.

For example, in a frequency band of 2 kHz to 4 kHz, a frequency of a first peak (Peak1) of a sound pressure (SPL) output from the vibration plate 20a (shown as a solid line) shown in FIG. 12 may be different from a frequency of a second peak (Peak2) of a sound pressure (SPL) output from the vibration plate 20b (shown as a dotted line) shown in FIG. 13. In a frequency band of 9 kHz to 11 kHz, a frequency of a third peak (Peak3) of a sound pressure (SPL) output from the vibration plate 20a shown in FIG. 12 may be different from a frequency of a fourth peak (Peak4) of a sound pressure (SPL) output from the vibration plate 20b shown in FIG. 13. Thus, the vibration plates 20a and 20b shown in FIGS. 12 and 13 may have the different arrangement directions in the plurality of first portions 211, 221, 231, and 241 of the vibration module 200 from each other, whereby the frequency properties of the vibration plate 20a shown in FIG. 12 may be different from the frequency properties of the vibration plate 20b shown in FIG. 13.

Figure 15:
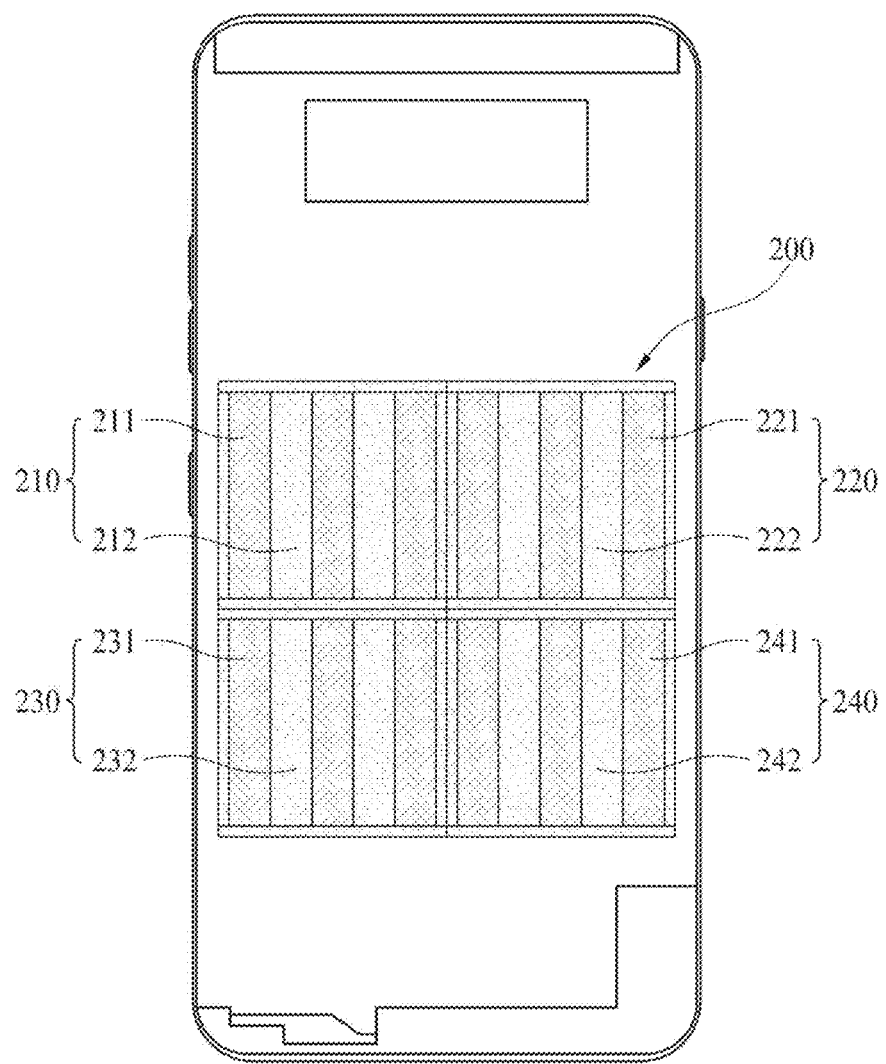
FIG. 15 illustrates a display apparatus to which the vibration module of FIG. 6 is attached.

FIG. 15 illustrates a display apparatus to which the vibration module shown in FIG. 6 is attached.

With reference to FIG. 15, the display apparatus 10a may receive the vibration of the vibration module 200, and may output sound. Herein, the display apparatus 10a may be a mobile electronic apparatus, such as a smart phone or an electronic pad, but is not limited to these devices. For example, the display apparatus 10a may be a set electronic apparatus or a set device (set apparatus) capable of receiving the vibration and outputting the sound having sound pressure more than a certain level. For example, the display apparatus 10a may function as a vibration plate capable of receiving the vibration of the vibration module 200 and directly generating the sound (SW).

According to an embodiment, the display apparatus 10a may include a short side parallel to the first direction (X) on the plane, and a long side parallel to the second direction (Y) on the plane. The vibration module 200 may be attached to a rear surface (or rear surface of a back cover) of the display apparatus 10a including the long side parallel to the second direction (Y). The vibration module 200 may include a piezoelectric composite layer (PCL), wherein the piezoelectric composite layer (PCL) may include first to fourth sub-modules 210, 220, 230, and 240.

An arrangement direction of the plurality of first portions 211, 221, 231, and 241 in each of the first to fourth sub-modules 210, 220, 230, and 240 may be identical to that of the first embodiment of the vibration module 200 shown in FIG. 6. Thus, the plurality of first portions 211, 221, 231, and 241 in each of the first to fourth sub-modules 210, 220, 230, and 240 may be parallel to the long side direction of the display apparatus 10a.

Figure 16:
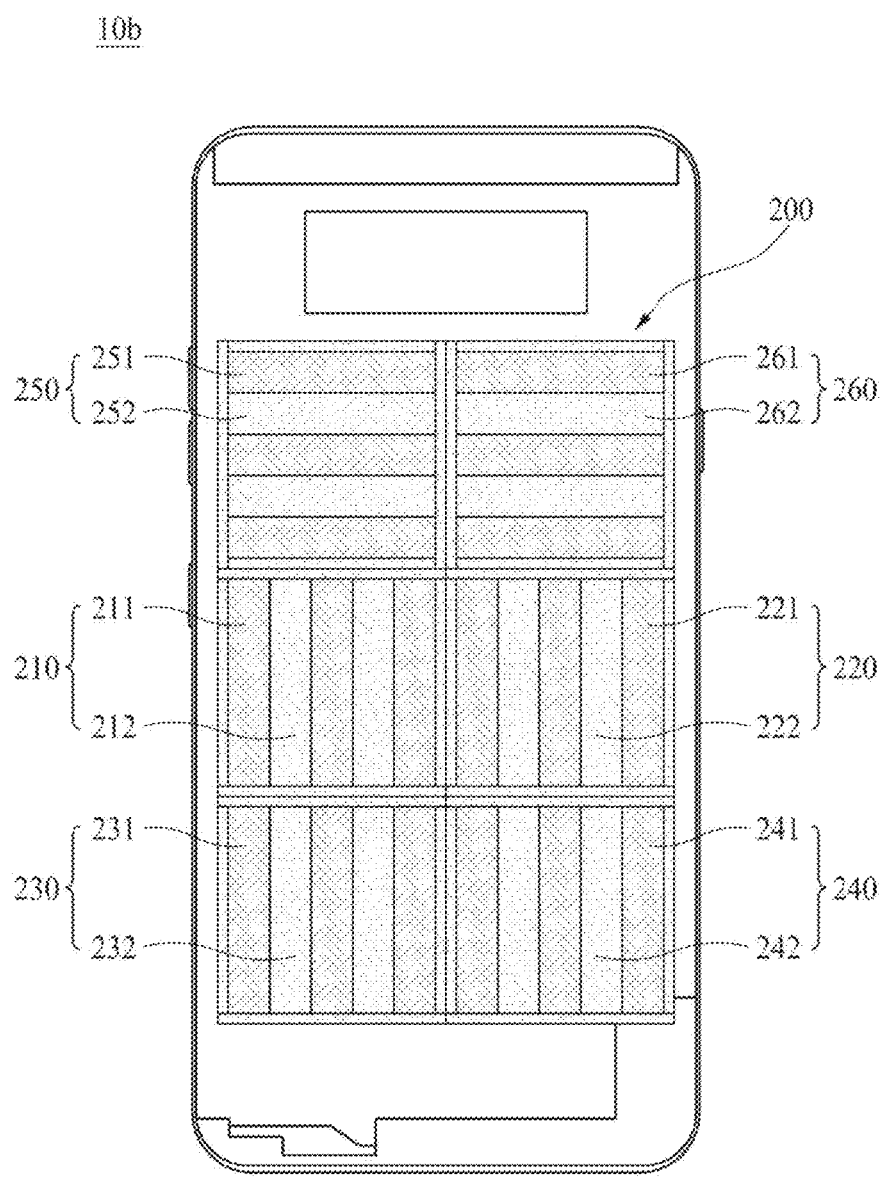
FIG. 16 illustrates a display apparatus obtained by additionally attaching a vibration module to the display apparatus of FIG. 15.

FIG. 16 illustrates a display apparatus obtained by additionally attaching a vibration module to the display apparatus of FIG. 15.

Herein, a structure of the display apparatus 10b of FIG. 16 may be identical to a structure of the display apparatus 10a of FIG. 15. Thus, a shape, structure, material and natural frequency in the display apparatus 10b of FIG. 16 to which the vibration module is not attached may be the same as those in the display apparatus 10a of FIG. 15 to which the vibration module is not attached.

With reference to FIG. 16, the display apparatus 10b may receive the vibration of the vibration module 200, and may output the sound. Herein, the display apparatus 10b may be a mobile electronic apparatus, such as a smart phone or an electronic pad, but is not limited to these devices. For example, the display apparatus 10b may be a set electronic apparatus or a set device (set apparatus) capable of receiving the vibration of the vibration module 200 and outputting the sound having sound pressure more than a certain level. For example, the display apparatus 10b may function as a vibration plate capable of receiving the vibration of the vibration module 200 and directly generating the sound (SW).

According to an embodiment, the display apparatus 10b may include a short side parallel to the first direction (X) on the plane, and a long side parallel to the second direction (Y) on the plane. The vibration module 200 may be attached to a rear surface (or rear surface of a back cover) of the display apparatus 10b including the long side parallel to the second direction (Y). The vibration module 200 may include a piezoelectric composite layer (PCL), wherein the piezoelectric composite layer (PCL) may include first to sixth sub-modules 210, 220, 230, 240, 250, and 260.

According to an embodiment, the fifth sub-module 250 may be on a first surface of the first sub-module 210, and the sixth sub-module 260 may be on a first surface of the second sub-module 220. According to another embodiment, the fifth sub-module 250 may be on a second surface of the third sub-module 230, and the sixth sub-module 260 may be on a second surface of the fourth sub-module 240. Thus, the fifth sub-module 250 or the sixth sub-module 260 may be adjacent to at least one among the first to fourth sub-modules 210, 220, 230, and 240, but their positions are not limited to the above.

An arrangement direction of the plurality of first portions 211, 221, 231, and 241 in each of the first to fourth sub-modules 210, 220, 230, and 240 may be identical to that of the first embodiment of the vibration module 200 shown in FIG. 6. Thus, the plurality of first portions 211, 221, 231, and 241 in each of the first to fourth sub-modules 210, 220, 230, and 240 may be parallel to the long side direction of the display apparatus 10b.

An arrangement direction of the plurality of first portions 251 and 261 in each of the fifth and sixth sub-modules 250 and 260 may be different from an arrangement direction of the plurality of first portions 211, 221, 231, and 241 in each of the first to fourth sub-modules 210, 220, 230, and 240. Thus, the plurality of first portions 251 and 261 in each of the fifth and sixth sub-modules 250 and 260 may be parallel to the short side direction of the display panel 100.

Accordingly, the display apparatus 10b shown in FIG. 16 may further include the fifth and sixth sub-modules 250 and 260 in addition to the display apparatus 10a shown in FIG. 15, and the display apparatus 10b shown in FIG. 16 may include the first to sixth sub-modules 210, 220, 230, 240, 250, and 260 including the plurality of first portions 211, 221, 231, 241, 251 and 261 arranged in the different directions so that it may be possible to improve flatness of the sound pressure by complementing the frequency properties of the sound pressure.

Figure 17:
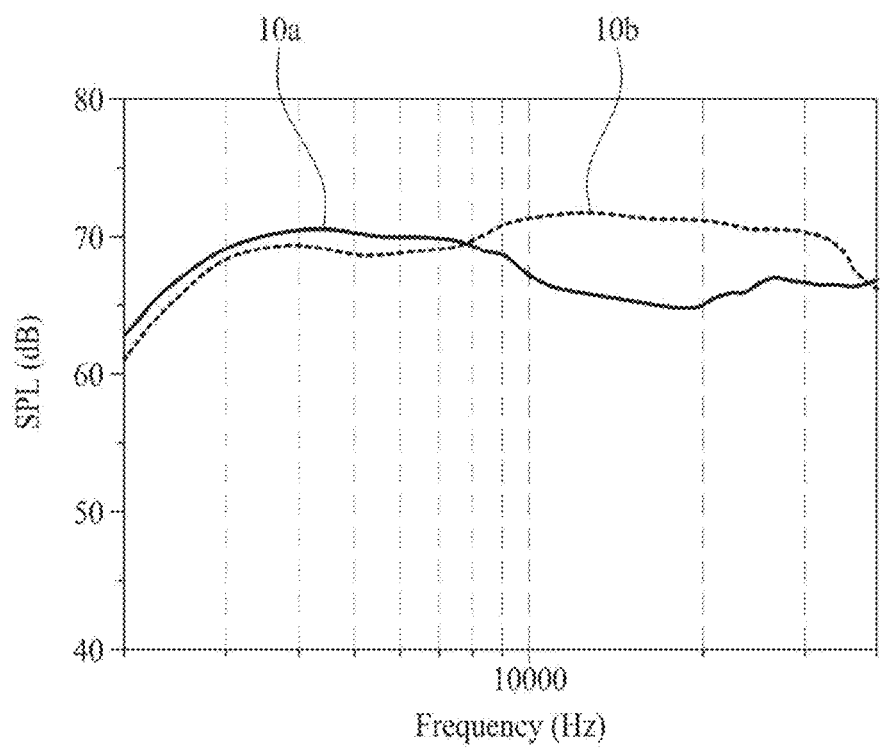
FIG. 17 is a graph illustrating a sound pressure level of the vibration plate shown in FIGS. 15 and 16.

FIG. 17 is a graph illustrating a sound pressure level of the display apparatus shown in FIGS. 15 and 16.

In FIG. 17, the x-axis is frequency in hertz (Hz), and the y-axis is sound pressure level (SPL) in decibels (dB). With reference to FIG. 17, the display apparatus 10b shown in FIG. 16 may further include the fifth and sixth sub-modules 250 and 260 in addition to the display apparatus 10a shown in FIG. 15. Accordingly, a natural frequency (or natural pitch) in the display apparatus 10a including the plurality of first portions 211, 221, 231, and 241 arranged in the same direction may be different from a natural frequency (or natural pitch) in the display apparatus 10b whose some first portions 211, 221, 231, and 241 are arranged in the different direction from that of the other first portions 251 and 261. Accordingly, the display apparatus 10a shown in FIG. 15 and the display apparatus 10b shown in FIG. 16 may receive the same input signal, and may have different frequency properties.

For example, the display apparatus 10a shown in FIG. 15 may output sound (shown as a solid line) having relatively high sound pressure in a frequency band less than 1 kHz, but may output sound having relatively low sound pressure in a frequency band more than 1 kHZ. The display apparatus 10b shown in FIG. 16 may output sound (shown as a dotted line) having similar sound pressure to that of the display apparatus 10a shown in FIG. 15 in a frequency band less than 1 kHZ, and may output sound having sound pressure much higher than that of the sound from the display apparatus 10a shown in FIG. 15 in a frequency band more than 1 kHz.

With reference to above FIG. 14, the plurality of first portions 211, 221, 231, and 241 in parallel to the long side direction of the display apparatus 10b may output sound having different frequency properties from that of the sound output from the plurality of first portions 251 and 261 in parallel to the short side direction of the display apparatus 10b. Thus, the plurality of first portions 211, 221, 231, and 241 in parallel to the long side direction of the display apparatus 10b, and the plurality of first portions 251 and 261 in parallel to the short side direction of the display apparatus 10b may receive the same input signal, and may have different frequency properties. Accordingly, the display apparatus according to an embodiment of the present disclosure may include the plurality of sub-modules 210, 220, 230, 240, 250, and 260 including the plurality of first portions 211, 221, 231, 241, 251 and 261 arranged in the different directions so that it may be possible to improve flatness of the sound pressure by complementing the frequency properties of the sound pressure.

Figure 18:
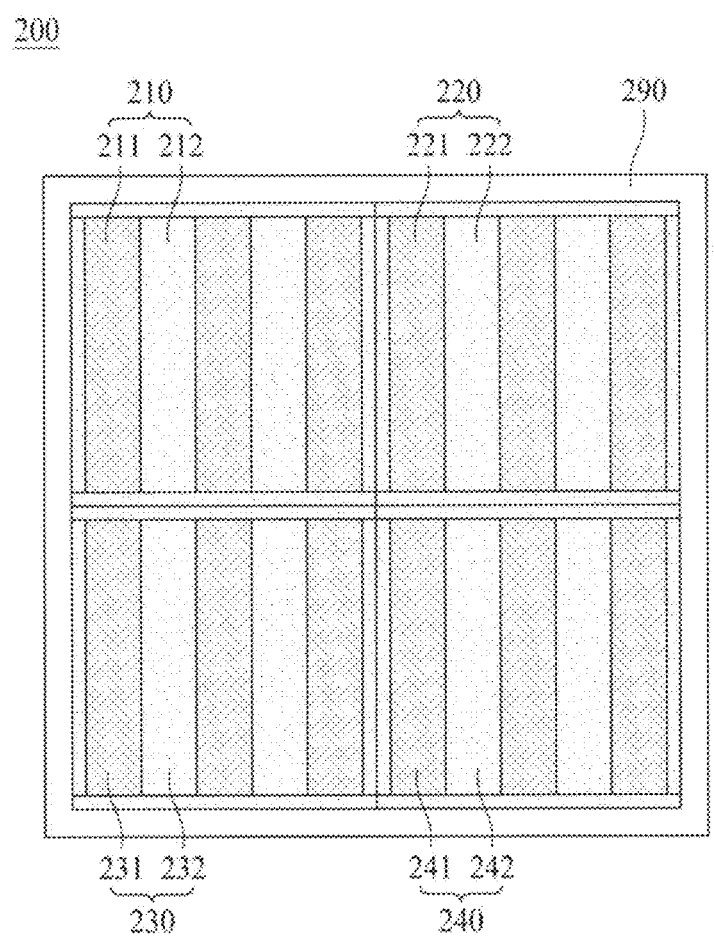
FIG. 18 is a plane view illustrating a sixth embodiment of a vibration module in the display apparatus according to an embodiment of the present disclosure.

FIG. 18 is a plane view illustrating a sixth embodiment of a vibration module in the display apparatus according to an embodiment of the present disclosure.

With reference to FIG. 18, at least one vibration module 200 may include a piezoelectric composite layer (PCL), wherein the piezoelectric composite layer (PCL) may include first to fourth sub-modules 210, 220, 230, and 240. An arrangement direction of the plurality of first portions 211, 221, 231, and 241 in each of the first to fourth sub-modules 210, 220, 230, and 240 may be identical to that of the first embodiment of the vibration module 200 shown in FIG. 6.

In the display apparatus according to an embodiment of the present disclosure, the vibration module according to the sixth embodiment may further include a plate 290 in addition to the vibration module 200 according to the first embodiment. The plate 290 may be between the display panel 100 and at least one vibration module 200. According to an embodiment, the plate 290 may be connected to the display panel 100 and at least one vibration module 200, e.g., by an adhesion member. The plate 290 may transmit the vibration of the vibration module 200 to the display panel 100. Thus, the plate 290 may reduce a resonance frequency of the display panel 100 with the vibration module 200 attached thereto by increasing a mass of the vibration module 200 so that it may be possible to lower the lowest-pitched sound range (or lowest-pitched sound reproduction frequency) enabling the reproduction of the display panel 100 with the vibration module 200 attached thereto, thereby improving the sound pressure of the low-pitched sound reproduction band and expanding the reproduction frequency band. Accordingly, the display apparatus 10 according to an embodiment of the present disclosure may include the vibration module 200 having the plate 290, to thereby improve flatness of the sound pressure.

For example, the plate 290 may include a material including one or more of: stainless steel, aluminum (Al), a magnesium (Mg) alloy, a magnesium lithium alloy, an aluminum alloy, and polycarbonate (PC), but embodiments are not limited to these materials. As a result, the display apparatus 10 according to an embodiment of the present disclosure may realize the increased vibration area of the display panel 100 and the improved stereophonic sound effect by the plurality of first portions 211, 221, 231, and 241 arranged in the same direction, and may improve flatness of the sound pressure by expanding the reproduction frequency band through the use of plate 290.

Figure 19:
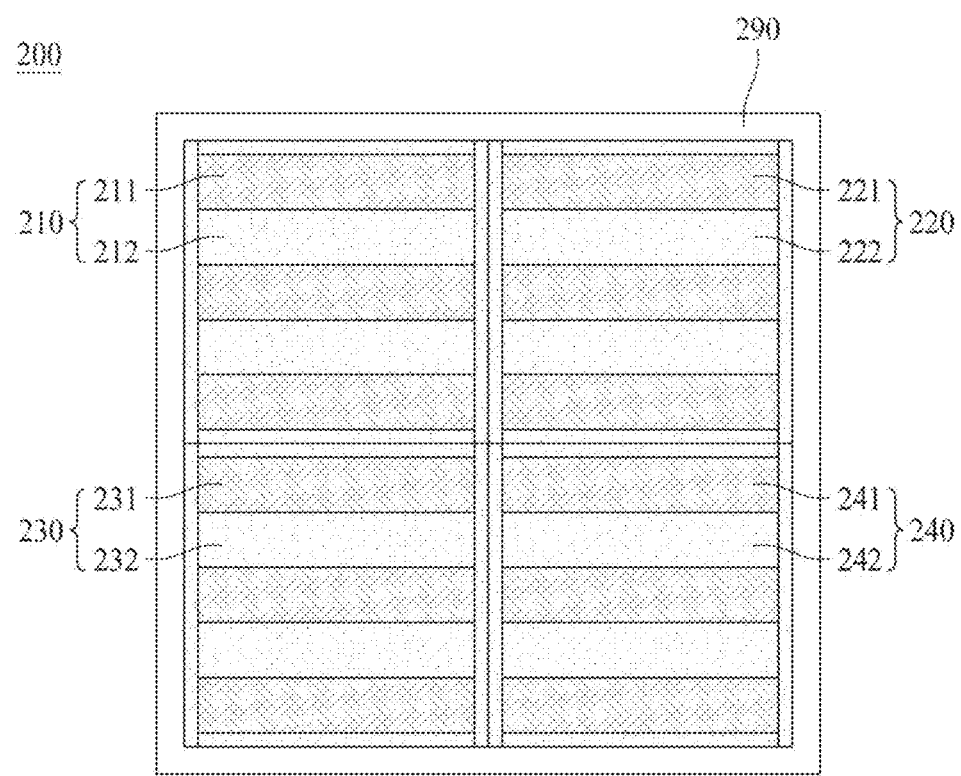
FIG. 19 is a plane view illustrating a seventh embodiment of a vibration module in the display apparatus according to an embodiment of the present disclosure.

FIG. 19 is a plane view illustrating a seventh embodiment of a vibration module in the display apparatus according to an embodiment of the present disclosure.

With reference to FIG. 19, at least one vibration module 200 may include a piezoelectric composite layer (PCL), wherein the piezoelectric composite layer (PCL) may include first to fourth sub-modules 210, 220, 230, and 240. An arrangement direction of the plurality of first portions 211, 221, 231, and 241 in each of the first to fourth sub-modules 210, 220, 230, and 240 may be identical to that of the second embodiment of the vibration module 200 shown in FIG. 8.

In the display apparatus according to an embodiment of the present disclosure, the vibration module according to the seventh embodiment may further include a plate 290 in addition to the vibration module 200 according to the second embodiment. The plate 290 may be between the display panel 100 and at least one vibration module 200. The plate 290 may reduce a resonance frequency of the display panel 100 with the vibration module 200 attached thereto by increasing a mass of the vibration module 200 so that it may be possible to lower the lowest-pitched sound range (or lowest-pitched sound reproduction frequency) enabling the reproduction of the display panel 100 with the vibration module 200 attached thereto, thereby improving the sound pressure of the low-pitched sound reproduction band and expanding the reproduction frequency band. Accordingly, the display apparatus 10 according to an embodiment of the present disclosure may include the vibration module 200 including the plate 290, to thereby improve flatness of the sound pressure. As a result, the display apparatus 10 according to an embodiment of the present disclosure may realize the increased vibration area of the display panel 100 and the improved stereophonic sound effect by the plurality of first portions 211, 221, 231, and 241 arranged in the same direction, and may improve flatness of the sound pressure by expanding the reproduction frequency band through the use of plate 290.

Figure 20:
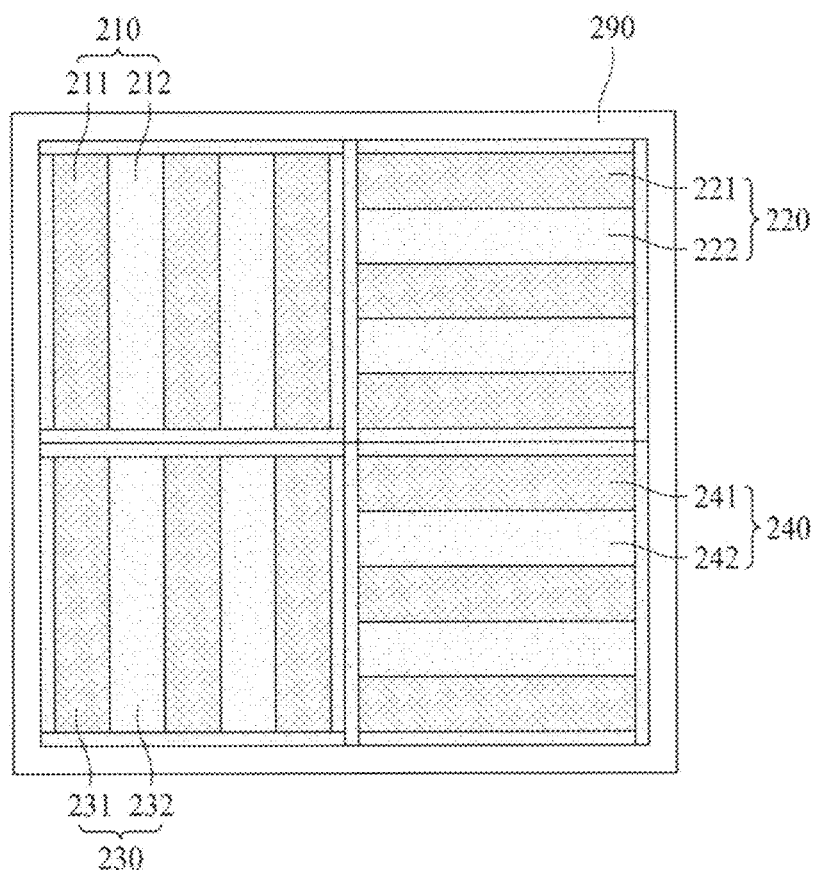
FIG. 20 is a plane view illustrating an eighth embodiment of a vibration module in the display apparatus according to an embodiment of the present disclosure.

FIG. 20 is a plane view illustrating an eighth embodiment of a vibration module in the display apparatus according to an embodiment of the present disclosure.

With reference to FIG. 20, at least one vibration module 200 may include a piezoelectric composite layer (PCL), wherein the piezoelectric composite layer (PCL) may include first to fourth sub-modules 210, 220, 230, and 240. An arrangement direction of the plurality of first portions 211, 221, 231, and 241 in each of the first to fourth sub-modules 210, 220, 230, and 240 may be identical to that of the third embodiment of the vibration module 200 shown in FIG. 9.

In the display apparatus according to an embodiment of the present disclosure, the vibration module according to the eighth embodiment may further include a plate 290 in addition to the vibration module 200 according to the third embodiment. The plate 290 may be between the display panel 100 and at least one vibration module 200. The plate 290 may reduce a resonance frequency of the display panel 100 with the vibration module 200 attached thereto by increasing a mass of the vibration module 200 so that it may be possible to lower the lowest-pitched sound range (or lowest-pitched sound reproduction frequency) enabling the reproduction of the display panel 100 with the vibration module 200 attached thereto, thereby improving the sound pressure of the low-pitched sound reproduction band and expanding the reproduction frequency band. Accordingly, the display apparatus 10 according to an embodiment of the present disclosure may include the vibration module 200 having the plate 290, to thereby improve flatness of the sound pressure.

As a result, the display apparatus 10 according to an embodiment of the present disclosure may include the plurality of first portions 211, 221, 231, and 241 arranged in the different directions so that it may be possible to improve flatness of the sound pressure by complementing the frequency properties of the sound pressure in each of the plurality of sub-modules 210, 220, 230, and 240. Also, the display apparatus 10 according to an embodiment of the present disclosure may further include the plate 290 so that it may be possible to improve flatness of the sound pressure by lowering the lowest-pitched sound reproduction frequency and expanding the reproduction frequency band.

Figure 21:
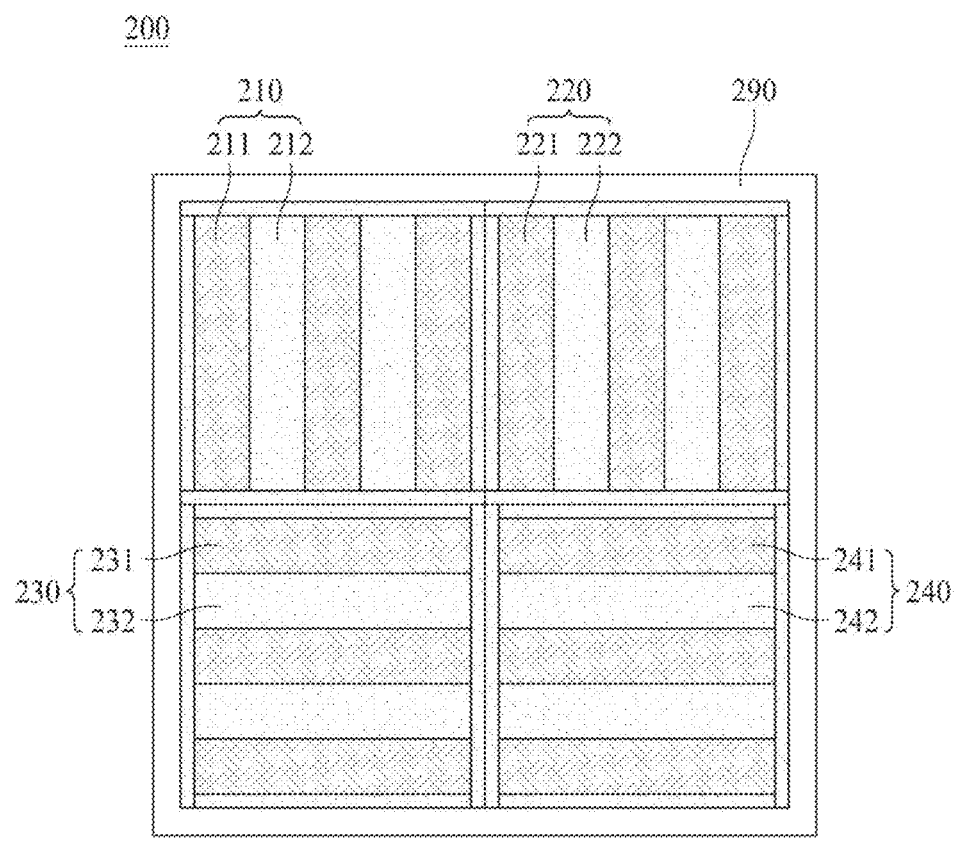
FIG. 21 is a plane view illustrating a ninth embodiment of a vibration module in the display apparatus according to an embodiment of the present disclosure.

FIG. 21 is a plane view illustrating a ninth embodiment of a vibration module in the display apparatus according to an embodiment of the present disclosure.

With reference to FIG. 21, at least one vibration module 200 may include a piezoelectric composite layer (PCL), wherein the piezoelectric composite layer (PCL) may include first to fourth sub-modules 210, 220, 230, and 240. An arrangement direction of the plurality of first portions 211, 221, 231, and 241 in each of the first to fourth sub-modules 210, 220, 230, and 240 may be identical to that of the fourth embodiment of the vibration module 200 shown in FIG. 10.

In the display apparatus according to an embodiment of the present disclosure, the vibration module according to the ninth embodiment may further include a plate 290 in addition to the vibration module 200 according to the fourth embodiment. The plate 290 may be between the display panel 100 and at least one vibration module 200. The plate 290 may reduce a resonance frequency of the display panel 100 with the vibration module 200 attached thereto by increasing a mass of the vibration module 200 so that it may be possible to lower the lowest-pitched sound range (or lowest-pitched sound reproduction frequency) enabling the reproduction of the display panel 100 with the vibration module 200 attached thereto, thereby improving the sound pressure of the low-pitched sound reproduction band and expanding the reproduction frequency band. Accordingly, the display apparatus 10 according to an embodiment of the present disclosure may include the vibration module 200 having the plate 290, to thereby improve flatness of the sound pressure.

As a result, the display apparatus 10 according to an embodiment of the present disclosure may include the plurality of first portions 211, 221, 231, and 241 arranged in the different directions so that it may be possible to improve flatness of the sound pressure by complementing the frequency properties of the sound pressure in each of the plurality of sub-modules 210, 220, 230, and 240. Also, the display apparatus 10 according to an embodiment of the present disclosure may further include the plate 290 so that it may be possible to improve flatness of the sound pressure by lowering the lowest-pitched sound reproduction frequency and expanding the reproduction frequency band.

Figure 22:
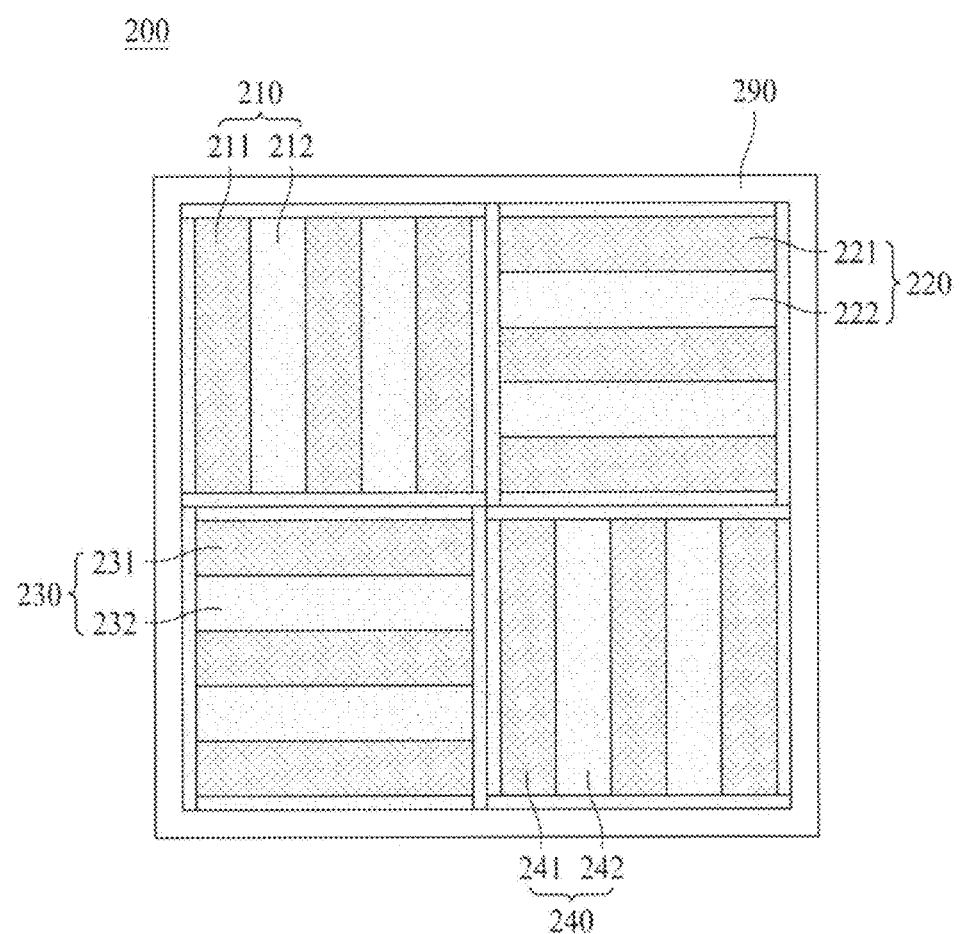
FIG. 22 is a plane view illustrating a tenth embodiment of a vibration module in the display apparatus according to an embodiment of the present disclosure.

FIG. 22 is a plane view illustrating a tenth embodiment of a vibration module in the display apparatus according to an embodiment of the present disclosure.

With reference to FIG. 22, at least one vibration module 200 may include a piezoelectric composite layer (PCL), wherein the piezoelectric composite layer (PCL) may include first to fourth sub-modules 210, 220, 230, and 240. An arrangement direction of the plurality of first portions 211, 221, 231, and 241 in each of the first to fourth sub-modules 210, 220, 230, and 240 may be identical to that of the fifth embodiment of the vibration module 200 shown in FIG. 11.

In the display apparatus according to an embodiment of the present disclosure, the vibration module according to the tenth embodiment may further include a plate 290 in addition to the vibration module 200 according to the fifth embodiment. The plate 290 may be between the display panel 100 and at least one vibration module 200. The plate 290 may reduce a resonance frequency of the display panel 100 with the vibration module 200 attached thereto by increasing a mass of the vibration module 200 so that it may be possible to lower the lowest-pitched sound range (or lowest-pitched sound reproduction frequency) enabling the reproduction of the display panel 100 with the vibration module 200 attached thereto, thereby improving the sound pressure of the low-pitched sound reproduction band and expanding the reproduction frequency band. Accordingly, the display apparatus 10 according to an embodiment of the present disclosure may include the vibration module 200 including the plate 290, to thereby improve flatness of the sound pressure.

As a result, the display apparatus 10 according to an embodiment of the present disclosure may include the plurality of first portions 211, 221, 231, and 241 arranged in the different directions so that it may be possible to improve flatness of the sound pressure by complementing the frequency properties of the sound pressure in each of the plurality of sub-modules 210, 220, 230, and 240. Also, the display apparatus 10 according to an embodiment of the present disclosure may further include the plate 290 so that it may be possible to improve flatness of the sound pressure by lowering the lowest-pitched sound reproduction frequency and expanding the reproduction frequency band.

Figure 23:
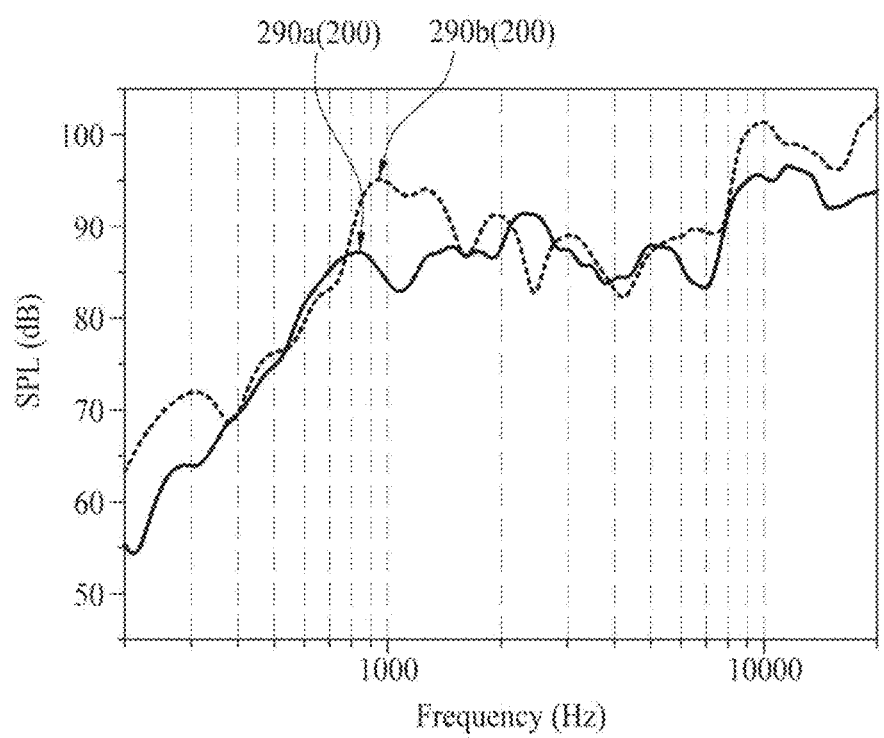
FIG. 23 is a graph illustrating a sound pressure level in accordance with a structure of a plate in the vibration module shown in FIG. 18.

FIG. 23 is a graph illustrating a sound pressure level in accordance with a structure of the plate in the vibration module shown in FIG. 18.

In FIG. 23, the x-axis is frequency in hertz (Hz), and the y-axis is sound pressure level (SPL) in decibels (dB). With reference to FIG. 23, the plate 290 may be between the display panel 100 and at least one vibration module 200. The plate 290 may reduce a resonance frequency of the display panel 100 with the vibration module 200 attached thereto by increasing a mass of the vibration module 200 so that it may be possible to lower the lowest-pitched sound range (or lowest-pitched sound reproduction frequency) enabling the reproduction of the display panel 100 with the vibration module 200 attached thereto, thereby improving the sound pressure of the low-pitched sound reproduction band and expanding the reproduction frequency band. Accordingly, the display apparatus 10 according to an embodiment of the present disclosure may include the vibration module 200 having the plate 290, to thereby improve flatness of the sound pressure.

For example, a first plate 290a may have a first thickness, and may include aluminum (Al). A second plate 290b may have a second thickness that may be two times as large as the first thickness, and may include polycarbonate (PC).

Thus, the second plate 290b may improve a mass of the vibration module 200 in comparison to the first plate 290a, and may lower a resonance frequency of the display panel 100 with the vibration module 200 attached thereto. Thus, as the mass of the vibration module 200 increases, the display apparatus 10 according to an embodiment of the present disclosure may lower the lowest-pitched sound reproduction frequency, and may expand the reproduction frequency band. A sound output using the first plate 290a is shown as a solid line, and a sound output using the second plate 290b is shown as a dotted line.

Figure 24:
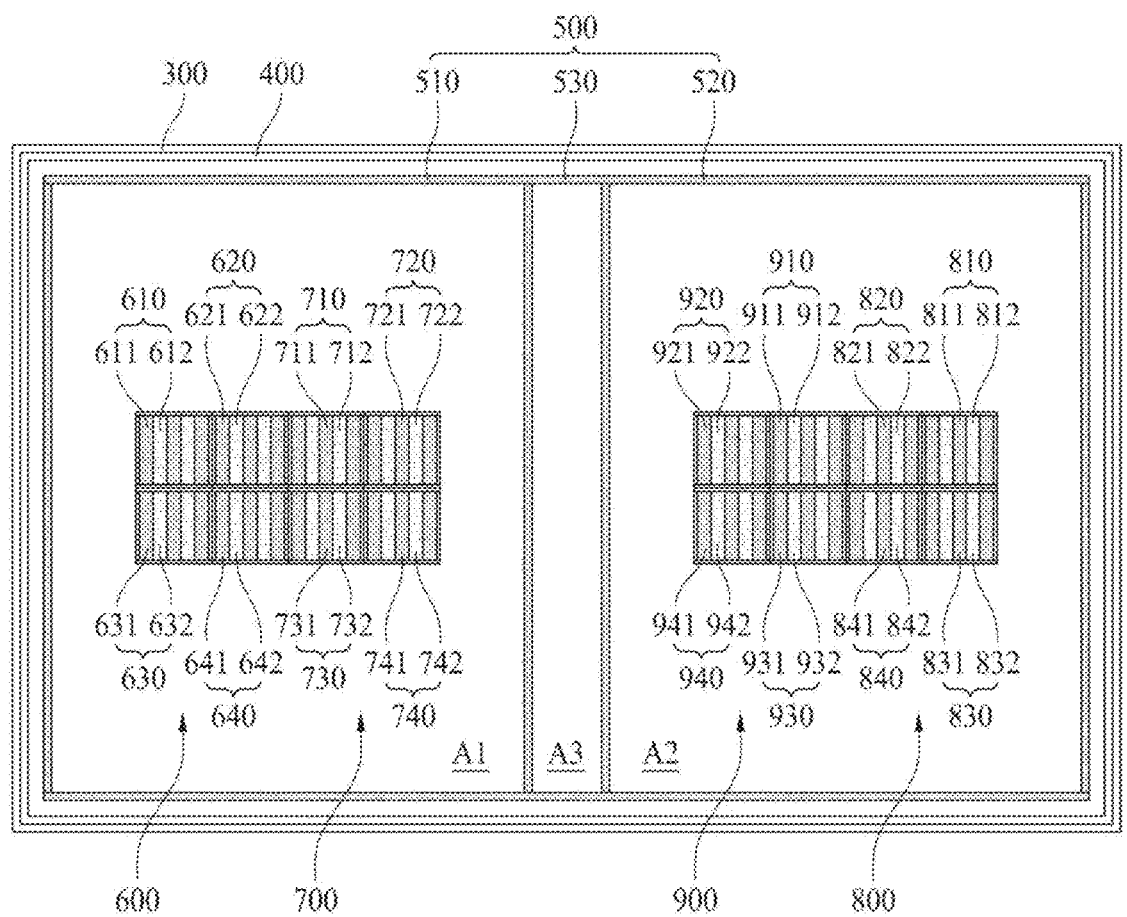
FIG. 24 is a plane view illustrating a first embodiment of a plurality of vibration modules in a display apparatus according to another embodiment of the present disclosure.

FIG. 24 is a plane view illustrating a first embodiment of a plurality of vibration modules in a display apparatus according to another embodiment of the present disclosure.

With reference to FIG. 24, a display panel 100 may include first to third areas (A1, A2, A3). For example, the first area (A1) of the display panel 100 may correspond to a left-sided area, the second area (A2) may correspond to a right-sided area, and the third area (A3) may correspond to a central area. The first area and the second area (A1, A2) may be bilaterally symmetric with respect to the central portion of the display panel 100 or the third area (A3).

The plurality of vibration modules may be on a rear surface of the display panel 100, and may vibrate the first area and the second area (A1, A2) of the display panel 100. According to an embodiment, the plurality of vibration modules may include first to fourth vibration modules 600, 700, 800, and 900. Each of the first to fourth vibration modules 600, 700, 800, and 900 may include a piezoelectric composite layer (PCL) including a plurality of sub-modules, a first electrode layer, and a second electrode layer.

The piezoelectric composite layer (PCL) of the first vibration module 600 may include first to fourth sub-modules 610, 620, 630, and 640. Each of the first to fourth sub-modules 610, 620, 630, and 640 may include a plurality of first portions 611, 621, 631, and 641 including a piezoelectric characteristic, and a plurality of second portions 612, 622, 632, and 642 having flexibility.

The piezoelectric composite layer (PCL) of the second vibration module 700 may include first to fourth sub-modules 710, 720, 730, and 740. Each of the first to fourth sub-modules 710, 720, 730, and 740 may include a plurality of first portions 711, 721, 731, and 741 including a piezoelectric characteristic, and a plurality of second portions 712, 722, 732 and 742 having flexibility.

The piezoelectric composite layer (PCL) of the third vibration module 800 may include first to fourth sub-modules 810, 820, 830, and 840. Each of the first to fourth sub-modules 810, 820, 830, and 840 may include a plurality of first portions 811, 821, 831, and 841 including a piezoelectric characteristic, and a plurality of second portions 812, 822, 832, and 842 having flexibility.

The piezoelectric composite layer (PCL) of the fourth vibration module 900 may include first to fourth sub-modules 910, 920, 930, and 940. Each of the first to fourth sub-modules 910, 920, 930, and 940 may include a plurality of first portions 911, 921, 931, and 941 including a piezoelectric characteristic, and a plurality of second portions 912, 922, 932, and 942 having flexibility.

The first vibration module 600 and the second vibration module 700 may overlap the first area (A1) of the display panel 100. The first vibration module 600 and the second vibration module 700 may vibrate the first area (A1) of the display panel 100, whereby the first area (A1) of the display panel 100 may be used as the vibration plate, to thereby generate sound (SW) or haptic feedback.

The third vibration module 800 and the fourth vibration module 900 may overlap the second area (A2) of the display panel 100. The third vibration module 800 and the fourth vibration module 900 may vibrate the second area (A2) of the display panel 100, whereby the second area (A2) of the display panel 100 may be used as the vibration plate, to thereby generate sound (SW) or haptic feedback.

According to an embodiment, the display apparatus 10 may include the first and second vibration modules 600 and 700 in the left-sided area of the rear surface of the display panel 100, and the third and fourth vibration modules 800 and 900 in the right-sided area of the rear surface of the display panel 100 so that it may be possible to output stereo sound of a two-channel type by separating left-sided sound and right-sided sound from each other. Accordingly, the first and second vibration modules 600 and 700 may output the left-sided sound, and the third and fourth vibration modules 800 and 900 may output the right-sided sound.

According to an embodiment, the first and second vibration modules 600 and 700 and the third and fourth vibration modules 800 and 900 may be bilaterally symmetric with respect to the central portion of the display panel 100. For example, an arrangement direction in the plurality of first portions 611, 621, 631, and 641 in each of the first to fourth sub-modules 610, 620, 630, and 640 included in the first vibration module 600 may be identical to an arrangement direction in the plurality of first portions 811, 821, 831, and 841 in each of the first to fourth sub-modules 810, 820, 830, and 840 included in the third vibration module 800. An arrangement direction in the plurality of first portions 711, 721, 731, and 741 in each of the first to fourth sub-modules 710, 720, 730, and 740 included in the second vibration module 700 may be identical to an arrangement direction in the plurality of first portions 911, 921, 931, and 941 in each of the first to fourth sub-modules 910, 920, 930, and 940 included in the fourth vibration module 900. Thus, hereinafter, a structure of the first and second vibration modules 600 and 700 will be described, and a structure of the third and fourth vibration modules 800 and 900 will be omitted.

For example, the first sub-module 610 and 710 in each of the first and second vibration modules 600 and 700 may be in a left-sided upper portion of the piezoelectric composite layer (PCL), and the second sub-module 620 and 720 in each of the first and second vibration modules 600 and 700 may be in a right-sided upper portion of the piezoelectric composite layer (PCL). The third sub-module 630 and 730 in each of the first and second vibration modules 600 and 700 may be in a left-sided lower portion of the piezoelectric composite layer (PCL), and the fourth sub-module 640 and 740 in each of the first and second vibration modules 600 and 700 may be in a right-sided lower portion of the piezoelectric composite layer (PCL).

The first vibration module 600 may overlap the first area (A1) of the display panel 100, and the second vibration module 700 may be adjacent to the first vibration module 600 in the first direction (X) on the plane. The plurality of first portions 611, 621, 631, and 641 in the first to fourth sub-modules 610, 620, 630, and 640 of the first vibration module 600 may extend in the second direction (Y) on the plane, and may be spaced apart from each other in the first direction (X). The plurality of first portions 711, 721, 731, and 741 in the first to fourth sub-modules 710, 720, 730, and 740 of the second vibration module 700 may extend in the second direction (Y) on the plane, and may be spaced apart from each other in the first direction (X).

Accordingly, the first and second vibration modules 600 and 700 may include the plurality of first portions 611, 621, 631, 641, 711, 721, 731, and 741 arranged in the same direction so that it may be possible to realize the same piezoelectric characteristic and complement the vibration generated in another sub-module. As a result, the vibration module 200 according to an embodiment of the present disclosure may include the plurality of first portions 611, 621, 631, 641, 711, 721, 731, and 741 arranged in the same direction so that it may be possible to increase a vibration area of the display panel 100 and to realize a stereophonic sound effect. Also, the display apparatus according to an embodiment of the present disclosure may further include a plurality of sub-modules additionally arranged in the first direction (X) or second direction (Y) of the vibration module 200, whereby it may be possible to realize a large-sized vibration module for a large-sized display apparatus.

According to an embodiment, the display apparatus 10 may further include a partition 500 surrounding the plurality of vibration modules. The partition 500 may include a first partition 510 surrounding the first area (A1) of the display panel 100, a second partition 520 surrounding the second area (A2) of the display panel 100, and a third partition 530 surrounding the third area (A3) of the display panel 100.

The first partition 510 may surround the first and second vibration modules 600 and 700, while being apart from the first and second vibration modules 600 and 700. The second partition 520 may surround the third and fourth vibration modules 800 and 900, while being apart from the third and fourth vibration modules 800 and 900. The third partition 530 may be between the first partition 510 and the second partition 520. Accordingly, the first partition 510 may focus the vibration generated in the first and second vibration modules 600 and 700 on the first area (A1) of the display panel 100, the second partition 520 may focus the vibration generated in the third and fourth vibration modules 800 and 900 on the second area (A2) of the display panel 100, and the third partition 530 may reduce, prevent, or block the interference between the vibration generated in the first and second vibration modules 600 and 700 and the vibration generated in the third and fourth vibration modules 800 and 900.

Figure 25:
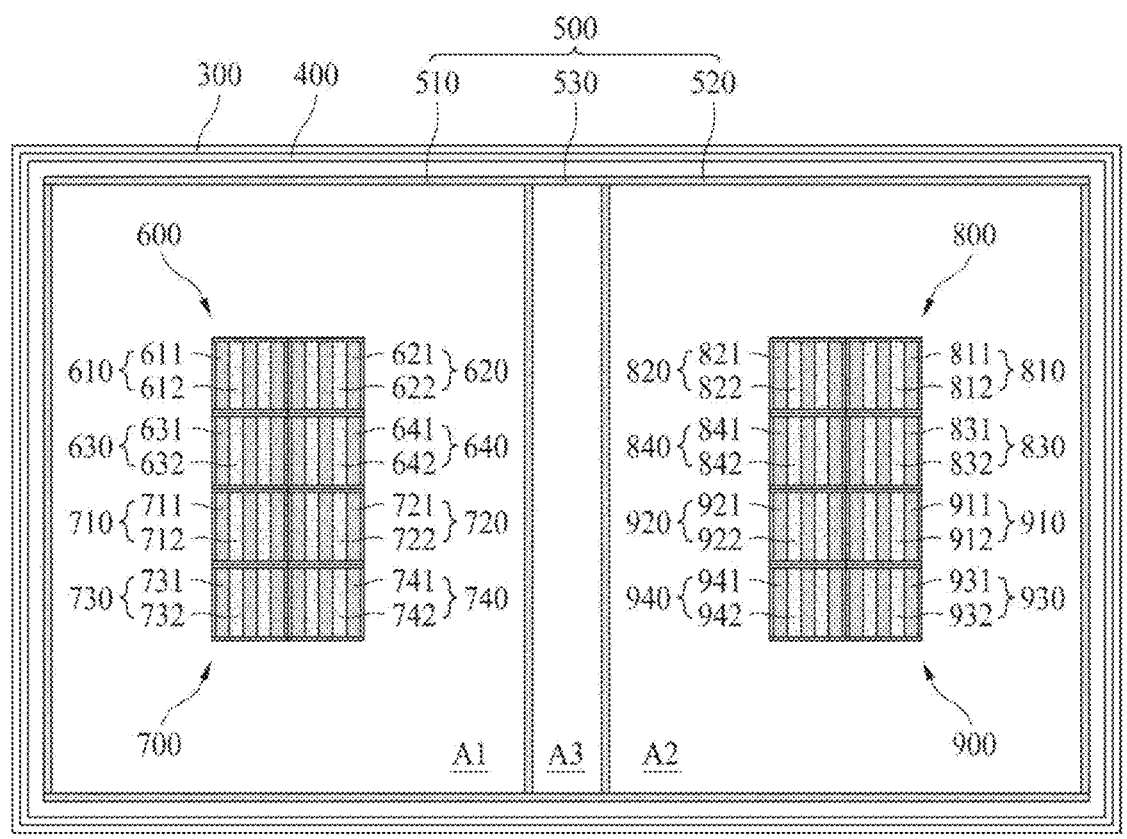
FIG. 25 is a plane view illustrating a second embodiment of a plurality of vibration modules in a display apparatus according to another embodiment of the present disclosure.

FIG. 25 is a plane view illustrating a second embodiment of a plurality of vibration modules in a display apparatus according to another embodiment of the present disclosure.

Herein, except for an arrangement of first and second vibration modules, the display apparatus shown in FIG. 25 is identical in structure to the display apparatus shown in FIG. 24, whereby a description for the same parts will be briefly shown or omitted.

With reference to FIG. 25, a first vibration module 600 may overlap a first area (A1) of a display panel 100, and a second vibration module 700 may be adjacent to the first vibration module 600 in the second direction (Y) on the plane. A plurality of first portions 611, 621, 631, and 641 in first to fourth sub-modules 610, 620, 630, and 640 of the first vibration module 600 may extend in the second direction (Y) on the plane, and may be spaced apart from each other in the first direction (X). A plurality of first portions 711, 721, 731, and 741 in first to fourth sub-modules 710, 720, 730, and 740 of the second vibration module 700 may extend in the second direction (Y) on the plane, and may be spaced apart from each other in the first direction (X).

Accordingly, the first and second vibration modules 600 and 700 may include the plurality of first portions 611, 621, 631, 641, 711, 721, 731, and 741 arranged in the same direction so that it may be possible to realize the same piezoelectric characteristic and complement the vibration generated in another sub-module. As a result, the vibration module 200 according to an embodiment of the present disclosure may include the plurality of first portions 611, 621, 631, 641, 711, 721, 731, and 741 arranged in the same direction so that it may be possible to increase a vibration area of the display panel 100 and to realize a stereophonic sound effect. Also, the display apparatus according to an embodiment of the present disclosure may further include a plurality of sub-modules additionally arranged in the first direction (X) or second direction (Y) of the vibration module 200, whereby it may be possible to realize a large-sized vibration module for a large-sized display apparatus.

Figure 26:
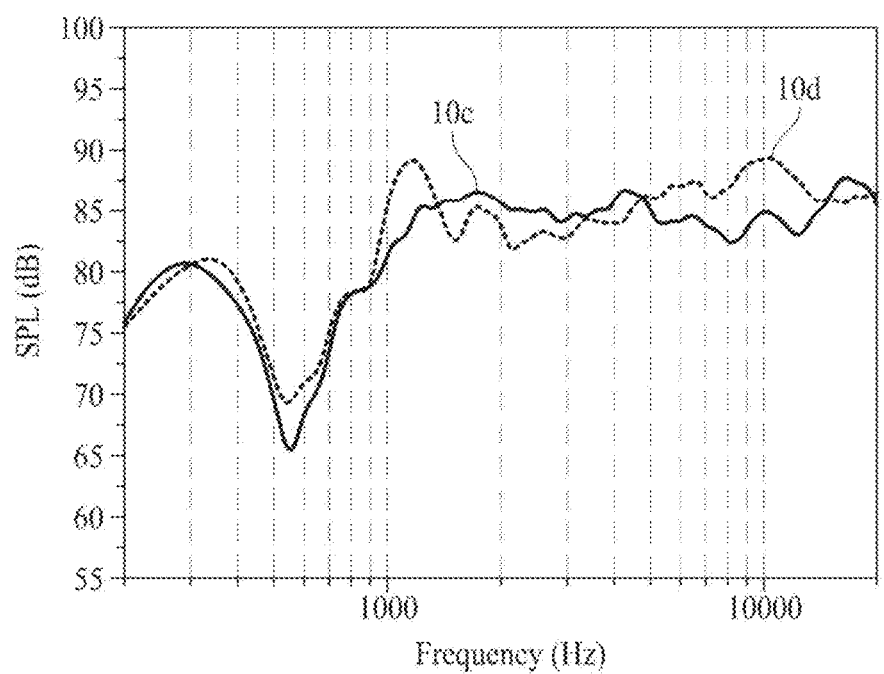
FIG. 26 is a graph illustrating a sound pressure level of the display apparatus shown in FIGS. 24 and 25.

FIG. 26 is a graph illustrating a sound pressure level of the display apparatus shown in FIGS. 24 and 25.

In FIG. 26, the x-axis is frequency in hertz (Hz), and the y-axis is sound pressure level (SPL) in decibels (dB). With reference to FIG. 26, an arrangement direction of the first and second vibration modules 600 and 700 in the display apparatus 10c shown in FIG. 24 is different from an arrangement direction of the first and second vibration modules 600 and 700 in the display apparatus 10d shown in FIG. 25, whereby they have different sound pressure level characteristics.

According to an embodiment, the first vibration module 600 and the second vibration module 700 may output sound such that the first area (A1) of the display panel 100 surrounded by the first partition 510 may be used as the vibration plate. Herein, the first area (A1) of the display panel 100 surrounded by the first partition 510 may include a short side parallel to the first direction (X) on the plane, and a long side parallel to the second direction (Y) on the plane.

For example, in the display apparatus 10c shown in FIG. 24, the first and second vibration modules 600 and 700 in parallel to the short side direction of the first area (A1) may be attached to the first area (A1) of the display panel 100 surrounded by the first partition 510. In the display apparatus 10d shown in FIG. 25, the first and second vibration modules 600 and 700 in parallel to the long side direction of the first area (A1) may be attached to the first area (A1) of the display panel 100 surrounded by the first partition 510.

In the display apparatus 10c shown in FIG. 24, the long side of the first area (A1) of the display panel 100 may be parallel to the second direction (Y), and the first and second vibration modules 600 and 700 may be parallel to the short side direction of the first area (A1) of the display panel 100. In the display apparatus 10d shown in FIG. 25, the long side of the first area (A1) of the display panel 100 may be parallel to the second direction (Y), and the first and second vibration modules 600 and 700 may be parallel to the long side direction of the first area (A1) of the display panel 100.

Accordingly, a vibration area of the first area (A1) in the display apparatus 10c shown in FIG. 24 may be relatively increased in comparison to a vibration area of the first area (A1) in the display apparatus 10d shown in FIG. 25, and flatness of the sound pressure in the display apparatus 10c shown in FIG. 24 may be more uniform. Herein, the sound pressure level characteristic of the display apparatus 10c and 10d may be determined based on the structural properties of the first area (A1) of the display panel 100 functioning as the vibration plate and the arrangement direction of the piezoelectric material in the first and second vibration modules 600 and 700. As a result, in a frequency band of 1 kHz or more than 1 kHz, flatness of the sound pressure in the display apparatus 10c shown in FIG. 24 may be more uniform in comparison to flatness of the sound pressure in the display apparatus 10d shown in FIG. 25. A sound output using the display apparatus 10c shown is shown as a solid line, and a sound output using the display apparatus 10d is shown as a dotted line.

Figure 27:
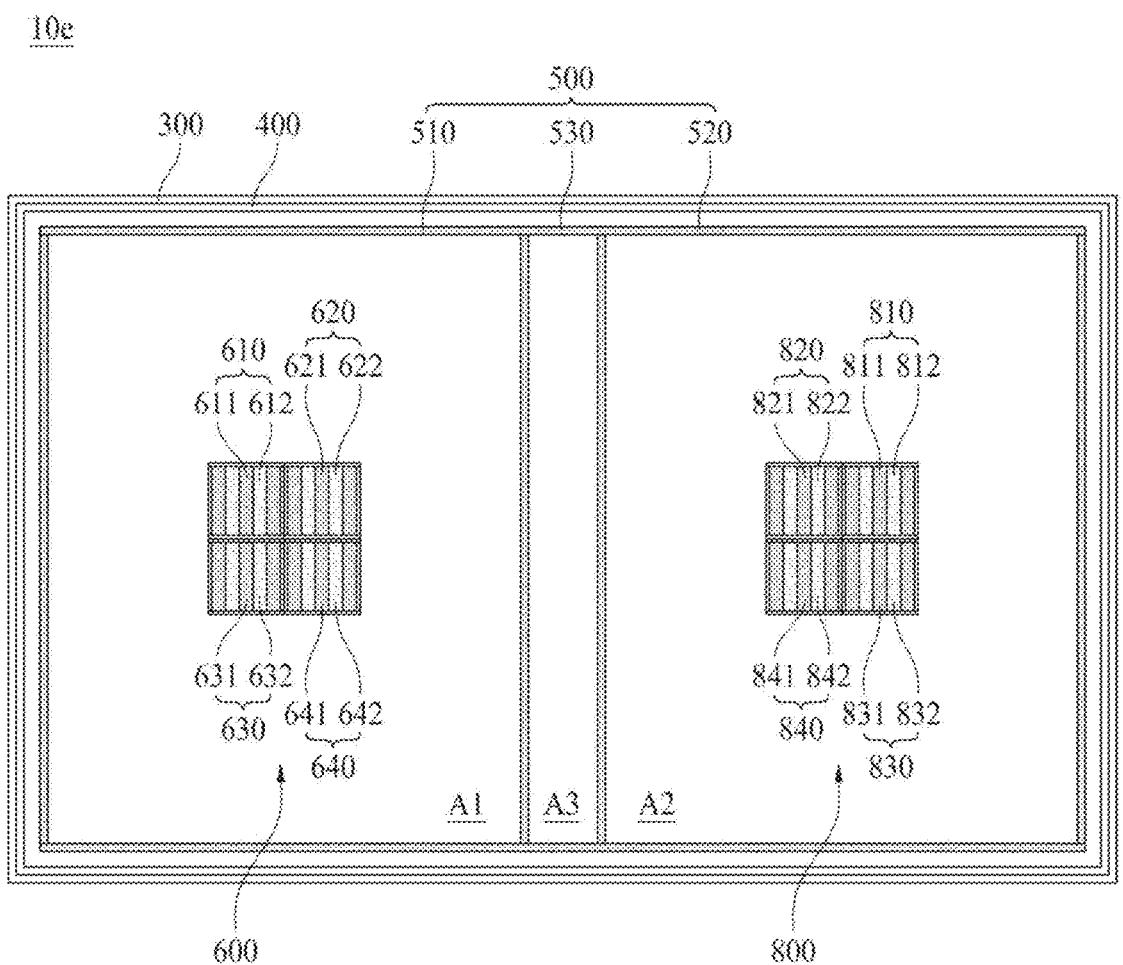
FIG. 27 is a plane view illustrating a third embodiment of a plurality of vibration modules in a display apparatus according to another embodiment of the present disclosure.

FIG. 27 is a plane view illustrating a third embodiment of a plurality of vibration modules in a display apparatus according to another embodiment of the present disclosure.

With reference to FIG. 27, a display apparatus 10e may include a first vibration module 600 overlapping a first area (A1) of a display panel 100, and a third vibration module 800 overlapping a second area (A2) of the display panel 100. A plurality of first portions 611, 621, 631, and 641 in first to fourth sub-modules 610, 620, 630, and 640 of the first vibration module 600 may extend in the second direction (Y) on the plane, and may be spaced apart from each other in the first direction (X). An arrangement direction in a plurality of first portions 811, 821, 831, and 841 of the third vibration module 800 may be identical to an arrangement direction in the plurality of first portions 611, 621, 631, and 641 of the first vibration module 600.

Figure 28:
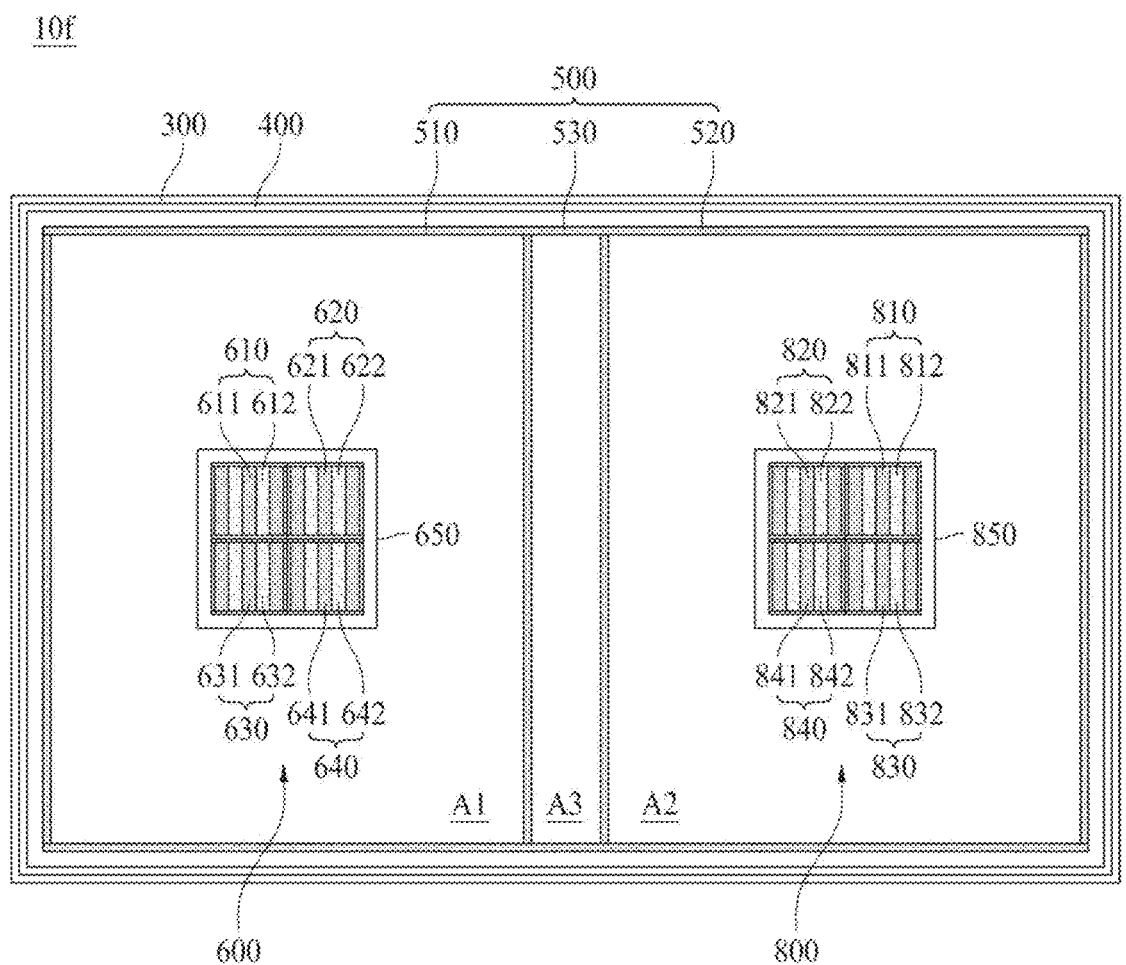
FIG. 28 is a plane view illustrating a fourth embodiment of a plurality of vibration modules in a display apparatus according to another embodiment of the present disclosure.

FIG. 28 is a plane view illustrating a fourth embodiment of a plurality of vibration modules in a display apparatus according to another embodiment of the present disclosure.

With reference to FIG. 28, a display apparatus 10f may include a first vibration module 600 overlapping a first area (A1) of a display panel 100, and a third vibration module 800 overlapping a second area (A2) of the display panel 100. The display apparatus 10f may further include plates 650 and 850 in addition to the display apparatus 10e shown in FIG. 27.

The plate 650 may be between the first area (A1) of the display panel 100 and the first vibration module 600. The plate 650 may reduce a resonance frequency of the display panel 100 with the vibration module 600 attached thereto by increasing a mass of the first vibration module 600 so that it may be possible to lower the lowest-pitched sound range (or lowest-pitched sound reproduction frequency) enabling the reproduction of the display panel 100 with the first vibration module 600 attached thereto, thereby improving the sound pressure of the low-pitched sound reproduction band and expanding the reproduction frequency band. Accordingly, the display apparatus 10f according to an embodiment of the present disclosure may include the first vibration module 600 having the plate 650, to thereby improve flatness of the sound pressure.

Figure 29:
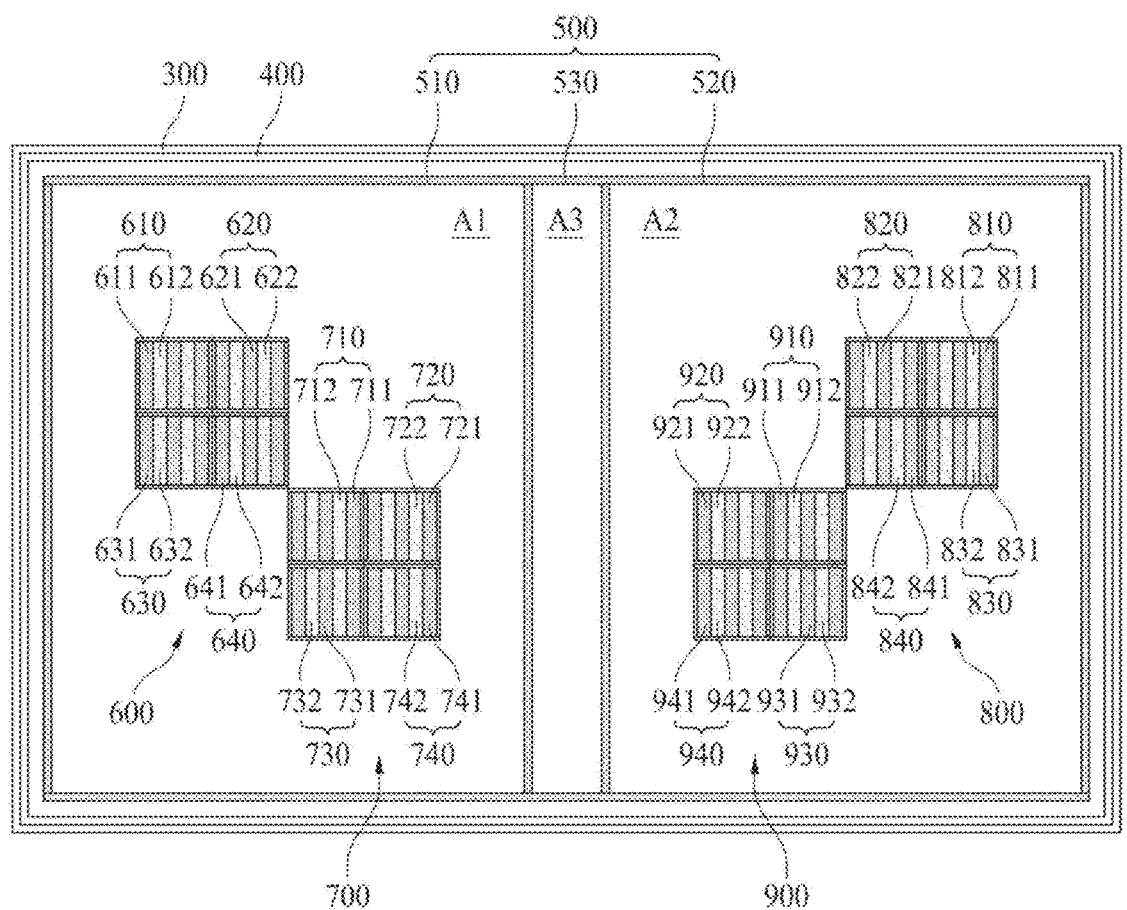
FIG. 29 is a plane view illustrating a fifth embodiment of a plurality of vibration modules in a display apparatus according to another embodiment of the present disclosure.

FIG. 29 is a plane view illustrating a fifth embodiment of a plurality of vibration modules in a display apparatus according to another embodiment of the present disclosure.

With reference to FIG. 29, a display apparatus 10g may include first and second vibration modules 600 and 700 overlapping a first area (A1) of a display panel 100, and third and fourth vibration modules 800 and 900 overlapping a second area (A2) of the display panel 100. The first vibration module 600 may overlap the first area (A1) of the display panel 100, and the second vibration module 700 may overlap the first area (A1) of the display panel 100 while being alternately or diagonally disposed with the first vibration module 600.

A plurality of first portions 611, 621, 631, and 641 in first to fourth sub-modules 610, 620, 630, and 640 of the first vibration module 600 may extend in the second direction (Y) on the plane, and may be spaced apart from each other in the first direction (X). A plurality of first portions 711, 721, 731, and 741 in first to fourth sub-modules 710, 720, 730, and 740 of the second vibration module 700 may extend in the second direction (Y) on the plane, and may be spaced apart from each other in the first direction (X). For example, a left-sided upper vertex of the first sub-module 710 of the second vibration module 700 may be in contact with a right-sided lower vertex of the fourth sub-module 640 of the first vibration module 600. According to an embodiment, the first and second vibration modules 600 and 700 may be arranged along a diagonal line of the first direction (X) and the second direction (Y), whereby it may be possible to increase the vibration area in the first area (A1) of the display apparatus 10g and to improve the sound pressure level characteristic of the display apparatus 10g.

According to an embodiment, the display apparatus 10c shown in FIG. 24 may include the first and second vibration modules 600 and 700 arranged in the first direction (X), and the display apparatus 10d shown in FIG. 25 may include the first and second vibration modules 600 and 700 arranged in the second direction (Y). Accordingly, the first and second vibration modules 600 and 700 having a parallel arrangement structure may increase the vibration area in the first area (A1) of the display panel 100, and may improve the sound pressure level characteristic of the low-pitched sound reproduction range of the display apparatuses 10c and 10d shown in FIG. 24 and FIG. 25.

The display apparatus 10g shown in FIG. 29 may include the first and second vibration modules 600 and 700 arranged in the diagonal line of the first direction (X) and the second direction (Y). In comparison to the first and second vibration modules 600 and 700 having the parallel arrangement structure, the first and second vibration modules 600 and 700 having the diagonal arrangement structure may realize more increased vibration area in the first area (A1) of the display panel 100. Thus, the display apparatus 10g shown in FIG. 29 may realize more improved sound pressure level characteristic in comparison to the display apparatuses 10d and 10d shown in FIG. 24 and FIG. 25. The diagonal arrangement structure of the first and second vibration modules 600 and 700 may have a similar efficiency in comparison to the plurality of vibration modules arranged in 2×2 structure of the first area (A1) of the display panel 100. Accordingly, the number of vibration modules provided to vibrate the first area (A1) of the display panel 100 may be reduced by half.

Figure 30:
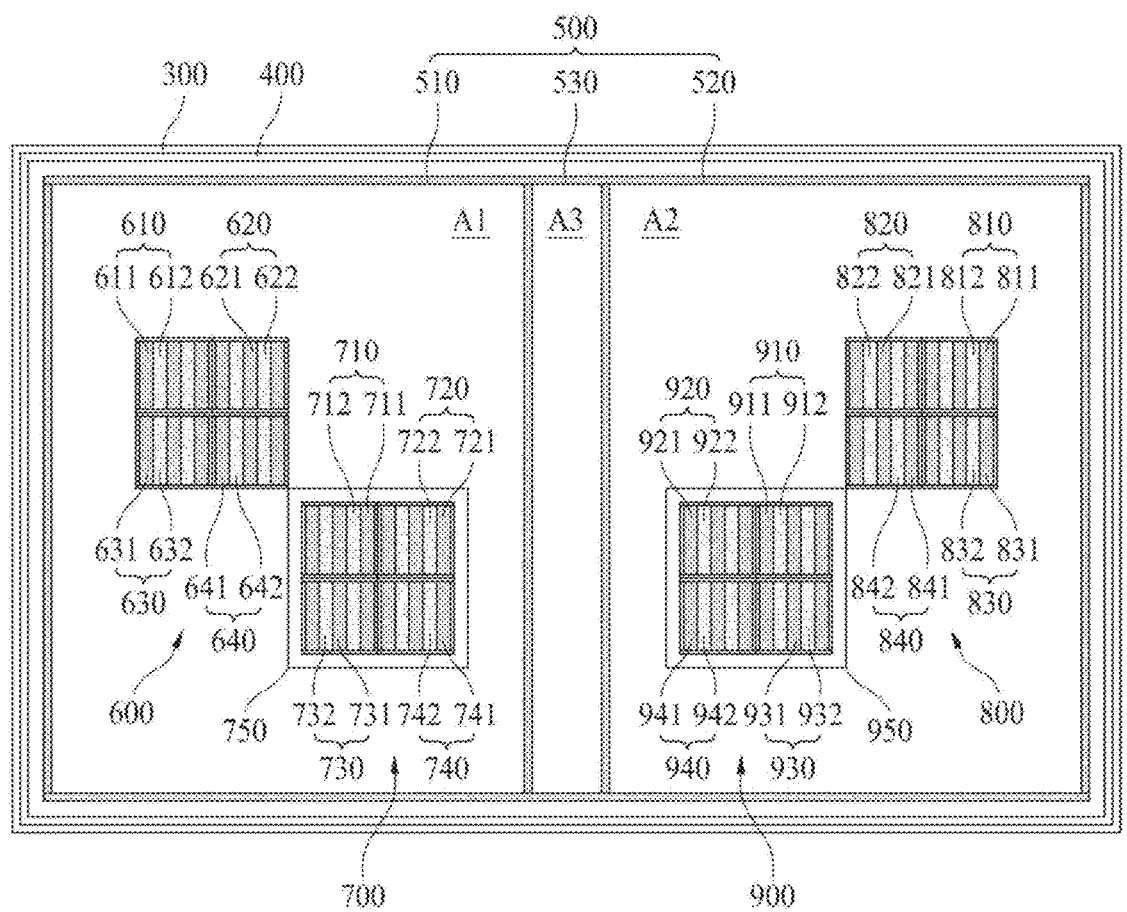
FIG. 30 is a plane view illustrating a sixth embodiment of a plurality of vibration modules in a display apparatus according to another embodiment of the present disclosure.

FIG. 30 is a plane view illustrating a sixth embodiment of a plurality of vibration modules in a display apparatus according to another embodiment of the present disclosure.

With reference to FIG. 30, a display apparatus 10h may include first and second vibration modules 600 and 700 overlapping a first area (A1) of a display panel 100, and third and fourth vibration modules 800 and 900 overlapping a second area (A2) of the display panel 100. The display apparatus 10h may further include plates 750 and 950 in addition to the display apparatus 10g shown in FIG. 29.

The plate 750 may be between the first area (A1) of the display panel 100 and the second vibration module 700. The plate 750 may reduce a resonance frequency of the display panel 100 with the second vibration module 700 attached thereto by increasing a mass of the second vibration module 700 so that it may be possible to lower the lowest-pitched sound range (or lowest-pitched sound reproduction frequency) enabling the reproduction of the display panel 100 with the second vibration module 700 attached thereto, thereby improving the sound pressure of the low-pitched sound reproduction band and expanding the reproduction frequency band.

According to an embodiment, the second vibration module 700 including the plate 750 may have a relatively increased mass, whereby the resonance frequency of the display panel 100 may be relatively reduced. The first vibration module 600 having no plate may have a relatively decreased mass, whereby the resonance frequency of the display panel 100 may be relatively increased. Thus, piezoelectric characteristic in the first vibration module 600 having no plate may be different from piezoelectric characteristic in the second vibration module 700 including the plate 750. For example, the first vibration module 600 having no plate may improve the sound pressure of high-pitched sound reproduction band, and the second vibration module 700 including the plate 750 may improve the sound pressure of low-pitched sound reproduction band. Thus, the first vibration module 600 having no plate and the second vibration module 700 including the plate 750 may receive the same input signal, and may output sound having different frequency properties. Accordingly, the display apparatus 10h according to an embodiment of the present disclosure may include the first and second vibration modules 600 and 700 having different piezoelectric characteristics so that it may be possible to improve flatness of the sound pressure by complementing the frequency properties of the sound pressure.

Figure 31:
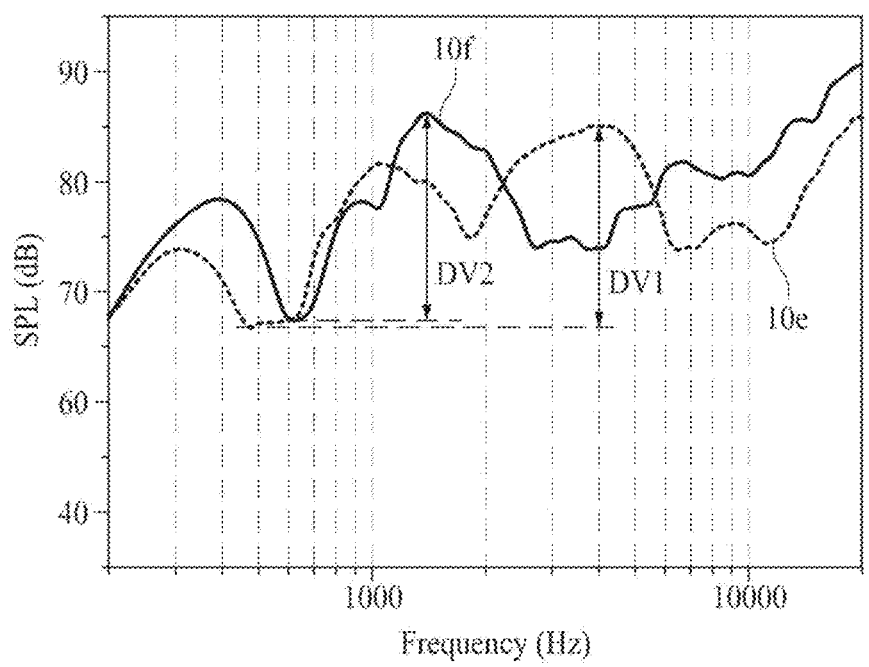
FIG. 31 is a graph illustrating a sound pressure level of the display apparatus shown in FIGS. 27 and 28.

FIG. 31 is a graph illustrating a sound pressure level of the display apparatus shown in FIGS. 27 and 28.

In FIG. 31, the x-axis is frequency in hertz (Hz), and the y-axis is sound pressure level (SPL) in decibels (dB). With reference to FIG. 31, the display apparatus 10f shown in FIG. 28 may further include the plate 650 in addition to the display apparatus 10e shown in FIG. 27, whereby the sound pressure level characteristic in the display apparatus 10f shown in FIG. 28 may be different from the sound pressure level characteristic in the display apparatus 10e shown in FIG. 27. For example, as the plate may not be included in the display apparatus 10e shown in FIG. 27, the mass of the first vibration module 600 may be relatively reduced so that it may be possible to relatively increase the resonance frequency of the display apparatus 10e. As the plate 650 may be included in the display apparatus 10f shown in FIG. 28, the mass of the first vibration module 600 may be relatively increased so that it may be possible to relatively decrease the resonance frequency of the display apparatus 10f.

According to an embodiment, the display apparatus 10e shown in FIG. 27 and the display apparatus 10f shown in FIG. 28 may receive the same input signal, and may output sound having different frequency properties. For example, the difference (DV1) between the maximum sound pressure and the minimum sound pressure in the display apparatus 10e shown in FIG. 27 may be similar to the difference (DV2) between the maximum sound pressure and the minimum sound pressure in the display apparatus 10f shown in FIG. 28. Accordingly, a piezoelectric characteristic in the display apparatus 10e shown in FIG. 27 may be different from a piezoelectric characteristic in the display apparatus 10f shown in FIG. 28 so that it may be possible to complement the frequency properties. A sound output using the display apparatus 10f is shown is shown as a solid line, and a sound output using the display apparatus 10e is shown as a dotted line.

Figure 32:
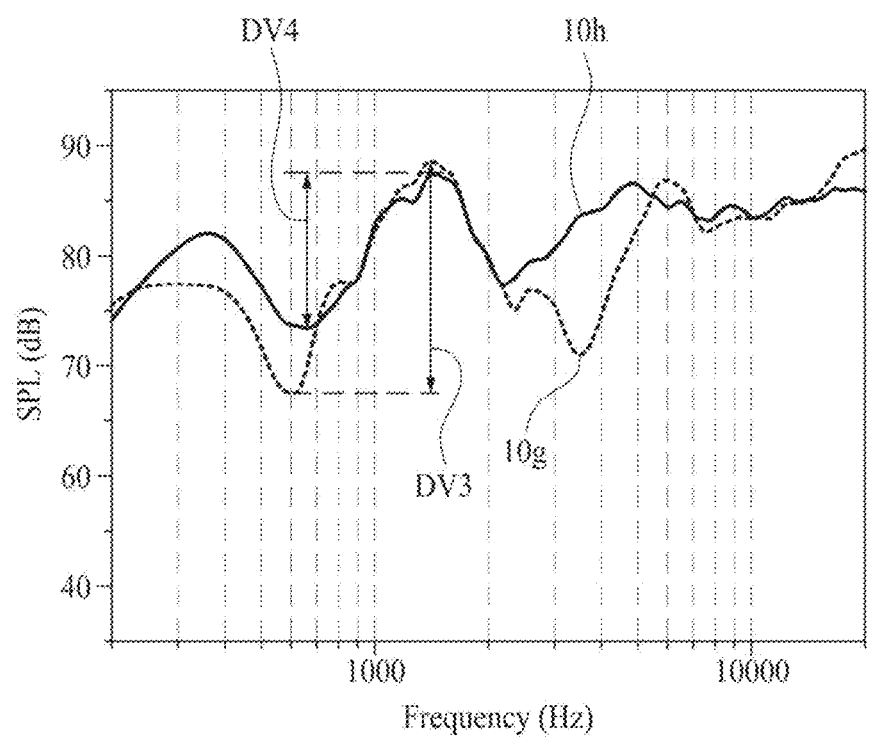
FIG. 32 is a graph illustrating a sound pressure level of the display apparatus shown in FIGS. 29 and 30.

FIG. 32 is a graph illustrating a sound pressure level of the display apparatus shown in FIGS. 29 and 30.

In FIG. 32, the x-axis is frequency in hertz (Hz), and the y-axis is sound pressure level (SPL) in decibels (dB). With reference to FIG. 32, the display apparatus 10h shown in FIG. 30 may further include the plates 750 and 950 in addition to the display apparatus 10g shown in FIG. 29, whereby the sound pressure level characteristic in the display apparatus 10h shown in FIG. 30 may be different from the sound pressure level characteristic in the display apparatus 10g shown in FIG. 29. According to an embodiment, the display apparatus 10g shown in FIG. 29 may include the first and second vibration modules 600 and 700 having the diagonal arrangement structure so that it may be possible to increase the vibration area in the first area (A1) of the display apparatus 10. Thus, the display apparatus 10g shown in FIG. 29 using a small number of vibration modules may realize a similar effect to the case using a large number of vibration modules.

For example, the display apparatus 10g shown in FIG. 29 may include the first and second vibration modules 600 and 700 having the diagonal arrangement structure so that it may be possible to improve the sound pressure in the entire frequency band in comparison to the display apparatuses 10e and 10f shown in FIGS. 27 and 28 including only one of the first vibration module 600. Thus, the display apparatus 10g shown in FIG. 29 may output sound having relatively high sound pressure and different frequency properties in comparison to that of the display apparatuses 10e and 10f shown in FIGS. 27 and 28. However, the difference (DV3) between the maximum sound pressure and the minimum sound pressure in the display apparatus 10g shown in FIG. 29 may be similar to the difference (DV1, DV2) between the maximum sound pressure and the minimum sound pressure in each of the display apparatuses 10e and 10f shown in FIGS. 27 and 28.

Thus, to output sound having relatively higher flatness in comparison to that in each of the display apparatuses 10e, 10f and 10g shown in FIGS. 27 to 29, the display apparatus 10h shown in FIG. 30 may include the first and second vibration modules 600 and 700 having the diagonal arrangement structure, and may further include the plate 750 between the first area (A1) of the display panel 100 and the second vibration module 700. Accordingly, the second vibration module 700 including the plate 750 may have a relatively increased mass so that it may be possible to relatively reduce the resonance frequency of the display panel 100. Meanwhile, the first vibration module 600 having no plate may have the relatively decreased mass so that it may be possible to relatively increase the resonance frequency of the display panel 100. For example, the first vibration module 600 having no plate may improve the sound pressure of the high-pitched sound reproduction band, and the second vibration module 700 including the plate 750 may improve the sound pressure of the low-pitched sound reproduction band. Accordingly, the display apparatus 10h according to an embodiment of the present disclosure may include the first and second vibration modules 600 and 700 arranged in the diagonal line, and may further include the plate 750 disposed between the first area (A1) of the display panel 100 and the second vibration module 700 so that it may be possible to improve flatness of the sound pressure by complementing the frequency properties of the sound pressure.

As a result, the difference (DV4) the maximum sound pressure and the minimum sound pressure in the display apparatus 10h shown in FIG. 30 may be relatively reduced in comparison to the difference (DV1, DV2, and DV3) between the maximum sound pressure and the minimum sound pressure in each of the display apparatuses 10e, 10f, and 10g shown in FIGS. 27 to 29 so that it may be possible to improve flatness of the sound pressure. A sound output using the display apparatus 10h is shown is shown as a solid line, and a sound output using the display apparatus 10g is shown as a dotted line.

Figure 33:
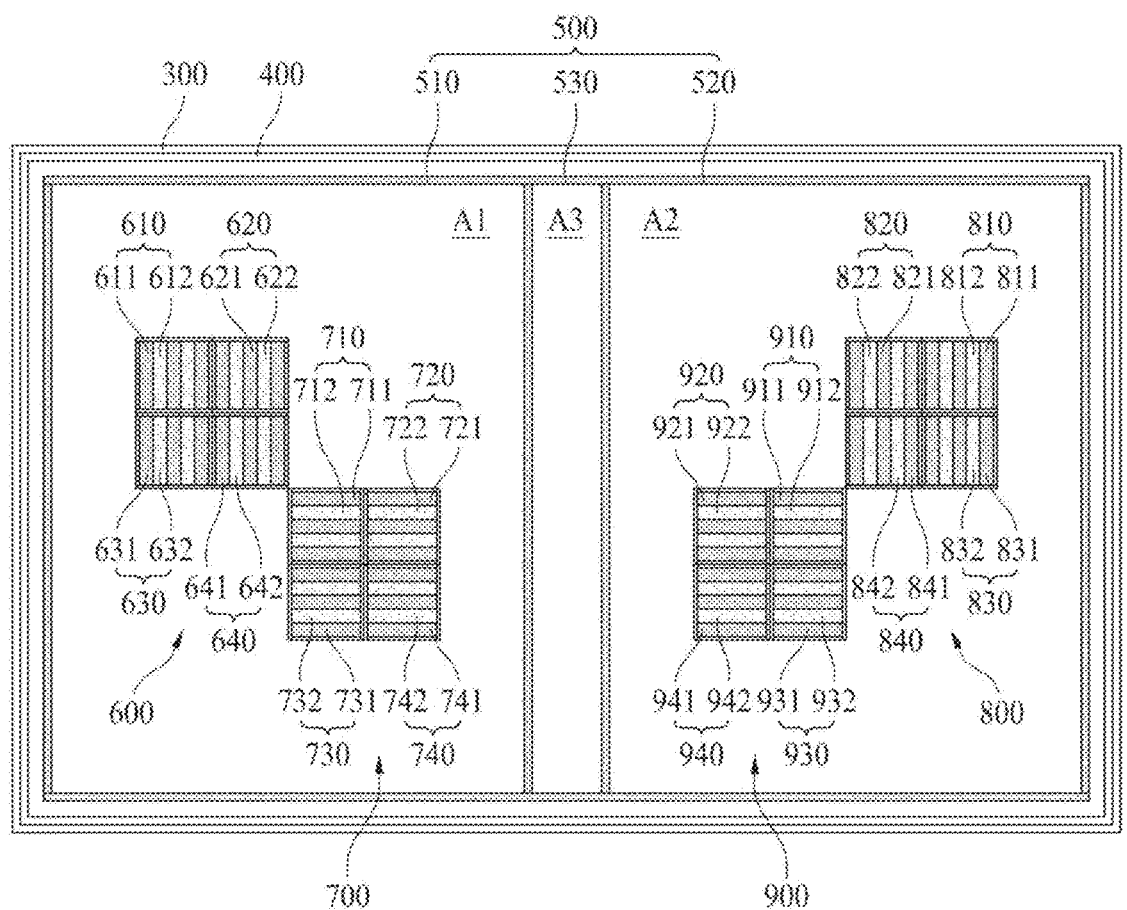
FIG. 33 is a plane view illustrating a seventh embodiment of a plurality of vibration modules in a display apparatus according to another embodiment of the present disclosure.

FIG. 33 is a plane view illustrating a seventh embodiment of a plurality of vibration modules in a display apparatus according to another embodiment of the present disclosure.

With reference to FIG. 33, a display apparatus 10 may include first and second vibration modules 600 and 700 overlapping a first area (A1) of a display panel 100, and third and fourth vibration modules 800 and 900 overlapping a second area (A2) of the display panel 100. According to an embodiment, the first and second vibration modules 600 and 700 may be arranged in a diagonal line of first direction (X) and second direction (Y) so that it may be possible to increase a vibration area in the first area (A1) of the display apparatus 10, to thereby improve the sound pressure level characteristic of the display apparatus 10.

A plurality of first portions 611, 621, 631, and 641 in the first vibration module 600 may extend in the second direction (Y) on the plane, and a plurality of first portions 711, 721, 731, and 741 in the second vibration module 700 may extend in the first direction (X) on the plane. Thus, a piezoelectric characteristic in the first vibration module 600 including the plurality of first portions 611, 621, 631, and 641 arranged in the second direction (Y) may be different from a piezoelectric characteristic in the second vibration module 700 including the plurality of first portions 711, 721, 731, and 741 arranged in the first direction (X).

Thus, the display apparatus 10 shown in FIG. 33 may include the first and second vibration modules 600 and 700 having the diagonal arrangement structure so that it may be possible to increase the vibration area in the first area (A1) of the display apparatus 10. Thus, the display apparatus shown in FIG. 33 using a small number of vibration modules may realize a similar effect to the case using a large number of vibration modules. In the case of the display apparatus 10 shown in FIG. 33, an arrangement direction in the plurality of first portions 611, 621, 631, and 641 included in the first vibration module 600 may be different from an arrangement direction in the plurality of first portions 711, 721, 731, and 741 included in the second vibration module 700 so that it may be possible to improve flatness of the sound pressure by complementing the frequency properties of the sound pressure.

Figure 34:
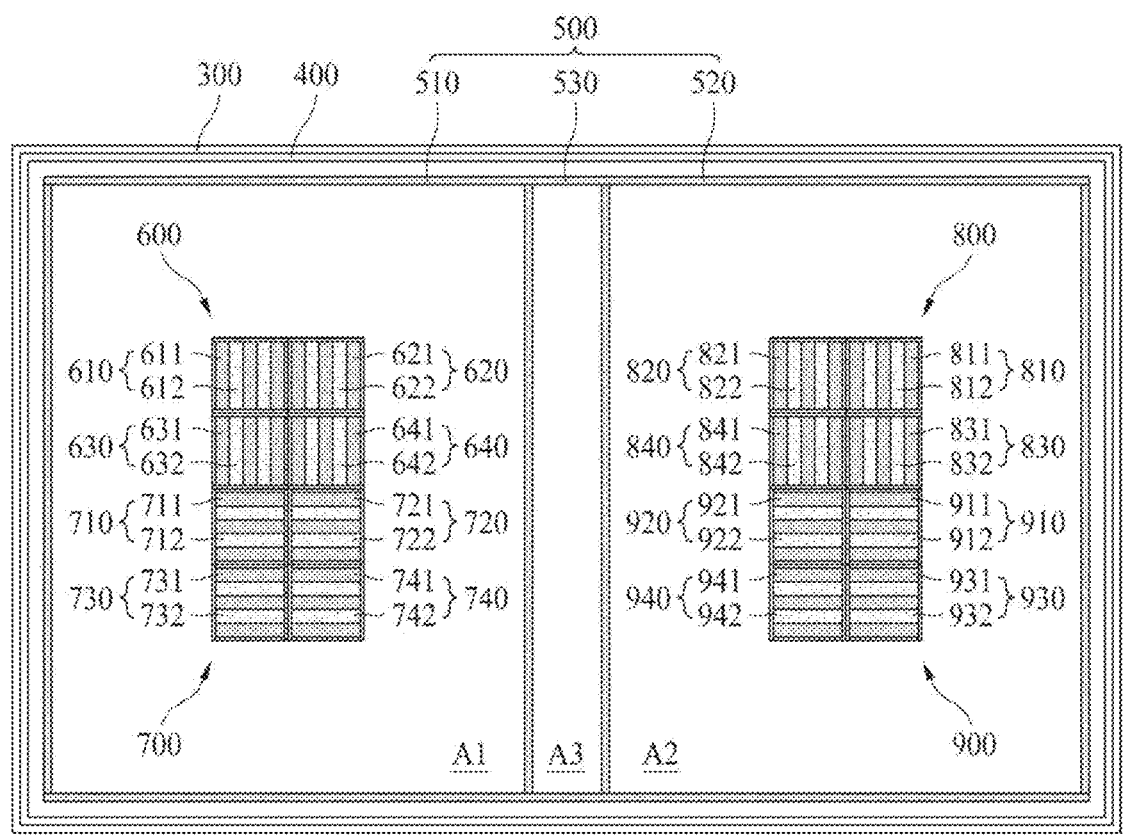
FIG. 34 is a plane view illustrating an eighth embodiment of a plurality of vibration modules in a display apparatus according to another embodiment of the present disclosure.

FIG. 34 is a plane view illustrating an eighth embodiment of a plurality of vibration modules in a display apparatus according to another embodiment of the present disclosure.

With reference to FIG. 34, a display apparatus 10 may include first and second vibration modules 600 and 700 overlapping a first area (A1) of a display panel 100, and third and fourth vibration modules 800 and 900 overlapping a second area (A2) of the display panel 100. According to an embodiment, the first and second vibration modules 600 and 700 may be arranged in the second direction (Y) so that it may be possible to increase a vibration area in the first area (A1) of the display apparatus 10, to thereby improve the sound pressure level characteristic of the display apparatus 10.

A plurality of first portions 611, 621, 631, and 641 in the first vibration module 600 may extend in the second direction (Y) on the plane, and a plurality of first portions 711, 721, 731, and 741 in the second vibration module 700 may extend in the first direction (X) on the plane. Thus, a piezoelectric characteristic in the first vibration module 600 including the plurality of first portions 611, 621, 631, and 641 arranged in the second direction (Y) may be different from a piezoelectric characteristic in the second vibration module 700 including the plurality of first portions 711, 721, 731, and 741 arranged in the first direction (X).

Thus, the display apparatus 10 shown in FIG. 34 may include the first and second vibration modules 600 and 700 having the parallel arrangement structure so that it may be possible to increase the vibration area in the first area (A1) of the display apparatus 10. Thus, the display apparatus shown in FIG. 34 using a small number of vibration modules may realize a similar effect to the case using a large number of vibration modules. In the case of the display apparatus 10 shown in FIG. 34, an arrangement direction in the plurality of first portions 611, 621, 631, and 641 included in the first vibration module 600 may be different from an arrangement direction in the plurality of first portions 711, 721, 731, and 741 included in the second vibration module 700 so that it may be possible to improve flatness of the sound pressure by complementing the frequency properties of the sound pressure.

Figure 35:
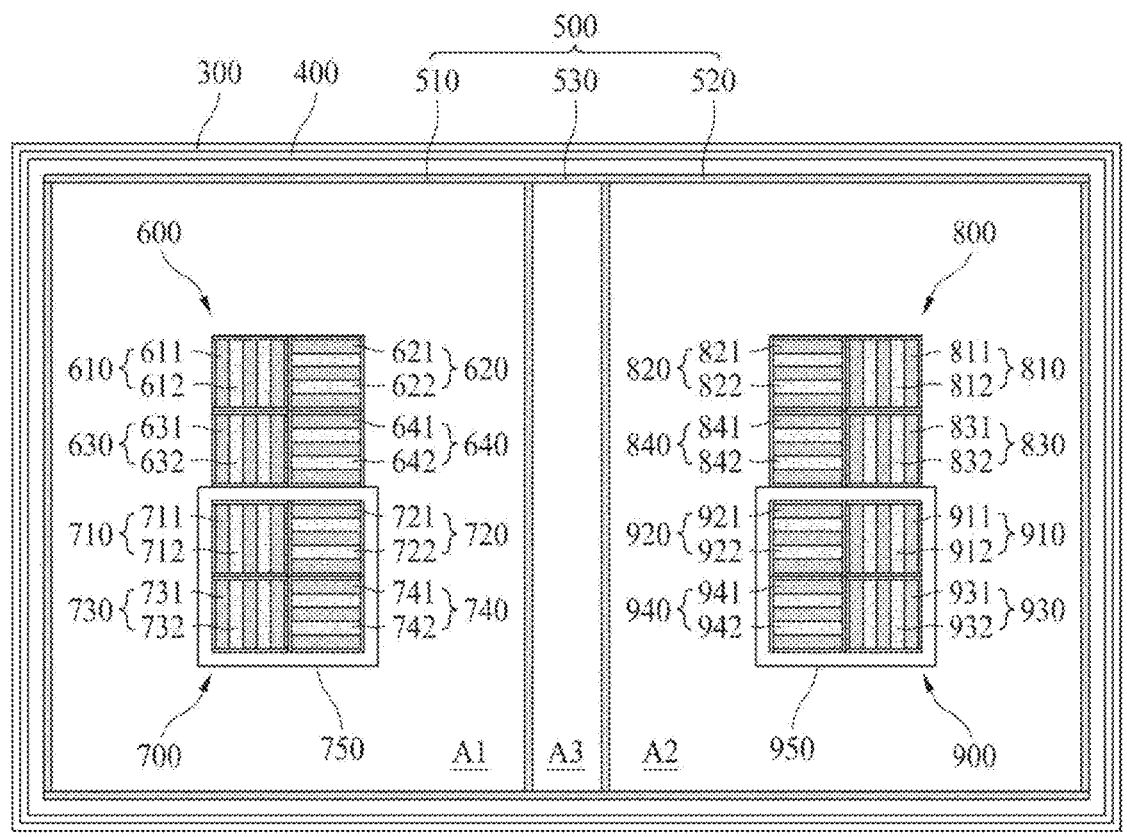
FIG. 35 is a plane view illustrating a ninth embodiment of a plurality of vibration modules in a display apparatus according to another embodiment of the present disclosure.

FIG. 35 is a plane view illustrating a ninth embodiment of a plurality of vibration modules in a display apparatus according to another embodiment of the present disclosure.

With reference to FIG. 35, a display apparatus 10 may include first and second vibration modules 600 and 700 overlapping a first area (A1) of a display panel 100, and third and fourth vibration modules 800 and 900 overlapping a second area (A2) of the display panel 100. According to an embodiment, the first and second vibration modules 600 and 700 may be arranged in the second direction (Y) so that it may be possible to increase a vibration area in the first area (A1) of the display apparatus 10, to thereby improve the sound pressure level characteristic of the display apparatus 10.

According to an embodiment, a plurality of first portions 611 and 631 in first and third sub-modules 610 and 630 of the first vibration module 600 may extend in the second direction (Y) on the plane, and a plurality of first portions 711 and 731 in first and third sub-modules 710 and 730 of the second vibration module 700 may extend in the second direction (Y) on the plane. A plurality of first portions 621 and 641 in second and fourth sub-modules 620 and 640 of the first vibration module 600 may extend in the first direction (X) on the plane, and a plurality of first portions 721 and 741 in second and fourth sub-modules 720 and 740 of the second vibration module 700 may extend in the first direction (X) on the plane. Thus, a piezoelectric characteristic in the plurality of first portions 611, 631, 711, and 731 arranged in the second direction (Y) may be different from a piezoelectric characteristic in the plurality of first portions 621, 641, 721, and 741 arranged in the first direction (X).

The display apparatus 10 may further include a plate 750 between the first area (A1) of the display panel 100 and the second vibration module 700. The plate 750 may reduce a resonance frequency of the display panel 100 with the second vibration module 700 attached thereto by increasing a mass of the second vibration module 700.

Thus, the display apparatus 10 shown in FIG. 35 may include the first and second vibration modules 600 and 700 having the parallel arrangement structure so that it may be possible to increase the vibration area in the first area (A1) of the display apparatus 10. Thus, the display apparatus shown in FIG. 35 using a small number of vibration modules may realize a similar effect to the case using a large number of vibration modules. The display apparatus 10 shown in FIG. 35 may include the plurality of first portions 611, 631, 711, and 731 arranged in the second direction (Y), and the plurality of first portions 621, 641, 721, and 741 arranged in the first direction (X) so that it may be possible to complement the frequency properties of the sound pressure. Also, the display apparatus 10 shown in FIG. 35 may include the first vibration module 600 having no plate therein, and the second vibration module 700 including the plate 750 therein, whereby it may be possible to reduce the lowest-pitched sound reproduction frequency, thereby improving the sound pressure of the low-pitched sound reproduction band and improving flatness of the sound pressure.

Figure 36:
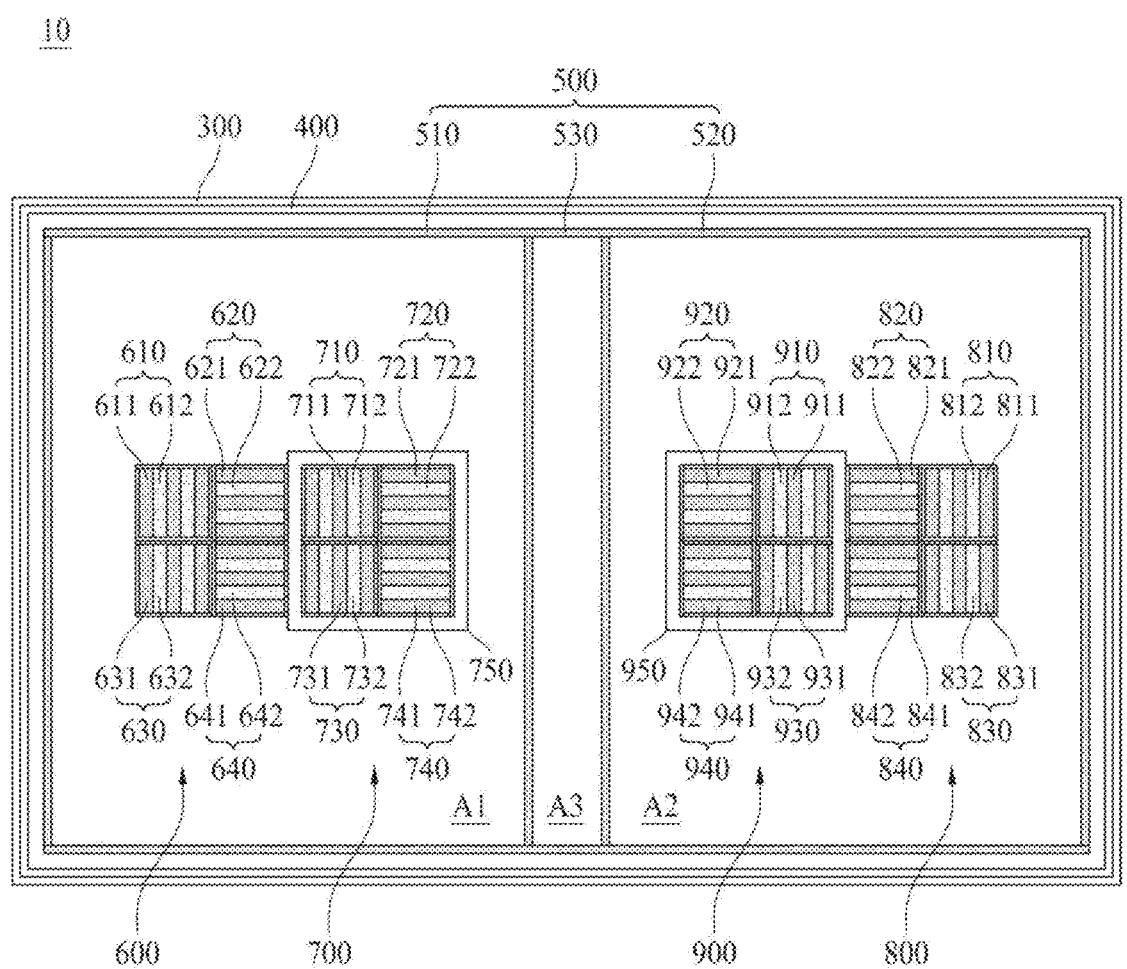
FIG. 36 is a plane view illustrating a tenth embodiment of a plurality of vibration modules in a display apparatus according to another embodiment of the present disclosure.

FIG. 36 is a plane view illustrating a tenth embodiment of a plurality of vibration modules in a display apparatus according to another embodiment of the present disclosure.

With reference to FIG. 36, a display apparatus 10 may include first and second vibration modules 600 and 700 overlapping a first area (A1) of a display panel 100, and third and fourth vibration modules 800 and 900 overlapping a second area (A2) of the display panel 100. According to an embodiment, the first and second vibration modules 600 and 700 may be arranged in the first direction (X) so that it may be possible to increase a vibration area in the first area (A1) of the display apparatus 10, to thereby improve the sound pressure level characteristic of the display apparatus 10.

According to an embodiment, a plurality of first portions 611 and 631 in first and third sub-modules 610 and 630 of the first vibration module 600 may extend in the second direction (Y) on the plane, and a plurality of first portions 711 and 731 in first and third sub-modules 710 and 730 of the second vibration module 700 may extend in the second direction (Y) on the plane. A plurality of first portions 621 and 641 in second and fourth sub-modules 620 and 640 of the first vibration module 600 may extend in the first direction (X) on the plane, and a plurality of first portions 721 and 741 in second and fourth sub-modules 720 and 740 of the second vibration module 700 may extend in the first direction (X) on the plane. Thus, a piezoelectric characteristic in the plurality of first portions 611, 631, 711, and 731 arranged in the second direction (Y) may be different from a piezoelectric characteristic in the plurality of first portions 621, 641, 721, and 741 arranged in the first direction (X).

The display apparatus 10 may further include a plate 750 between the first area (A1) of the display panel 100 and the second vibration module 700. The plate 750 may reduce a resonance frequency of the display panel 100 with the second vibration module 700 attached thereto by increasing a mass of the second vibration module 700.

Thus, the display apparatus 10 shown in FIG. 36 may include the first and second vibration modules 600 and 700 having the parallel arrangement structure so that it may be possible to increase the vibration area in the first area (A1) of the display apparatus 10. Thus, the display apparatus shown in FIG. 36 using a small number of vibration modules may realize the similar effect to the case using a large number of vibration modules. The display apparatus 10 shown in FIG. 36 may include the plurality of first portions 611, 631, 711, and 731 arranged in the second direction (Y), and the plurality of first portions 621, 641, 721, and 741 arranged in the first direction (X) so that it may be possible to complement the frequency properties of the sound pressure. Also, the display apparatus 10 shown in FIG. 36 may include the first vibration module 600 having no plate therein, and the second vibration module 700 including the plate 750 therein, whereby it may be possible to reduce the lowest-pitched sound reproduction frequency, thereby improving the sound pressure of the low-pitched sound reproduction band and improving flatness of the sound pressure.

Figure 37:
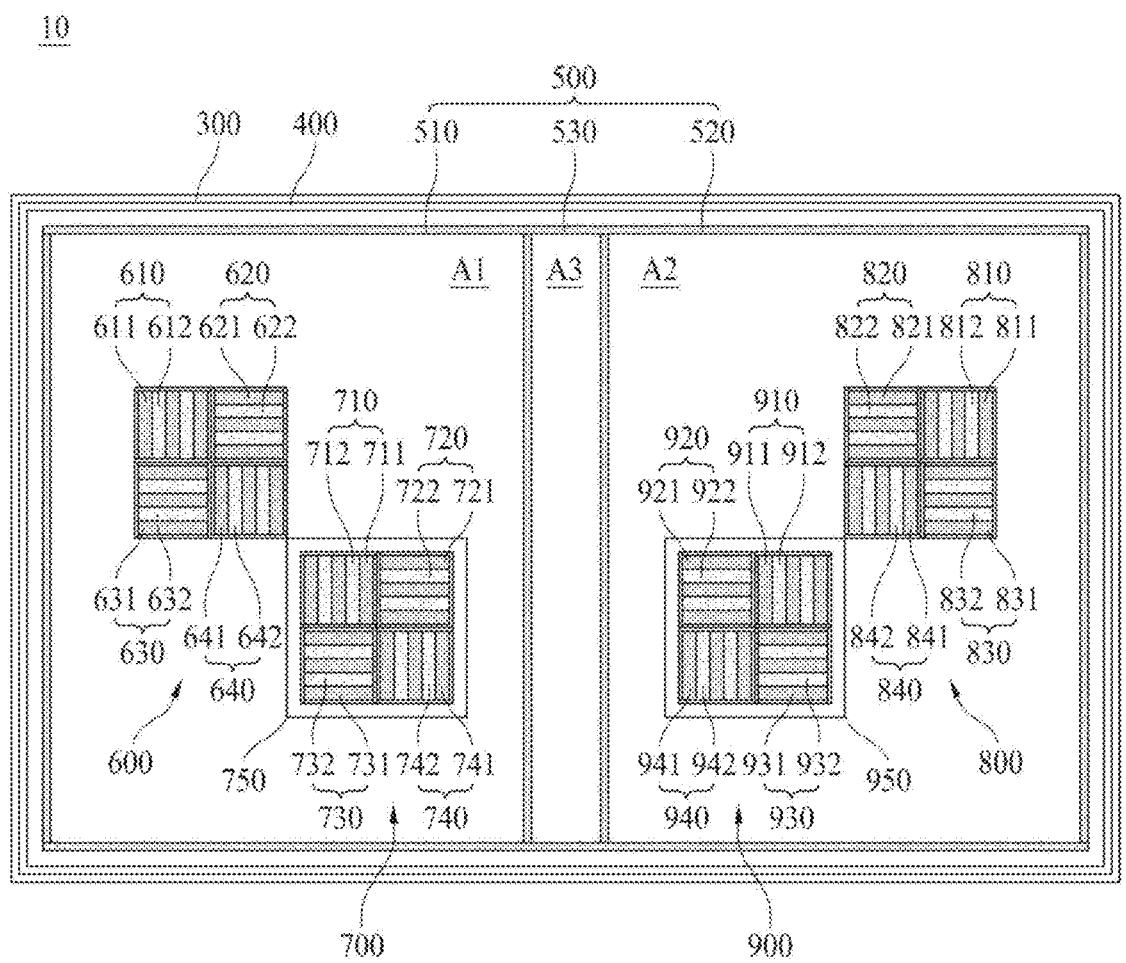
FIG. 37 is a plane view illustrating an eleventh embodiment of a plurality of vibration modules in a display apparatus according to another embodiment of the present disclosure.

FIG. 37 is a plane view illustrating an eleventh embodiment of a plurality of vibration modules in a display apparatus according to another embodiment of the present disclosure.

With reference to FIG. 37, a display apparatus 10 may include first and second vibration modules 600 and 700 overlapping a first area (A1) of a display panel 100, and third and fourth vibration modules 800 and 900 overlapping a second area (A2) of the display panel 100. According to an embodiment, the first and second vibration modules 600 and 700 may be arranged along a diagonal line of the first direction (X) and the second direction (Y), whereby it may be possible to increase the vibration area in the first area (A1) of the display apparatus 10 and to improve the sound pressure level characteristic of the display apparatus 10.

According to an embodiment, a plurality of first portions 611 and 641 in first and fourth sub-modules 610 and 640 of the first vibration module 600 may extend in the second direction (Y) on the plane, and a plurality of first portions 711 and 741 in first and fourth sub-modules 710 and 740 of the second vibration module 700 may extend in the second direction (Y) on the plane. A plurality of first portions 621 and 641 in second and third sub-modules 620 and 630 of the first vibration module 600 may extend in the first direction (X) on the plane, and a plurality of first portions 721 and 731 in second and third sub-modules 720 and 730 of the second vibration module 700 may extend in the first direction (X) on the plane. Thus, a piezoelectric characteristic in the plurality of first portions 611, 641, 711, and 741 arranged in the second direction (Y) may be different from piezoelectric characteristic in the plurality of first portions 621, 631, 721, and 731 arranged in the first direction (X).

The display apparatus 10 may further include a plate 750 between the first area (A1) of the display panel 100 and the second vibration module 700. The plate 750 may reduce a resonance frequency of the display panel 100 with the second vibration module 700 attached thereto by increasing a mass of the second vibration module 700.

Thus, the display apparatus 10 shown in FIG. 37 may include the first and second vibration modules 600 and 700 having the diagonal arrangement structure so that it may be possible to increase the vibration area in the first area (A1) of the display apparatus 10. Thus, the display apparatus shown in FIG. 37 using a small number of vibration modules may realize the similar effect to the case using a large number of vibration modules. The display apparatus 10 shown in FIG. 37 may include the plurality of first portions 611, 641, 711, and 741 arranged in the second direction (Y), and the plurality of first portions 621, 631, 721, and 731 arranged in the first direction (X) so that it may be possible to complement the frequency properties of the sound pressure. Also, the display apparatus 10 shown in FIG. 37 may include the first vibration module 600 having no plate therein, and the second vibration module 700 including the plate 750 therein, whereby it may be possible to reduce the lowest-pitched sound reproduction frequency, thereby improving the sound pressure of the low-pitched sound reproduction band and improving flatness of the sound pressure.

Figure 38:
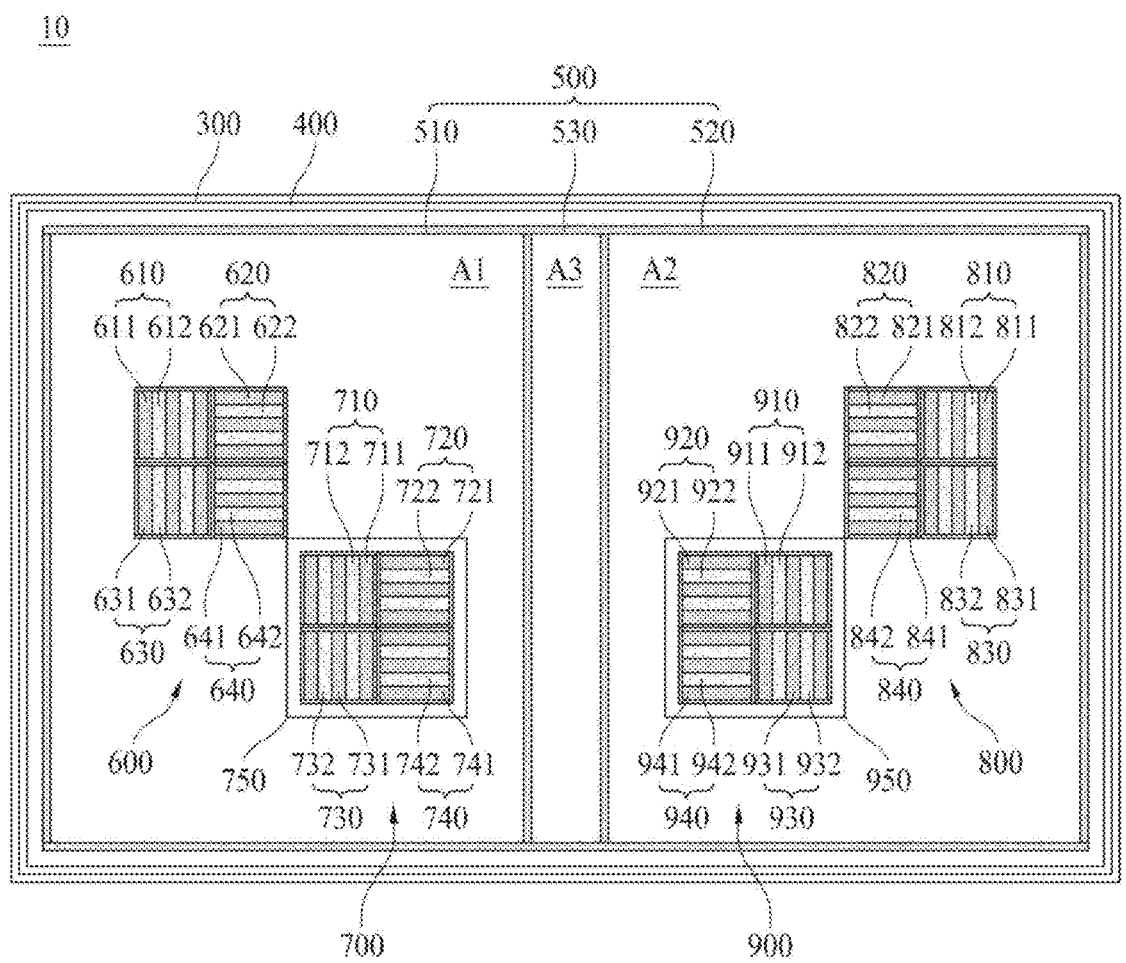
FIG. 38 is a plane view illustrating a twelfth embodiment of a plurality of vibration modules in a display apparatus according to another embodiment of the present disclosure.

FIG. 38 is a plane view illustrating a twelfth embodiment of a plurality of vibration modules in a display apparatus according to another embodiment of the present disclosure.

With reference to FIG. 38, a display apparatus 10 may include first and second vibration modules 600 and 700 overlapping a first area (A1) of a display panel 100, and third and fourth vibration modules 800 and 900 overlapping a second area (A2) of the display panel 100. According to an embodiment, the first and second vibration modules 600 and 700 may be arranged along a diagonal line of the first direction (X) and the second direction (Y), whereby it may be possible to increase the vibration area in the first area (A1) of the display apparatus 10 and to improve the sound pressure level characteristic of the display apparatus 10.

According to an embodiment, a plurality of first portions 611 and 631 in first and third sub-modules 610 and 630 of the first vibration module 600 may extend in the second direction (Y) on the plane, and a plurality of first portions 711 and 731 in first and third sub- modules 710 and 730 of the second vibration module 700 may extend in the second direction (Y) on the plane. A plurality of first portions 621 and 641 in second and fourth sub-modules 620 and 640 of the first vibration module 600 may extend in the first direction (X) on the plane, and a plurality of first portions 721 and 741 in second and fourth sub-modules 720 and 740 of the second vibration module 700 may extend in the first direction (X) on the plane. Thus, a piezoelectric characteristic in the plurality of first portions 611, 631, 711, and 731 arranged in the second direction (Y) may be different from a piezoelectric characteristic in the plurality of first portions 621, 641, 721, and 741 arranged in the first direction (X).

The display apparatus 10 may further include a plate 750 between the first area (A1) of the display panel 100 and the second vibration module 700. The plate 750 may reduce a resonance frequency of the display panel 100 with the second vibration module 700 attached thereto by increasing a mass of the second vibration module 700.

Thus, the display apparatus 10 shown in FIG. 38 may include the first and second vibration modules 600 and 700 having the diagonal arrangement structure so that it may be possible to increase the vibration area in the first area (A1) of the display apparatus 10. Thus, the display apparatus shown in FIG. 38 using a small number of vibration modules may realize the similar effect to the case using a large number of vibration modules. The display apparatus 10 shown in FIG. 38 may include the plurality of first portions 611, 631, 711, and 731 arranged in the second direction (Y), and the plurality of first portions 621, 641, 721, and 741 arranged in the first direction (X) so that it may be possible to complement the frequency properties of the sound pressure. Also, the display apparatus 10 shown in FIG. 38 may include the first vibration module 600 having no plate therein, and the second vibration module 700 including the plate 750 therein, whereby it may be possible to reduce the lowest-pitched sound reproduction frequency, thereby improving the sound pressure of the low-pitched sound reproduction band and improving flatness of the sound pressure.

The display apparatus according to the embodiment of the present disclosure may be applied to a mobile device, an image phone, a smart watch, a watch phone, a wearable device, a foldable device, a rollable device, a bendable device, a flexible device, a transparent display apparatus, a curved device, an electronic notebook, an electronic book, a portable multimedia player (PMP), a personal digital assistant (PDA), a MP3 player, a mobile medical device, a desktop PC, a laptop PC, a netbook computer, a portable computer, a workstation, a navigation, a vehicle navigation, a vehicle display device, a television, a wall paper, a signage device, a game device, an illumination device, a notebook, a monitor, a camera, a camcorder, and a home appliance. Embodiments are not limited to these examples.

A display apparatus according to an embodiment of the present disclosure will be described as follows.

According to an embodiment of the present disclosure, a display apparatus may include: a display panel configured to display an image, and at least one vibration module on a rear surface of the display panel, the at least one vibration module including a piezoelectric composite layer including a plurality of sub-modules configured to vibrate the display panel, each of the plurality of sub-modules including: a plurality of first portions including a piezoelectric characteristic, and a plurality of second portions having flexibility, each of the plurality of second portions being between a respective pair of the plurality first portions. The plurality of first portions in the respective sub-modules may be arranged in a same direction or may be partially arranged in different directions.

For example, in the display apparatus according to an embodiment of the present disclosure, the plurality of first portions may include an inflexible inorganic material, and the plurality of second portions may include a flexible organic material. For example, in the display apparatus according to an embodiment of the present disclosure, the flexible organic material may be configured to absorb an impact applied to the inflexible inorganic material or to the display apparatus.

For example, the display apparatus according to an embodiment of the present disclosure may further include an adhesion member between the display panel and the at least one vibration module, and an adhesion strength of the adhesion member over the plurality of second portions may be greater than an adhesion strength of the adhesion member over the plurality of first portions. For example, in the display apparatus according to an embodiment of the present disclosure, the plurality of first portions in each of the plurality of sub-modules may extend in a first direction on the plane, or may extend in a second direction perpendicular to the first direction.

For example, in the display apparatus according to an embodiment of the present disclosure, the plurality of sub-modules may include: a first sub-module, a second sub-module, a third sub-module, and a fourth sub-module, and the first to fourth sub-modules may be in a 2×2 arrangement. For example, in the display apparatus according to an embodiment of the present disclosure, the plurality of first portions in the first to fourth sub-modules may be arranged in a same direction. For example, in the display apparatus according to an embodiment of the present disclosure, an arrangement direction of the plurality of first portions in the first and second sub-modules may be different from an arrangement direction of the plurality of first portions in the third and fourth sub-modules. For example, in the display apparatus according to an embodiment of the present disclosure, an arrangement direction of the plurality of first portions in the first and third sub-modules may be different from an arrangement direction of the plurality of first portions in the second and fourth sub-modules. For example, the display apparatus according to an embodiment of the present disclosure may further include a plate between the display panel and the at least one vibration module.

According to an embodiment of the present disclosure, a display apparatus may include: a display panel including first and second areas, the display panel being configured to display an image, and a plurality of vibration modules on a rear surface of the display panel, the plurality of vibration modules being configured to vibrate the first area and the second area, each of the plurality of vibration modules including a piezoelectric composite layer including a plurality of sub-modules, each of the plurality of sub-modules including: a plurality of first portions including a piezoelectric characteristic, and a plurality of second portions having flexibility, each of the plurality of second portions being between a respective pair of the plurality first portions. The plurality of first portions in the respective sub-modules may be arranged in a same direction or may be partially arranged in different directions.

For example, in the display apparatus according to an embodiment of the present disclosure, the plurality of vibration modules may include: a first vibration module overlapping the first area, a second vibration module overlapping the first area, and alternately or diagonally disposed with the first vibration module, a third vibration module overlapping the second area, and a fourth vibration module overlapping the second area, and alternately or diagonally disposed with the third vibration module. For example, in the display apparatus according to an embodiment of the present disclosure, an arrangement direction of the plurality of first portions in the plurality of sub-modules in the first vibration module may be identical to an arrangement direction of the plurality of first portions in the plurality of sub-modules in the third vibration module, and an arrangement direction of the plurality of first portions in the plurality of sub-modules in the second vibration module may be identical to an arrangement direction of the plurality of first portions in the plurality of sub-modules in the fourth vibration module.

For example, in the display apparatus according to an embodiment of the present disclosure, the plurality of first portions in the plurality of sub-modules in each of the first and second vibration modules may be arranged in a same direction. For example, in the display apparatus according to an embodiment of the present disclosure, each of the first to fourth vibration modules may include: a first sub-module in a left-sided upper portion of the piezoelectric composite layer, a second sub-module in a right-sided upper portion of the piezoelectric composite layer, a third sub-module in a left-sided lower portion of the piezoelectric composite layer, and a fourth sub-module in a right-sided lower portion of the piezoelectric composite layer.

For example, in the display apparatus according to an embodiment of the present disclosure, an arrangement direction of the plurality of first portions in the first and fourth sub-modules in the first vibration module may be different from an arrangement direction of the plurality of first portions in the second and third sub-modules in the first vibration module.

For example, in the display apparatus according to an embodiment of the present disclosure, an arrangement direction of the plurality of first portions in the first and third sub-modules in the first vibration module may be different from an arrangement direction of the plurality of first portions in the second and fourth sub-modules in the first vibration module.

For example, in the display apparatus according to an embodiment of the present disclosure, an arrangement direction of the plurality of first portions in the plurality of sub-modules in the first vibration module may be different from an arrangement direction of the plurality of first portions in the plurality of sub-modules in the second vibration module. For example, in the display apparatus according to an embodiment of the present disclosure, the plurality of vibration modules may include: a first vibration module overlapping the first area, a second vibration module adjacent to the first vibration module in a vertical direction on the plane, a third vibration module overlapping the second area, and a fourth vibration module adjacent to the third vibration module in a vertical direction on the plane.

For example, in the display apparatus according to an embodiment of the present disclosure, an arrangement direction of the plurality of first portions in the plurality of sub-modules in the first vibration module may be different from an arrangement direction of the plurality of first portions in the plurality of sub-modules in the second vibration module. For example, in the display apparatus according to an embodiment of the present disclosure, each of the first to fourth vibration modules may include: a first sub-module in a left-sided upper portion of the piezoelectric composite layer, a second sub-module in a right-sided upper portion of the piezoelectric composite layer, a third sub-module in a left-sided lower portion of the piezoelectric composite layer, and a fourth sub-module in a right-sided lower portion of the piezoelectric composite layer. For example, in the display apparatus according to an embodiment of the present disclosure, an arrangement direction of the plurality of first portions in the first and third sub-modules in the first vibration module may be different from an arrangement direction of the plurality of first portions in the second and fourth sub-modules in the first vibration module.

For example, in the display apparatus according to an embodiment of the present disclosure, the plurality of vibration modules may include: a first vibration module overlapping the first area, a second vibration module adjacent to the first vibration module in a horizontal direction on the plane, a third vibration module overlapping the second area, and a fourth vibration module adjacent to the third vibration module in a horizontal direction on the plane. For example, in the display apparatus according to an embodiment of the present disclosure, each of the first to fourth vibration modules may include: a first sub-module in a left-sided upper portion of the piezoelectric composite layer, a second sub-module in a right-sided upper portion of the piezoelectric composite layer, a third sub-module in a left-sided lower portion of the piezoelectric composite layer, and a fourth sub-module in a right-sided lower portion of the piezoelectric composite layer. For example, in the display apparatus according to an embodiment of the present disclosure, an arrangement direction of the plurality of first portions in the first and third sub-modules in the first vibration module may be different from an arrangement direction of the plurality of first portions in the second and fourth sub-modules in the first vibration module.

For example, in the display apparatus according to an embodiment of the present disclosure, the plurality of vibration modules may include: a first vibration module overlapping the first area, a second vibration module, a third vibration module overlapping the second area, and a fourth vibration module. A plate may be interposed between the display panel and each of the second to fourth vibration modules.

The various embodiments described above can be combined to provide further embodiments. All of the U.S. patents, U.S. patent application publications, U.S. patent applications, foreign patents, foreign patent applications and non-patent publications referred to in this specification and/or listed in the Application Data Sheet are incorporated herein by reference, in their entirety. Aspects of the embodiments can be modified, if necessary to employ concepts of the various patents, applications and publications to provide yet further embodiments.

It will be apparent to those skilled in the art that various modifications and variations may be made in the present disclosure without departing from the technical idea or scope of the disclosure. Thus, it may be intended that embodiments of the present disclosure cover the modifications and variations of the disclosure provided they come within the scope of the appended claims and their equivalents.

What is claimed is:

1. A display apparatus, comprising:
   a display panel configured to display an image, the display panel comprising:
     a first substrate;
     a light-emitting layer at the first substrate;
     a second substrate at the light-emitting layer; and
     a functional film at the second substrate;
   a vibration module at the first substrate of the display panel;
   a structure at a rear surface of the display panel and including a first cover portion, a second cover portion, and a third cover portion;
   a partition surrounding at least partly the display panel; and
   a fixing member between the partition and the third cover portion,
   wherein the vibration module is disposed at an opposite side of the display panel from the functional film.

2. The display apparatus of claim 1, wherein the functional film includes at least one of a reflection preventing layer and an optical path control layer.

3. The display apparatus of claim 2, wherein the reflection preventing layer includes a circular polarizing layer.

4. The display apparatus of claim 1, wherein the third cover portion overlaps with the functional film.

5. The display apparatus of claim 1, wherein the third cover portion overlaps with the fixing member.

6. The display apparatus of claim 1, wherein the third cover portion is spaced apart from the partition.

7. The display apparatus of claim 1, further comprising a touch panel on the display panel.

8. The display apparatus of claim 1, wherein at least one of the first substrate and the second substrate has flexibility.

9. The display apparatus of claim 1, wherein the display panel is applied to at least one of a foldable device, a rollable device, a bendable device, a curved device, and a flexible device.

10. The display apparatus of claim 1, wherein the light-emitting layer includes at least one of an organic light-emitting layer, an inorganic light-emitting layer, a nano-sized material layer, and a quantum dot device layer.

11. The display apparatus of claim 1, wherein the display panel includes a short side parallel to a first direction on a plane, and a long side parallel to a second direction perpendicular to the first direction on the plane.

12. The display apparatus of claim 11, wherein the vibration module is disposed parallel along the long side of the display panel.

13. The display apparatus of claim 1, wherein the vibration module is configured to vibrate the display panel.

14. The display apparatus of claim 1, wherein the vibration module comprises a piezoelectric composite layer.

15. The display apparatus of claim 14, wherein the piezoelectric composite layer comprises:
   a plurality of first portions including a piezoelectric characteristic; and
   a plurality of second portions having flexibility, each of the plurality of second portions being between the plurality first portions.

16. The display apparatus of claim 15, wherein the piezoelectric composite layer comprises a plurality of sub-modules including the plurality of first portions and the plurality of second portions, and the plurality of first portions in each of the sub-modules are arranged in a same direction or are partially arranged in different directions.

17. The display apparatus of claim 16, wherein:
   the plurality of first portions of each of the plurality of sub-modules are extended in a first direction or in a second direction perpendicular to the first direction.

18. The display apparatus of claim 16, wherein the plurality of sub-modules include at least two sub-modules, and the at least two sub-modules are in a N×M arrangement, wherein the N and M are natural numbers.

19. The display apparatus of claim 16, wherein:
   the plurality of sub-modules comprises:
     a first sub-module;
     a second sub-module;
     a third sub-module; and
     a fourth sub-module, and
   the first to fourth sub-modules are in a 2×2 arrangement.

20. The display apparatus of claim 19, wherein an arrangement direction of the plurality of first portions in the first and second sub-modules is different from an arrangement direction of the plurality of first portions in the third and fourth sub-modules.

21. The display apparatus of claim 19, wherein an arrangement direction of the plurality of first portions in the first and third sub-modules is different from an arrangement direction of the plurality of first portions in the second and fourth sub-modules.

22. The display apparatus of claim 16, wherein:
the vibration module includes a first vibration module and a second vibration module, and
the second vibration module is disposed adjacent to the first vibration module in a first direction or in a second direction perpendicular to the first direction.

23. The display apparatus of claim 16, wherein:
the vibration module includes a first vibration module and a second vibration module, and
the second vibration module is diagonally disposed with respect to the first vibration module.

24. The display apparatus of claim 16, further comprising a plate between the display panel and the vibration module.

25. The display apparatus of claim 16, further comprising an adhesion member between the display panel and the vibration module,
wherein the adhesion member includes a hollow area to provide an air gap.

26. The display apparatus of claim 25, wherein an adhesion strength of the adhesion member over the plurality of second portions is greater than an adhesion strength of the adhesion member over the plurality of first portions.

* * * * *